US012666821B2

(12) United States Patent
Chen et al.

(10) Patent No.: US 12,666,821 B2
(45) Date of Patent: Jun. 23, 2026

(54) DISPLAY SUBSTRATE AND DISPLAY APPARATUS

(71) Applicants: Chengdu BOE Optoelectronics Technology Co., Ltd., Chengdu (CN); BOE Technology Group Co., Ltd., Beijing (CN)

(72) Inventors: Wenbo Chen, Beijing (CN); Mengqi Wang, Beijing (CN); Ziyang Yu, Beijing (CN); Zhiliang Jiang, Beijing (CN); Ming Hu, Beijing (CN); Haijun Qiu, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 557 days.

(21) Appl. No.: 18/032,348

(22) PCT Filed: Apr. 29, 2022

(86) PCT No.: PCT/CN2022/090203
§ 371 (c)(1),
(2) Date: Apr. 18, 2023

(87) PCT Pub. No.: WO2023/206339
PCT Pub. Date: Nov. 2, 2023

(65) Prior Publication Data
US 2024/0397762 A1    Nov. 28, 2024

(51) Int. Cl.
*H10K 59/131*    (2023.01)
*H10K 59/88*    (2023.01)

(52) U.S. Cl.
CPC ........... *H10K 59/131* (2023.02); *H10K 59/88* (2023.02)

(58) Field of Classification Search
CPC ..................................................... H10K 59/131
See application file for complete search history.

(56) References Cited

U.S. PATENT DOCUMENTS

| | | |
|---|---|---|
| 2019/0278145 A1 | 9/2019 | Tanaka et al. |
| 2020/0355972 A1 | 11/2020 | Jian et al. |

(Continued)

FOREIGN PATENT DOCUMENTS

| | | |
|---|---|---|
| CN | 109791745 A | 5/2019 |
| CN | 111383554 A | 7/2020 |

(Continued)

OTHER PUBLICATIONS

Office Action dated Nov. 25, 2022 for Chinese Patent Application No. 2022800010222 and English Translation.

*Primary Examiner* — Douglas M Menz
(74) *Attorney, Agent, or Firm* — Ling Wu; Stephen Yang; Ling and Yang Intellectual Property

(57) ABSTRACT

Disclosed is a display substrate including a display region (100) and a bonding region (200) located on a side of the display region (100). The display region (100) includes a base substrate (101) and a drive circuit layer disposed on the base substrate (101). The drive circuit layer includes a plurality of circuit units constituting a plurality of unit rows and a plurality of unit columns, a plurality of data signal lines (60), and a plurality of data connection lines (70). The data connection lines (70) include a first connection line (71) extending along a first direction and a second connection line (72) extending along a second direction. The first connection line (71) is electrically connected with the second connection line (72) and a data signal line (60) respectively. The first connection line (71) and the second connection line (72) are located in different conductive layers.

17 Claims, 47 Drawing Sheets

(56)                    References Cited

U.S. PATENT DOCUMENTS

| 2021/0013287 | A1* | 1/2021 | Bang ..................... G06F 1/1652 |
| 2021/0027718 | A1 | 1/2021 | Yokoyama et al. |
| 2021/0082343 | A1 | 3/2021 | Lee et al. |
| 2022/0357770 | A1 | 11/2022 | Tian et al. |
| 2023/0043145 | A1 | 2/2023 | Yuan et al. |

FOREIGN PATENT DOCUMENTS

| CN | 112310125 A | 2/2021 |
| CN | 112530994 A | 3/2021 |
| CN | 114283696 A | 4/2022 |

\* cited by examiner (N-1)-th column    N-th column    (N+1)-th column    (N+2)-th column 51    92 60    51    92 60

(M-1)-th
row

52

91

85

86

DF2

71

86

M-th
row

91

85

71

DF2

91

72    72

114    42    51    44    81  85    72    60  86    71    86  72    60

33    13    25    24    15    101    111    81    17    112    81    113

(N-1)-th column | N-th column | (N+1)-th column | (N+2)-th column 51 60 92        51 60 92

(M-1)-th row

DF2

91        86    85        71

71

M-th row 91        71        DF2        91

42        51        86  71  113

33   13   25        24   15        101  111  112

DISPLAY SUBSTRATE AND DISPLAY APPARATUS

CROSS-REFERENCE TO RELATED APPLICATION

The present application is a U.S. National Phase Entry of International Application No. PCT/CN2022/090203 having an international filing date of Apr. 29, 2022. The entire contents of the above-identified application are hereby incorporated by reference.

TECHNICAL FIELD

The present disclosure relates to, but is not limited to, the field of display technologies, in particular to a display substrate and a display apparatus.

BACKGROUND

An Organic Light Emitting Diode (OLED) and a Quantum dot Light Emitting Diode (QLED) are active light emitting display devices and have advantages of self-illumination, a wide viewing angle, a high contrast ratio, low power consumption, an extremely high reaction speed, lightness and thinness, bendability, and a low cost, etc. With continuous development of the display technologies, a flexible display apparatus (Flexible Display) with an OLED or a QLED as a light emitting device and using a Thin Film Transistor (TFT) for performing signal controlling has become a mainstream product in the current display field.

SUMMARY

The following is a summary of subject matters described herein in detail. The summary is not intended to limit the protection scope of claims.

Embodiments of the present disclosure provide a display substrate and a display apparatus.

In one aspect, an embodiment provides a display substrate, including a display region and a bonding region located on a side of the display region. The display region includes a base substrate and a drive circuit layer disposed on the base substrate. The drive circuit layer includes a plurality of circuit units constituting a plurality of unit rows and a plurality of unit columns, a plurality of data signal lines, and a plurality of data connection lines. At least one data signal line of the plurality of data signal lines is electrically connected with one unit column. At least one data connection line of the plurality of data connection lines includes a first connection line extending along a first direction and a second connection line extending along a second direction, the second connection line extends toward the bonding region, and the first direction intersects with the second direction. The first connection line is electrically connected with the second connection line and the data signal line respectively; and the first connection line and the second connection line are located in different conductive layers.

In some exemplary implementation modes, a first end of at least one first connection line is electrically connected with the data signal line, and a second end is electrically connected with the second connection line.

In some exemplary implementation modes, at least one first connection line penetrates through the display region along the first direction.

In some exemplary implementation modes, at least one second connection line penetrates through the display region along the second direction.

In some exemplary implementation modes, in a direction perpendicular to the display substrate, the first connection line is located on a side of the second connection line away from the base substrate.

In some exemplary implementation modes, the display region further includes a plurality of first compensation traces extending along the first direction, a plurality of second compensation traces extending along the second direction; and at least one second compensation trace of the plurality of second compensation traces is electrically connected with at least one first compensation trace of the plurality of first compensation traces.

In some exemplary implementation modes, the display substrate further includes a bezel region located on another side of the display region, the bezel region is provided with a bezel power supply lead, and the bezel power supply lead is electrically connected with a plurality of first compensation traces and a plurality of second compensation traces of the display region.

In some exemplary implementation modes, the first compensation trace and the first connection line are disposed in a same layer, at least one circuit unit includes a first fracture, and the first fracture is disposed between the first compensation trace and the first connection line.

In some exemplary implementation modes, an orthographic projection of the first fracture on the base substrate is covered by an orthographic projection of a conductive film layer other than a film layer where the first connection line is located, on the base substrate.

In some exemplary implementation modes, the second compensation trace and the second connection line are disposed in a same layer, at least one circuit unit includes a second fracture, and the second fracture is disposed between the second compensation trace and the second connection line.

In some exemplary implementation modes, an orthographic projection of the second fracture on the base substrate is covered by an orthographic projection of a conductive film layer other than a film layer where the second connection line is located, on the base substrate.

In some exemplary implementation modes, at least one circuit unit includes: a dummy electrode; and the dummy electrode is electrically connected with a data signal line or a second connection line through a via, and an orthographic projection of the dummy electrode on the base substrate is at least partially overlapped with an orthographic projection of the data signal line or the second connection line on the base substrate.

In some exemplary implementation modes, at least one circuit unit includes a dummy electrode and a first data connection electrode; and the first data connection electrode is electrically connected with the first connection line, the dummy electrode is electrically connected with the first data connection electrode through a via, and an orthographic projection of the dummy electrode on the base substrate is at least partially overlapped with an orthographic projection of the first data connection electrode on the base substrate.

In some exemplary implementation modes, a circuit unit at least includes a pixel drive circuit, and the pixel drive circuit includes a storage capacitor and a plurality of transistors. In a direction perpendicular to the display substrate, the drive circuit layer includes a semiconductor layer, a first conductive layer, a second conductive layer, and a third conductive layer which are disposed on the base substrate;

and the semiconductor layer at least includes active layers of the plurality of transistors, the first conductive layer at least includes gates of the plurality of transistors and a first electrode plate of the storage capacitor, the second conductive layer at least includes a second electrode plate of the storage capacitor, and the third conductive layer at least includes a plurality of connection electrodes.

In some exemplary implementation modes, the second conductive layer further includes the first connection line, and the third conductive layer further includes the second connection line and the data signal line.

In some exemplary implementation modes, the drive circuit layer further includes a fourth conductive layer located on a side of the third conductive layer away from the base substrate; the fourth conductive layer includes the data signal line and the second connection line; and the third conductive layer further includes the first connection line.

In some exemplary implementation modes, the drive circuit layer further includes a fourth conductive layer located on a side of the third conductive layer away from the base substrate, and a fifth conductive layer located on a side of the fourth conductive layer away from the base substrate; the fourth conductive layer includes the data signal line and the second connection line; and the fifth conductive layer includes the first connection line.

In some exemplary implementation modes, the bonding region at least includes a lead region, and the lead region includes a plurality of lead-out lines, and the data signal lines include a first data signal line group and a second data signal line group, a data signal line in the first data signal line group is electrically connected with a lead-out line through a data connection line, and a data signal line in the second data signal line group is directly electrically connected with a lead-out line.

In some exemplary implementation modes, the bonding region at least includes a lead region, and the lead region includes a plurality of lead-out lines, and the plurality of data signal lines are electrically connected with the plurality of lead-out lines through the plurality of data connection lines.

In some exemplary implementation modes, at least two second connection lines are disposed between two adjacent data signal lines.

In some exemplary implementation modes, at least one unit column includes a plurality of invalid pixel drive circuits, and an orthographic projection of at least one second connection line on the base substrate is overlapped with an orthographic projection of an invalid pixel drive circuit of the unit column on the base substrate.

In another aspect, an embodiment provides a display apparatus, which includes the aforementioned display substrate.

Other aspects may be understood upon reading and understanding drawings and detailed description.

BRIEF DESCRIPTION OF DRAWINGS

Accompanying drawings are used for providing further understanding of technical solutions of the present disclosure, constitute a part of the specification, and together with the embodiments of the present disclosure, are used for explaining the technical solutions of the present disclosure, and do not constitute limitations on the technical solutions of the present disclosure. Shapes and sizes of one or more components in the drawings do not reflect true scales, and are only intended to schematically describe contents of the present disclosure.

DETAILED DESCRIPTION

Figure 1:
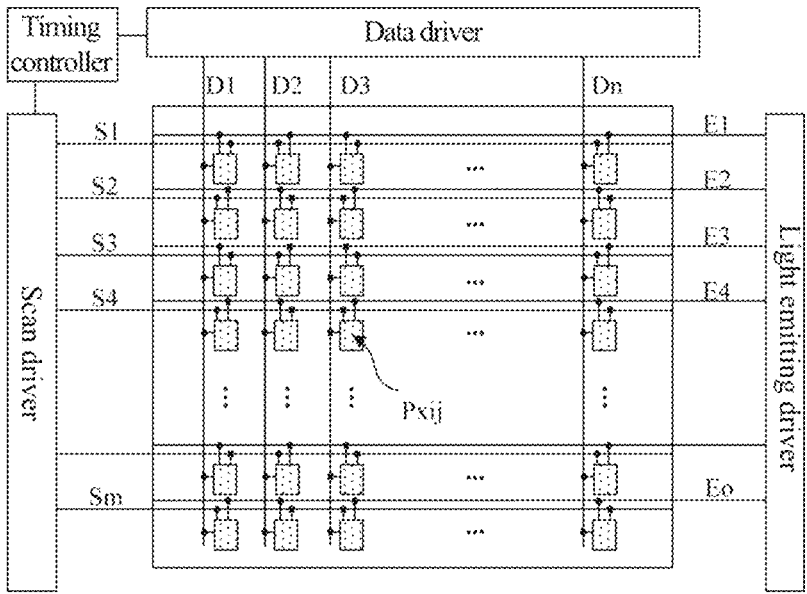
FIG. 1 is a schematic diagram of a structure of a display apparatus.

The embodiments of the present disclosure will be described below in combination with the drawings in detail. Implementation modes may be implemented in a plurality of different forms. Those of ordinary skill in the art may easily understand such a fact that manners and contents may be transformed into other forms without departing from the purpose and scope of the present disclosure. Therefore, the present disclosure should not be explained as being limited to contents described in following implementation modes only. The embodiments in the present disclosure and features in the embodiments may be combined randomly with each other without conflict.

In the drawings, a size of one or more constituent elements, a thickness of a layer, or a region is sometimes exaggerated for clarity. Therefore, a mode of the present disclosure is not necessarily limited to the size, and a shape and a size of one or more components in the drawings do not reflect a true proportion. In addition, the drawings schematically illustrate ideal examples, and one mode of the present disclosure is not limited to shapes, numerical values, or the like shown in the drawings.

Ordinal numerals such as "first", "second", and "third" in the specification are set to avoid confusion of constituent elements, but not to set a limit in quantity. In the present disclosure, "plurality" represents two or more than two.

In the specification, for convenience, wordings indicating orientation or positional relationships, such as "middle", "upper", "lower", "front", "back", "vertical", "horizontal", "top", "bottom", "inside", and "outside", are used for illustrating positional relationships between constituent elements with reference to the drawings, and are merely for facilitating the description of the specification and simplifying the description, rather than indicating or implying that a referred apparatus or element must have a particular orientation and be constructed and operated in the particular orientation. Therefore, they cannot be understood as limitations on the present disclosure. The positional relationships between the constituent elements are changed as appropriate according to a direction where the constituent elements are described.

Therefore, appropriate replacements may be made according to situations without being limited to the wordings described in the specification.

In the specification, unless otherwise specified and defined explicitly, terms "mount", "mutually connect", and "connect" should be understood in a broad sense. For example, it may be a fixed connection, a detachable connection, or an integrated connection; it may be a mechanical connection or a connection; it may be a direct connection, an indirect connection through an intermediate component, or communication inside two components. Those of ordinary skills in the art may understand meanings of the above-mentioned terms in the present disclosure according to situations.

In the specification, an "electrical connection" includes a case that constituent elements are connected together through an element having some electrical function. The "element having some electrical function" is not particularly limited as long as electrical signals between the connected constituent elements may be transmitted. Examples of the "element having some electrical function" not only include an electrode and a wiring, but also include a switching element such as a transistor, a resistor, an inductor, a capacitor, another element with a plurality of functions, etc.

In the specification, a transistor refers to an element which at least includes three terminals, i.e., a gate electrode, a drain electrode, and a source electrode. The transistor has a channel region between the drain electrode (drain electrode terminal, drain region, or drain) and the source electrode (source electrode terminal, source region, or source), and a current may flow through the drain electrode, the channel region, and the source electrode. In the specification, the channel region refers to a region through which a current mainly flows.

In the specification, a first electrode may be a drain electrode and a second electrode may be a source electrode, or, a first electrode may be a source electrode and a second electrode may be a drain electrode. In a case that transistors with opposite polarities are used, or in a case that a direction of a current is changed during work of a circuit, or the like, functions of the "source electrode" and the "drain electrode" may sometimes be interchangeable. Therefore, the "source electrode" and the "drain electrode" may be interchangeable in the specification. In addition, the gate electrode may also be referred to as a control electrode.

In the specification, "parallel" refers to a state in which an angle formed by two straight lines is above −10° and below 10°, and thus also includes a state in which the angle is above −5° and below 5°. In addition, "perpendicular" refers to a state in which an angle formed by two straight lines is above 80° and below 100°, and thus also includes a state in which the angle is above 85° and below 95°.

A triangle, rectangle, trapezoid, pentagon, or hexagon, etc. in this specification is not strictly defined, and it may be an approximate triangle, rectangle, trapezoid, pentagon, or hexagon, etc. There may be some small deformation caused by tolerance, and there may be a chamfer, an arc edge, and deformation, etc.

In this specification, "about" and "substantially" refer to that a boundary is not defined strictly and a case within a process and measurement error range is allowed. In this specification, "substantially the same" is a case where values differ by less than 10%.

FIG. 1 is a schematic diagram of a structure of a display apparatus. As shown in FIG. 1, the display apparatus may include a timing controller, a data driver, a scan driver, a light emitting driver, and a pixel array. The timing controller is connected with the data driver, the scan driver, and the light emitting driver, respectively. The data driver is respectively connected with a plurality of data signal lines (e.g., D1 to Dn), the scan driver is respectively connected with a plurality of scan signal lines (e.g., S1 to Sm), and the light emitting driver is respectively connected with a plurality of light emitting control lines (e.g., E1 to Eo). Among them, n, m, and o may be natural numbers. The pixel array may include a plurality of sub-pixels Pxij, wherein i and j may be natural numbers. At least one sub-pixel Pxij may include a circuit unit and a light emitting element connected with the circuit unit. The circuit unit may at least include a pixel drive circuit which may be connected with a scan signal line, a light emitting control line, and a data signal line, respectively.

In some exemplary embodiments, the timing controller may provide a gray-scale value and a control signal, which are suitable for a specification of the data driver, to the data driver, may provide a clock signal, a scan start signal, etc., which are suitable for a specification of the scan driver, to the scan driver, and may provide a clock signal, an emission stop signal, etc., which are suitable for a specification of the light emitting driver, to the light emitting driver. The data driver may generate a data voltage to be provided to the data signal lines D1, D2, D3, . . . , and Dn by using the gray-scale value and the control signal that are received from the timing controller. For example, the data driver may sample the gray-scale value by using a clock signal, and apply a data voltage corresponding to the gray-scale value to the data signal lines D1 to Dn by taking a pixel row as a unit. The scan driver may receive the clock signal, the scan start signal, etc., from the timing controller to generate a scan signal to be provided to the scan signal lines S1, S2, S3, . . . , and Sm. For example, the scan driver may provide a scan signal with an on-level pulse to the scan signal lines S1 to Sm sequentially. For example, the scan driver may be constructed in a form of a shift register and may generate a scan signal in a manner of sequentially transmitting a scan start signal provided in a form of an on-level pulse to a next-stage circuit under control of a clock signal. The light emitting driver may receive a clock signal, an emission stop signal, etc., from the timing controller to generate a light emitting control signal to be provided to the light emitting control lines E1, E2, E3, . . . , and Eo. For example, the light emitting driver may provide an emission signal with an off-level pulse to the light emitting control lines E1 to Eo sequentially. For example, the light emitting driver may be constructed in a form of a shift register and generate a light emitting control signal in a manner of sequentially transmitting an emission stop signal provided in a form of an off-level pulse to a next-stage circuit under control of a clock signal.

Figure 2:
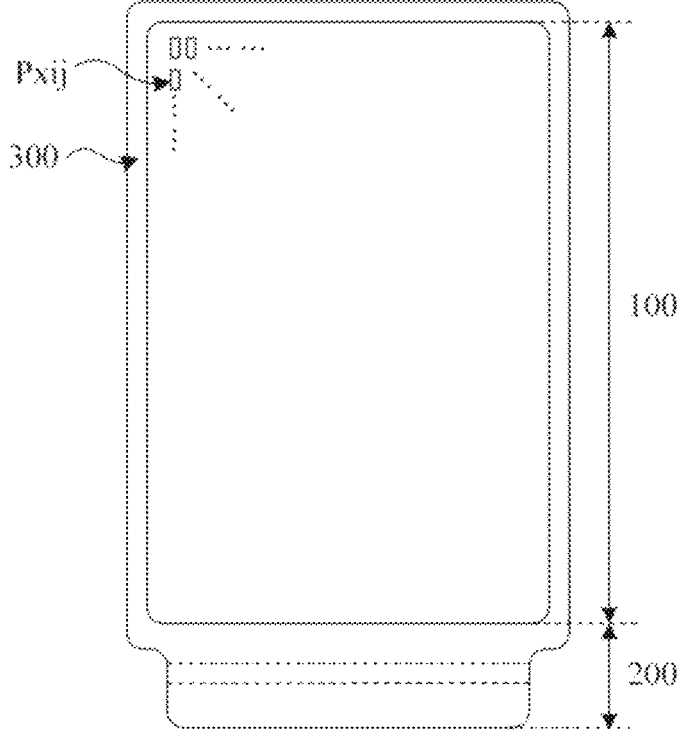
FIG. 2 is a schematic diagram of a structure of a display substrate.

FIG. 2 is a schematic diagram of a structure of a display substrate. As shown in FIG. 2, the display substrate may include a display region 100, a bonding region 200 located on a side of the display region 100, and a bezel region 300 located on another side of the display region 100. In some examples, the display region 100 may be a plat region including a plurality of sub-pixels Pxij that constitute a pixel array, the plurality of sub-pixels Pxij may be configured to display a dynamic picture or a static image, and the display region 100 may be referred to as an Active Area (AA). In some examples, the display substrate may be a flexible substrate, and accordingly the display substrate may be deformable, such as crimped, bent, folded, or rolled.

In an exemplary embodiments, the bonding region 200 may include a fan-out region, a bending region 202, a drive chip region, and a bonding pin region that are arranged sequentially along a direction away from the display region 100. The fan-out region is connected to the display region 100 and at least includes data fan-out lines, and a plurality of data fan-out lines are configured to be connected with the data signal lines of the display region 100 in a fan-out trace manner. The bending region is connected to the fan-out region and may include a composite insulation layer provided with a groove, and is configured to enable the drive chip region and the bonding pin region to be bent to a back of the display region 100. The drive chip region may be provided with an Integrated Circuit (IC), and the Integrated Circuit may be configured to be connected with the plurality of data fan-out lines. The bonding pin region may include a Bonding Pad, which may be configured to be bonded and connected with an external Flexible Printed Circuit (FPC).

In some exemplary embodiments, the bezel region 300 may include a circuit region, a power supply line region, a crack dam region, and a cutting region which are sequentially arranged along the direction away from the display region 100. The circuit region is connected to the display region 100 and may at least include a gate drive circuit which is connected with a first scan line, a second scan line, and a light emitting control line, which are connected with a pixel drive circuit in the display region 100. The power supply line region is connected to the circuit region and may at least include a bezel power supply lead that extends along a direction parallel to an edge of the display region and is connected with a cathode in the display region 100. The crack dam region is connected to the power supply line region and may at least include a plurality of cracks arranged on the composite insulation layer. The cutting region is connected to the crack dam region and may at least include a cutting groove arranged on the composite insulation layer, and the cutting groove is configured for cutting respectively along the cutting groove by a cutting device after all film layers of the display substrate are prepared.

In some exemplary embodiments, the fan-out region in the bonding region 200 and the power supply line region in the bezel region 300 may be provided with a first isolation dam and a second isolation dam, the first isolation dam and the second isolation dam may extend along a direction parallel to the edge of the display region 100, thus forming an annular structure surrounding the display region 100. The edge of the display region is an edge of the display region 100 on a side close to the bonding region 200 or the bezel region 300.

Figure 3:
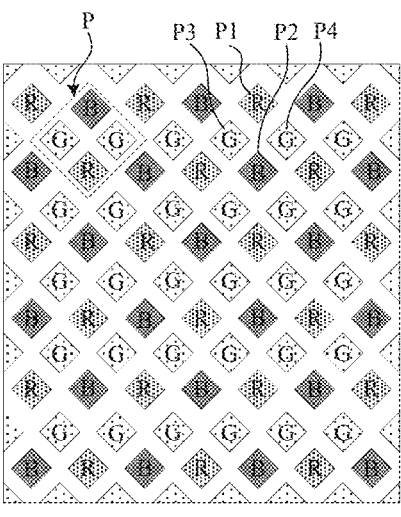
FIG. 3 is a schematic diagram of a planar structure of a display region in a display substrate.

FIG. 3 is a schematic diagram of a planar structure of a display region in a display substrate. As shown in FIG. 3, the display substrate may include multiple pixel units P arranged in a matrix. At least one pixel unit P may include a first sub-pixel P1 emitting light of a first color, a second sub-pixel P2 emitting light of a second color, and a third sub-pixel P3 and a fourth sub-pixel P4 emitting light of a third color. Each sub-pixel may include a circuit unit and a light emitting element, the circuit unit may at least include a pixel drive circuit which is connected with a scan signal line, a data signal line, and a light emitting control line respectively, and the pixel drive circuit may be configured to receive a data voltage transmitted by the data signal line and output a corresponding current to the light emitting element under control of the scan signal line and the light emitting control line. The light emitting element in each sub-pixel is connected with a pixel drive circuit of a sub-pixel where the light emitting element is located, and is configured to emit light with corresponding brightness in response to a current output by the pixel drive circuit of the sub-pixel where the light emitting element is located.

In some exemplary embodiments, the first sub-pixel P1 may be a red sub-pixel (R) emitting red light, the second sub-pixel P2 may be a blue sub-pixel (B) emitting blue light, and the third sub-pixel P3 and the fourth sub-pixel P4 may be green sub-pixels (G) emitting green light. In some examples, a shape of a light emitting element of a sub-pixel may be rectangular, diamond-shaped, pentagonal, or hexagonal, and light emitting elements of the four sub-pixels may be arranged in a manner of diamond to form an RGBG pixel arrangement. In other exemplary embodiments, the light emitting elements of the four sub-pixels may be arranged side by side horizontally, side by side vertically, or in a square-shaped manner, which is not limited here in the present disclosure.

In some other exemplary embodiments, a pixel unit may include three sub-pixels, and light emitting elements of the three sub-pixels may be arranged side by side horizontally, side by side vertically, or in a manner like a Chinese character "品", which is not limited here in the present disclosure.

Figure 4:
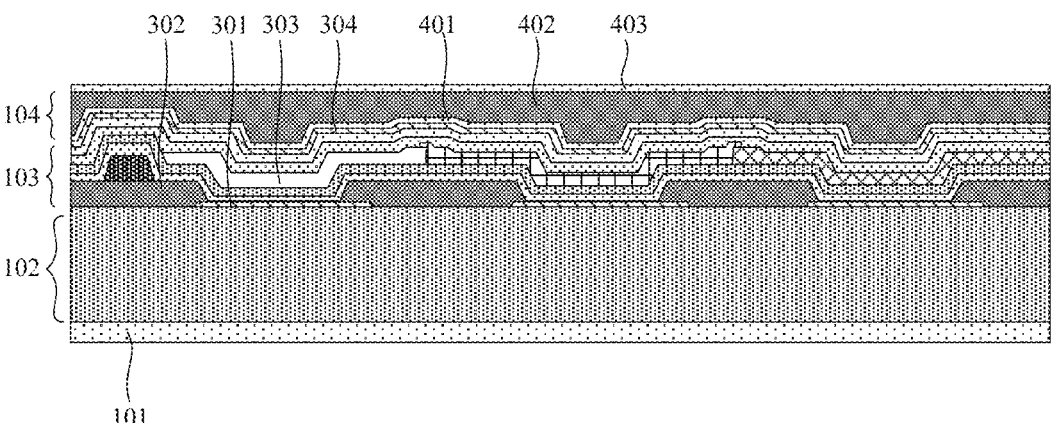
FIG. 4 is a schematic diagram of a sectional structure of a display region of a display substrate.

FIG. 4 is a schematic diagram of a sectional structure of a display region of a display substrate. FIG. 4 illustrates structures of three sub-pixels in the display region 100. As shown in FIG. 4, in a direction perpendicular to the display substrate, the display substrate may include a base substrate 101, and a drive circuit layer 102, a light emitting structure layer 103, and an encapsulation structure layer 104 which are sequentially arranged on the base substrate 101. In some possible implementation modes, the display substrate may include another film layer, such as a touch structure layer, which is not limited here in the present disclosure.

In some exemplary embodiments, the base substrate 101 may be a flexible base substrate or may be a rigid base substrate. The drive circuit layer 102 of each sub-pixel may include a pixel drive circuit composed of a plurality of transistors and a storage capacitor. The light emitting structure layer 103 of each sub-pixel may at least include an anode 301, a pixel definition layer 302, an organic emitting layer 303, and a cathode 304, the anode 301 is connected with the pixel drive circuit, the organic emitting layer 303 is connected with the anode 301, the cathode 304 is connected with the organic emitting layer 303, and the organic emitting layer 303 emits light of a corresponding color under drive of the anode 301 and the cathode 304. The encapsulation layer 104 may include a first encapsulation layer 401, a second encapsulation layer 402, and a third encapsulation layer 403 which are stacked, wherein the first encapsulation layer 401 and the third encapsulation layer 403 may be made of an inorganic material, the second encapsulation layer 402 may be made of an organic material, and the second encapsulation layer 402 is arranged between the first encapsulation layer 401 and the third encapsulation layer 403 to form a laminated structure of an inorganic material/an organic material/an inorganic material, which may ensure that external water vapor cannot enter the light emitting structure layer 103.

In some exemplary embodiments, the organic emitting layer 303 may include an Emitting Layer (EML), and any one or more of following layers: a Hole Injection Layer (HIL), a Hole Transport Layer (HTL), an Electron Block Layer (EBL), a Hole Block Layer (HBL), an Electron Transport Layer (ETL), and an Electron Injection Layer (EIL). In some examples, one or more layers of hole injection layers, hole transport layers, electron block layers, hole block layers, electron transport layers, and electron injection layers of all sub-pixels may be a common layer respectively connected together. Emitting layers of adjacent sub-pixels may be overlapped slightly, or may be mutually isolated.

Figure 5:
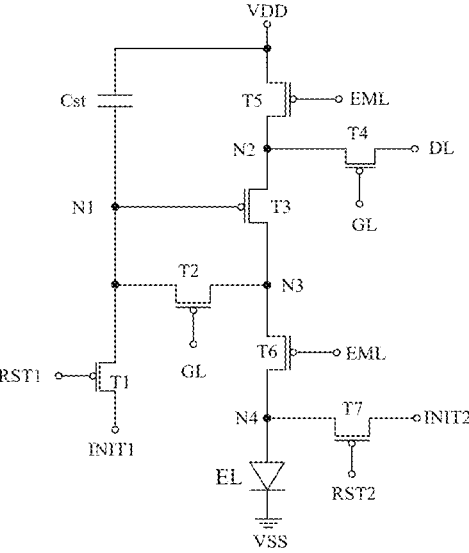
FIG. 5 is a schematic diagram of an equivalent circuit of a pixel drive circuit.

FIG. 5 is a schematic diagram of an equivalent circuit of a pixel drive circuit. In some exemplary embodiments, the pixel drive circuit may have a structure of 3T1C, 4T1C, 5T1C, 5T2C, 6T1C, 7T1C, or 8T1C. The pixel drive circuit of the exemplary embodiments is described by taking a 7T1C structure as an example. However, the embodiments are not limited thereto.

In some exemplary implementation modes, as shown in FIG. 5, the pixel circuit according to this example may include seven transistors (i.e., a first transistor T1 to a seventh transistor T7) and one storage capacitor Cst. The pixel drive circuit is respectively connected with nine signal lines (for example, including a data signal line DL, a first scan signal line GL, a second scan signal line RST1, a third scan signal line RST2, a light emitting control line EML, a first initial signal line INIT1, a second initial signal line INIT2, a first power supply line VDD, and a second power supply line VSS).

In some exemplary implementation modes, the seven transistors of the pixel drive circuit may be P-type transistors, or may be N-type transistors. Use of a same type of transistors in a pixel drive circuit may simplify a process flow, reduce process difficulties of a display panel, and improve a yield of products. In some possible implementation modes, the seven transistors in the pixel drive circuit may include a P-type transistor and an N-type transistor.

In some exemplary implementation modes, for the seven transistors in the pixel drive circuit, low temperature poly silicon thin film transistors may be adopted, or oxide thin film transistors may be adopted, or a low temperature poly silicon thin film transistor and an oxide thin film transistor may be adopted. Low Temperature Poly Silicon (LTPS) is adopted for an active layer of a low temperature poly silicon thin film transistor and an oxide semiconductor (Oxide) is adopted for an active layer of an oxide thin film transistor. The low temperature poly silicon thin film transistor has advantages such as a high migration rate and fast charging, and the oxide thin film transistor has advantages such as a low leakage current. The low temperature poly silicon thin film transistor and the oxide thin film transistor are integrated on one display substrate, that is, an LTPS+Oxide (LTPO for short) display substrate, so that advantages of the low temperature poly silicon thin film transistor and the oxide thin film transistor may be utilized, low-frequency drive may be achieved, power consumption may be reduced, and display quality may be improved.

In some exemplary implementation modes, the first power supply line VDD may be configured to provide a constant first voltage signal to the pixel drive circuit, the second power supply line VSS may be configured to provide a constant second voltage signal to the pixel drive circuit, and the first voltage signal is greater than the second voltage signal. The first scan signal line GL may be configured to provide a first scan signal SCAN to the pixel drive circuit, the data signal line DL may be configured to provide a data signal DATA to the pixel drive circuit, and the light emitting control line EML may be configured to provide a light emitting control signal EM to the pixel drive circuit. In some examples, in a pixel drive circuit of an n-th row, a second scan signal line RST1 may be electrically connected with a first scan signal line GL of a pixel drive circuit of an (n−1)-th row to be inputted with a first scan signal SCAN (n−1). A third scan signal line RST2 of the pixel drive circuit of the n-th row may be electrically connected with a first scan signal line GL of the pixel drive circuit of the n-th row to be inputted with a first scan signal SCAN (n). In some examples, a third scan signal line RST2 which is electrically connected with the pixel drive circuit of the n-th row and a second scan signal line RST1 which is electrically connected with a pixel drive circuit of an (n+1)-th row may be of an integral structure. Herein, n is an integer greater than 0. Thus, signal lines of the display substrate may be reduced, and a design of a narrow bezel of the display substrate may be achieved. However, the embodiments are not limited thereto.

In some exemplary implementation modes, the first initial signal line INIT1 may be configured to provide a first initial signal to the pixel drive circuit, the second initial signal line INIT2 may be configured to provide a second initial signal to the pixel drive circuit. For example, the first initial signal may be different from the second initial signal. The first initial signal and the second initial signal may be constant voltage signals, and their magnitudes may be between a first voltage signal provided by the first power supply line VDD and a second voltage signal provided by the second power supply line VSS, but not limited to this. In other examples, the first initial signal and the second initial signal may be the same, and only the first initial signal line may be disposed, to provide the first initial signal.

In some exemplary implementation modes, as shown in FIG. 5, a gate electrode of the first transistor T1 is electrically connected with the second scan signal line RST1, a first electrode of the first transistor T1 is electrically connected with the first initial signal line INIT1, and a second electrode of the first transistor T1 is electrically connected with a gate electrode of the third transistor T3. A gate electrode of the second transistor T2 is electrically connected with the first scan signal line GL, a first electrode of the second transistor T2 is electrically connected with the gate electrode of the third transistor T3, and a second electrode of the second transistor T2 is electrically connected with a second electrode of the third transistor T3. The gate electrode of the third transistor T3 is connected with a first node N1, a first electrode of the third transistor T3 is connected with a second node N2, and a second electrode of the third transistor T3 is connected with a third node N3. The third transistor T3 may be referred to as a drive transistor, and the third transistor T3 determines an amount of a drive current flowing between the first power supply line VDD and the second power supply line VSS according to a potential difference between the gate electrode and the first electrode of the third transistor T3. A gate electrode of the fourth transistor T4 is connected with the first scan signal line GL, a first electrode of the fourth transistor T4 is connected with the data signal line DL, and a second electrode of the fourth transistor is connected with the first electrode of the third transistor T3. A gate electrode of the fifth transistor T5 is electrically connected with the light emitting control line EML, a first electrode of the fifth transistor T5 is electrically connected with the first power supply line VDD, and a second electrode of the fifth transistor T5 is electrically connected with the first electrode of the third transistor T3. A gate electrode of the sixth transistor T6 is electrically connected with the light emitting control line EML, a first electrode of the sixth transistor T6 is electrically connected with the second electrode of the third transistor T3, and a second electrode of the sixth transistor T6 is electrically connected with an anode of a light emitting element EL. The fifth transistor T5 and the sixth transistor T6 may be referred to as light emitting transistors. A gate electrode of the seventh transistor T7 is electrically connected with the third scan signal line RST2, a first electrode of the seventh transistor T7 is electrically connected with the second initial signal line INIT2, and a second electrode of the seventh transistor T7 is electrically connected with the anode of the light emitting element EL. A first electrode plate of the storage capacitor Cst is electrically connected with the gate electrode of the third transistor T3, and a second electrode plate of the storage capacitor Cst is electrically connected with the first power supply line VDD.

In this example, the first node N1 is a connection point of the storage capacitor Cst, the first transistor T1, the third transistor T3, and the second transistor T2, the second node N2 is a connection point of the fifth transistor T5, the fourth transistor T4, and the third transistor T3, the third node N3 is a connection point of the third transistor T3, the second transistor T2, and the sixth transistor T6, and the fourth node N4 is a connection point of the sixth transistor T6, the seventh transistor T7, and the light emitting element EL.

In some exemplary embodiments, the light emitting element EL may be an OLED including a first electrode (anode), an organic emitting layer, and a second electrode (cathode), which are stacked, or may be a QLED including a first electrode (anode), a quantum dot emitting layer, and a second electrode (cathode), which are stacked. A second electrode of the light emitting element is connected with the second power supply line VSS, a signal of the second power supply line VSS is a low-level signal which is continuously provided, and a signal of the first power supply line VDD is a high-level signal which is continuously provided.

In some exemplary implementation modes, taking a case that the first transistor T1 to the seventh transistor T7 which are included by the pixel drive circuit are all P-type oxide transistors as an example, a working process of the pixel drive circuit may include following stages.

A first stage A1 is referred to as a reset stage. A low-level signal provided by the second scan control line RST1 enables the first transistor T1 to be turned on, and a first initial signal provided by the first initial signal line INIT1 is provided to the first node N1 to initialize the first node N1 and clear an original data voltage in the storage capacitor Cst. The first scan signal line GL provides a high-level signal and the light emitting control line EML provides a high-level signal, so that the fourth transistor T4, the second transistor T2, the fifth transistor T5, the sixth transistor T6, and the seventh transistor T7 are turned off. In this stage, the light emitting element EL does not emit light.

A second stage A2 is referred to as a data writing stage or a threshold compensation stage. The first scan signal line GL provides a low-level signal, the second scan signal line RST1 and the light emitting control line EML both provide high-level signals, and the data signal line DL outputs a data signal DATA. In this stage, since the first electrode plate of the storage capacitor Cst is at a low level, the third transistor T3 is turned on. The first scan signal line GL provides the low-level signal, so that the second transistor T2, the fourth transistor T4, and the seventh transistor T7 are turned on. The second transistor T2 and the fourth transistor T4 are turned on, so that a data voltage Vdata output by the data signal line DL is provided to the first node N1 through the second node N2, the turned-on third transistor T3, the third node N3, and the turned-on second transistor T2, and the storage capacitor Cst is charged with a difference between the data voltage Vdata output by the data signal line DL and a threshold voltage of the third transistor T3. A voltage of the first electrode plate (i.e., the first node N1) of the storage capacitor Cst is Vdata−|Vth|, wherein Vdata is the data voltage output by the data signal line DL, and Vth is the threshold voltage of the third transistor T3. The seventh transistor T7 is turned on, so that a second initial signal provided by the second initial signal line INIT2 is provided to the anode of the light emitting element EL to initialize (reset) the anode of the light emitting element EL and clear a pre-stored voltage therein, so as to complete initialization, thereby ensuring that the light emitting element EL does not emit light. The second scan signal line RST1 provides a high-level signal, so that the first transistor T1 is turned off. The light emitting control line EML provides a high-level signal, so that the fifth transistor T5 and the sixth transistor T6 are turned off.

A third stage A3 is referred to as a light emitting stage. The light emitting control line EML provides a low-level signal, and both the first scan signal line GL and the second scan signal line RST1 provide high-level signals. The light emitting control line EML provides the low-level signal, so that the fifth transistor T5 and the sixth transistor T6 are turned on, and a first voltage signal outputted by the first power supply line VDD provides a drive voltage to the anode of the light emitting element EL through the turned-on fifth transistor T5, the third transistor T3, and the sixth transistor T6, to drive the light emitting element EL to emit light.

In a drive process of the pixel drive circuit, a drive current flowing through the third transistor T3 (i.e., the drive transistor) is determined by a voltage difference between the gate electrode and the first electrode of the third transistor T3. Since the voltage of the first node N1 is Vdata-|Vth|, the drive current of the third transistor T3 is as follows.

$$I = K \times (Vgs - Vth)^2 = K \times [(Vdd - Vdata + |Vth|) - Vth]^2 = K \times [Vdd - Vdata]^2$$

Among them, I is the drive current flowing through the third transistor T3, that is, a drive current for driving the light emitting element EL, K is a constant, Vgs is the voltage difference between the gate electrode and the first electrode of the third transistor T3, Vth is the threshold voltage of the third transistor T3, Vdata is the data voltage output by the data signal line DL, and Vdd is the first voltage signal output by the first power supply line VDD.

It may be seen from the above formula that a current flowing through the light emitting element EL is independent of the threshold voltage of the third transistor T3. The pixel drive circuit according to the embodiment may better compensate the threshold voltage of the third transistor T3.

With development of OLED display technologies, consumers have higher requirements for display effects of display products. Extremely narrow bezels have become a new trend in development of the display products. Therefore, bezel narrowing or even a bezel-less design has received more and more attention in designs of OLED display products. In a display substrate, a bonding region generally includes a fan-out region, a bending region, a drive chip region, and a bonding pin region which are arranged sequentially along a direction away from a display region. Since a width of the bonding region is smaller than a width of the display region, signal lines of an integrated circuit and a bonding pad in the bonding region need to pass through the fan-out region before they can be led into the display region which is relatively wide in a fan-out (Fanout) trace manner, the greater the width difference between the display region and the bonding region is, the more oblique fan-out lines in a fan-shaped region is, the longer the distance between the drive chip region and the display region is, so the fan-shaped region occupies relatively large space, which makes it more difficult to narrow a lower bezel, and the lower bezel is always maintained at about 2.0 mm.

An embodiment of the present disclosure provides a display substrate, including a display region and a bonding region located on a side of the display region. The display region includes a plurality of circuit units constituting a plurality of unit rows and a plurality of unit columns, a plurality of data signal lines extending along a second direction, and a plurality of data connection lines. At least one data signal line of the plurality of data signal lines is electrically connected with one unit column. At least one data connection line includes a first connection line extending along a first direction and a second connection line extending along the second direction. The first direction intersects with the second direction. The first connection line is electrically connected with the second connection line and the data signal line, respectively. The first connection line and the second connection line are located in different conductive layers. In some examples, an orthographic projection of the first connection line on a base substrate may be overlapped with an orthographic projection of one unit row on the base substrate, and an orthographic projection of the second connection line on the base substrate may be overlapped with an orthographic projection of one unit column on the base substrate.

In the present disclosure, "A extends along a B direction" means that A may include a main portion and a secondary portion connected with the main portion, the main portion is a line, a line segment, or a strip-shaped body, the main portion extends along the B direction, and a length of the main portion extending along the B direction is greater than a length of the secondary portion extending along another direction. In following description, "A extends along a B direction" means that "a main body portion of A extends along a B direction". In some examples, a second direction Y may be a direction pointing to a bonding region from a display region, and an opposite direction of the second direction Y may be a direction pointing to the display region from the bonding region.

The display substrate provided by the embodiment may enable a lead-out line of the bonding region to be electrically connected with a data signal line through a data connection line by disposing data connection lines in the display region, so that no fan-shaped oblique line needs to be disposed in the bonding region, a length of a lead region of the bonding region is effectively reduced, a width of a lower bezel is greatly reduced, and a screen-to-body ratio is increased, which is beneficial to achieve full-screen display. Moreover, in the display substrate of this embodiment, a case where data connection lines are densely disposed in a same conductive layer may be avoided by disposing a first connection line and a second connection line of the data connection lines extending along two different directions in different conductive layers, so that different regions of the display region can all achieve substantially the same display effect under transmitted light and reflected light, effectively eliminating a shadow elimination situation, effectively avoiding poor appearance of the display substrate, and improving display character and display quality.

In some exemplary implementation modes, a first end of at least one first connection line may be electrically connected with a data signal line, and a second end may be electrically connected with a second connection line. In this example, a length of the first connection line along the first direction may be determined according to a pitch between the data signal line and the second connection line which are electrically connected in the first direction. In some examples, a length of the second connection line along the second direction may be determined according to a distance between boundaries of the display region and the bonding region and the first connection line which is electrically connected with the second connection line.

In some exemplary implementation modes, at least one first connection line may penetrate through the display region along the first direction. In this example, two ends of the first connection line extend to boundaries between the display region and bezel regions on both sides respectively, and are electrically connected with a data signal line and a second connection line through a middle portion of the first connection line. In some examples, lengths of a plurality of first connection lines along the first direction may be substantially the same. This example may ensure uniformity of traces in different regions of the display region by disposing first connection lines having substantially the same length.

In some exemplary implementation modes, at least one second connection line may penetrate through the display region along the second direction. In this example, two ends of the second connection line may extend to a boundary between the display region and an upper bezel region and a boundary between the display region and the bonding region respectively. In some examples, lengths of a plurality second connection lines along the second direction may be substantially the same. This example may ensure uniformity of traces in different regions of the display region by disposing second connection lines having substantially the same length.

Figure 6:
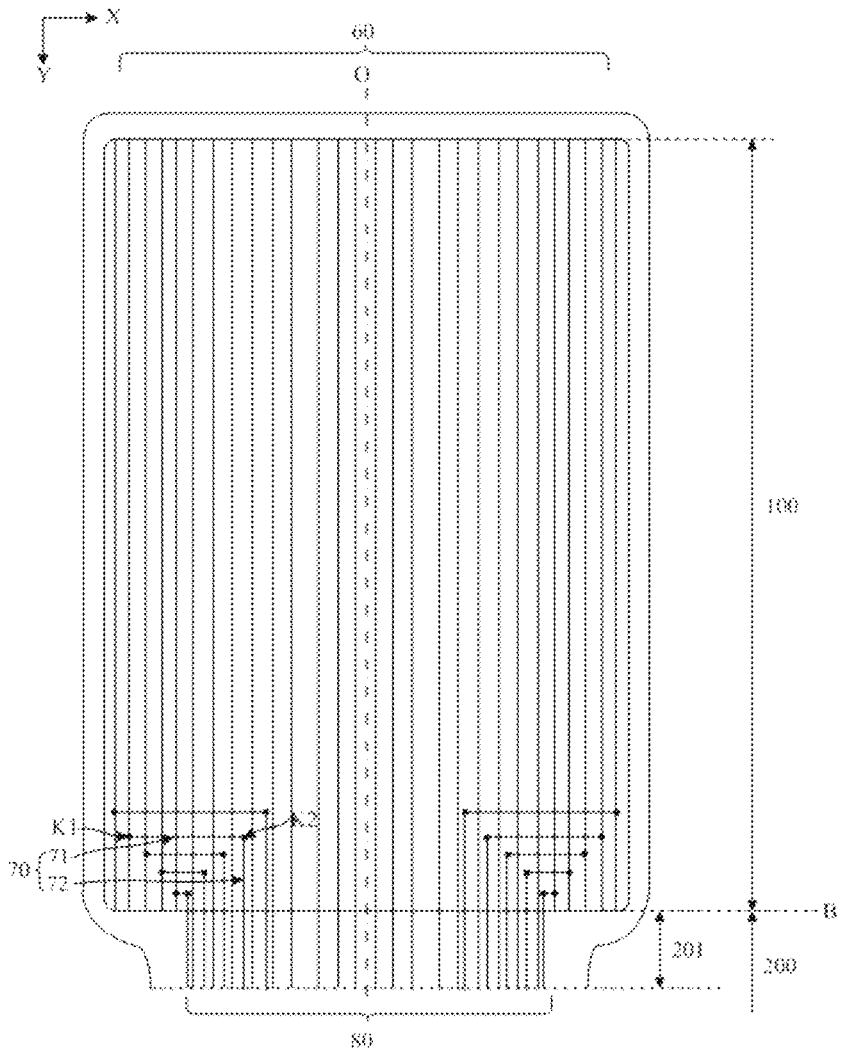
FIG. 6 is a schematic diagram of a planar structure of a display substrate according to at least one embodiment of the present disclosure.

FIG. 6 is a schematic diagram of a planar structure of a display substrate according to at least one embodiment of the present disclosure. In a plane perpendicular to the display substrate, the display substrate may include a drive circuit layer disposed on a base substrate, a light emitting structure layer disposed on a side of the drive circuit layer away from the base substrate, and an encapsulation structure layer disposed on a side of the light emitting structure layer away from the base substrate. As shown in FIG. 6, in a plane parallel to the display substrate, the display substrate may at least include a display region 100, a bonding region 200 located on a side of the display region 100 along a second direction Y, and a bezel region 300 located on another side of the display region 100. In some examples, the drive circuit layer of the display region 100 may include a plurality of circuit units constituting a plurality of unit rows and a plurality of unit columns, a plurality of data signal lines 60, and a plurality of data connection lines 70. At least one circuit unit may include a pixel drive circuit, which may be configured to output a corresponding current to a connected light emitting element. The light emitting structure layer of the display region 100 may include a plurality of light emitting elements, a light emitting element is connected with a pixel drive circuit of a corresponding circuit unit, and the light emitting element is configured to emit light with corresponding brightness in response to a current outputted by the connected pixel drive circuit. In some examples, the circuit units may be regions divided according to pixel drive circuits. A position of an orthographic projection of the light emitting element on the base substrate may correspond to a position of an orthographic projection of the circuit unit on a base substrate, or a position of an orthographic projection of the light emitting element on a base substrate may not correspond to a position of an orthographic projection of the circuit unit on the base substrate.

In some examples, at least one data signal line 60 is connected with a plurality of pixel drive circuits in a unit column, and the data signal line 60 may be configured to provide a data signal to the connected pixel drive circuits. At least one data connection line 70 is correspondingly connected with the data signal line 60, and the data connection line 70 may be configured such that the data signal line 60 is correspondingly connected with a lead-out line 80 in the bonding region 200 through the data connection line 70.

In some examples, a plurality of circuit units sequentially arranged along a first direction X may be referred to as a unit row, and a plurality of circuit units sequentially arranged along a second direction Y may be referred to as a unit column, and the plurality of unit rows and the plurality of unit columns constitute an array of circuit units arranged in an array, wherein the first direction intersects with the second direction. For example, the second direction Y may be an extension direction (e.g., a vertical direction) of a data signal line 60, and the first direction X may be perpendicular to the second direction Y (e.g., a horizontal direction).

In some examples, as show in FIG. 6, the bonding region 200 may include a lead region 201, a bending region 202, a drive chip region, and a bonding pin region which are arranged sequentially along a direction away from the display region. The lead region 201 is connected to the display region 100, and the bending region is connected to the lead region 201. The lead region 201 may be provided with a plurality of lead-out lines 80, which may extend along the second direction Y away from the display region 100, wherein first ends of some lead-out lines 80 are correspondingly connected with data connection lines 70 in the display region 100, first ends of other lead-out lines are correspondingly connected with data signal lines 60 in the display region 100, and second ends of all the lead-out lines 80 are connected with an integrated circuit of a composite circuit region across the bending region, so that the integrated circuit applies a data signal to the data signal lines 60 through the lead-out lines 80 and the data connection lines 70. Since the data connection lines 70 are disposed in the display region 100, a length of the lead region 201 in the second direction Y may be effectively reduced, a width of a lower bezel may be greatly reduced, a screen-to-body ratio may be increased, which is beneficial to achieving full-screen display.

In some examples, a plurality of data signal lines 60 of the display region 100 may extend along the second direction Y and are sequentially disposed at set intervals along the first direction X in an increasing number manner. The plurality of data signal lines 60 may be divided into a first data signal line group and a second data signal line group according to whether they are connected with the data connection lines, wherein a plurality of data signal lines 60 in the first data signal line group are connected correspondingly with the data connection lines 70, and a plurality of data signal lines 60 in the second data signal line group are not connected with the data connection lines 70. The plurality of lead-out lines 80 of the lead region 201 may be divided into a first lead-out line group and a second lead-out line group according to whether they are connected with the data connection lines 70 or the data signal lines 60, wherein a plurality of lead-out lines 80 in the first lead-out line group are connected with the data connection lines 70, and a plurality of lead-out lines 80 in the second lead-out line group are connected with the data signal lines 60. In some examples, a lead-out line 80 and a data signal line 60 may be connected directly or may be connected through a via, and a lead-out line 80 and a data connection line 70 may be connected directly or may be connected through a via, which is not limited here in the present disclosure.

In some examples, as shown in FIG. 6, the data connection lines 70 of the display region 100 may include a first connection line 71 and a second connection line 72. The first connection line 71 and the second connection line 72 are connected with each other. The first connection line 71 may extend along the first direction X, and the second connection line 72 may extend along the second direction Y. A first end of the first connection line 71 may be correspondingly connected with a data signal line 60 of the first data signal line group, a second end of the first connection line 71 may be connected with a first end of the second connection line 72 after extending along the first direction X or an opposite direction of the first direction X, a second end of the second connection line 72 may extend toward a direction of the bonding region 200 and cross a boundary B of the display region, and be connected correspondingly with a lead-out line 80 of the first lead-out line group in the lead region 201, so that a data signal line 60 of the first data signal line group in the display region 100 may be indirectly connected with a lead-out line 80 through a data connection line 70. The plurality of data signal lines 60 of the second data signal line group may extend toward the direction of the bonding region 200 and cross the boundary B of the display region, and be connected correspondingly with the plurality of lead-out lines 80 of the second lead line group in the lead region 201, so that the plurality of data signal lines 60 of the second data signal line group in the display region 100 are directly connected with the lead-out lines 80. In this example, the boundary B of the display region may be at a junction of the display region 100 and the bonding region 200.

In some examples, the first connection line 71 and the second connection line 72 may be disposed in different conductive layers, and the first connection line 71 and a data signal line 60 may be disposed in different conductive layers. For example, the first end of the first connection line 71 may be connected with the data signal line 60 through a first connection hole K1, the second end of the first connection line 71 may be connected with the first end of the second connection line 72 through a second connection hole K2 after extending along the first direction X or the opposite direction of the first direction X, and the second end of the second connection line 72 may be connected with a lead-out line 80 after extending toward a direction of the lead region 201 along the second direction Y.

In some examples, at least one data signal line 60 may be disposed between two adjacent second connection lines 72 in the first direction X. For example, a data signal line may be disposed between adjacent second connection lines 72. For another example, two data signal lines may be disposed between adjacent second connection lines 72.

In some examples, the plurality of second connection lines 72 may be disposed to be parallel to a data signal line 60, and the plurality of first connection lines 71 may be arranged to be perpendicular to the data signal line 60.

In some examples, pitches between adjacent second connection lines 72 may be substantially the same, and pitches between adjacent first connection lines 71 may be substantially the same, which is not limited here in the present disclosure.

In some examples, the display region 100 may have a center line O, and the plurality of data signal lines 60 and the plurality of data connection lines 70 in the display region 100, and the plurality of lead-out lines 80 in the lead region 201 may be disposed symmetrically with respect to the center line O, and the center line O may be a straight line bisecting the plurality of unit columns of the display region 100 and extending along the second direction Y. As shown in FIG. 6, taking a plurality of data signal lines 60 and a plurality of data connection lines 70 in the first data signal line group located on a left side of the center line O as an example, in the first data signal line group, a second connection line 72 connected with a data signal line 60 away from the center line O may be located on a side of a second connection line 72 connected with a data signal line 60 close to the center line O, close to the center line O. In this example, lengths of the plurality of second connection lines 72 along the second direction Y may gradually increase in the first direction X along a direction close to the center line O. In the first data signal line group, a first connection line 71 connected with a data signal line 60 away from the center line O may be located on a side of a first connection line 71 connected with a data signal line 60 close to the center line O, away from the bonding region 200. In this example, lengths of the plurality of first connection lines 71 along the first direction X may gradually decease in the second direction Y. This exemplary embodiment may not only facilitate a layout of the data connection lines and no abrupt change in a load, but also further compress occupied space of the data connection lines by disposing a data signal line between adjacent second connection lines, and may minimize a load difference of data signals. However, this embodiment is not limited thereto. For example, in the first data signal line group, a second connection line connected with a data signal line away from the center line O may be located on a side of a second connection line connected with a data signal line close to the center line O, away from the center line O. For another example, in the first data signal line group, a first connection line connected with a data signal line away from the center line O may be located on a side of a first connection line connected with a data signal line close to the center line O, close to the bonding region 200.

Figure 7A:
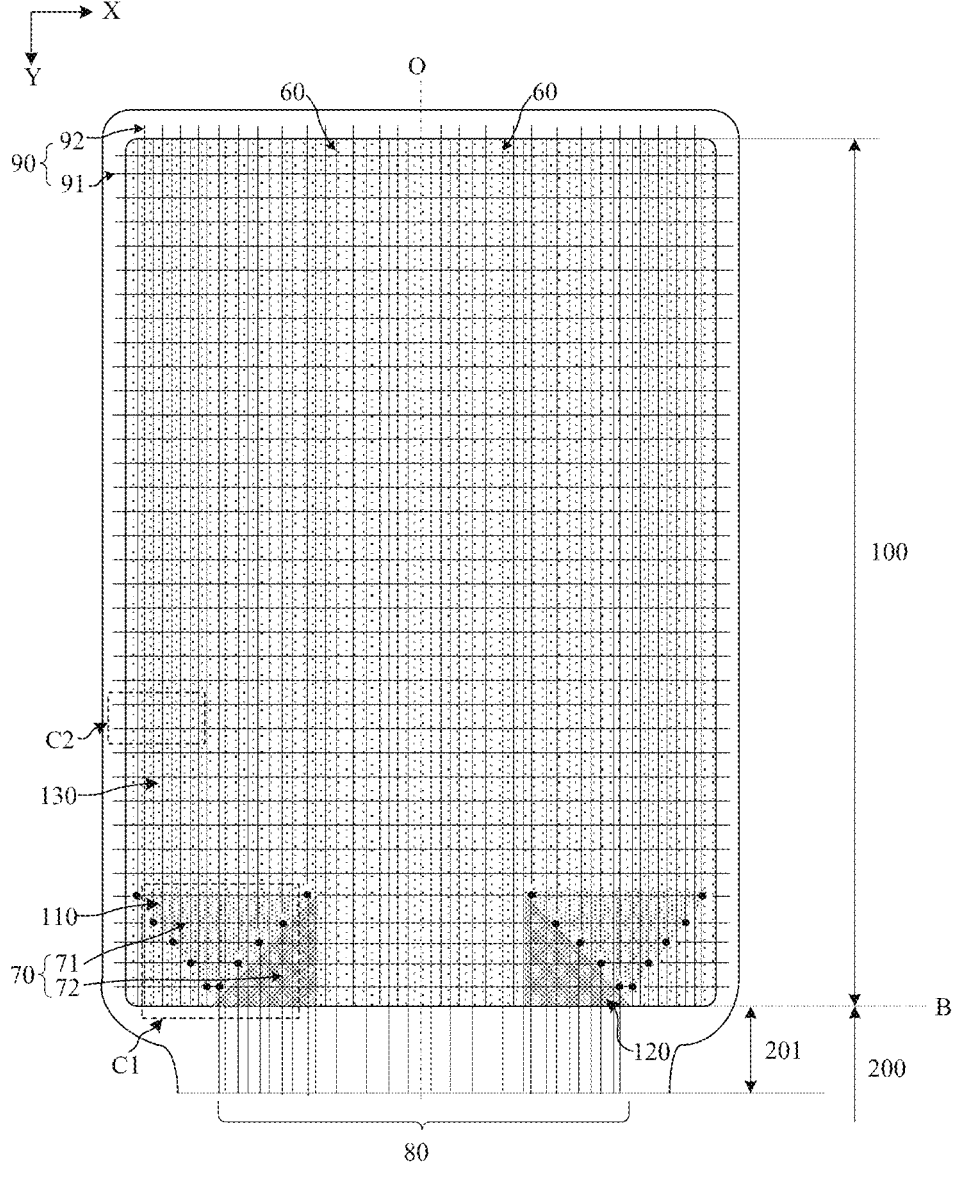
FIG. 7A is a schematic diagram of another planar structure of a display substrate according to at least one embodiment of the present disclosure.
Figure 7B:
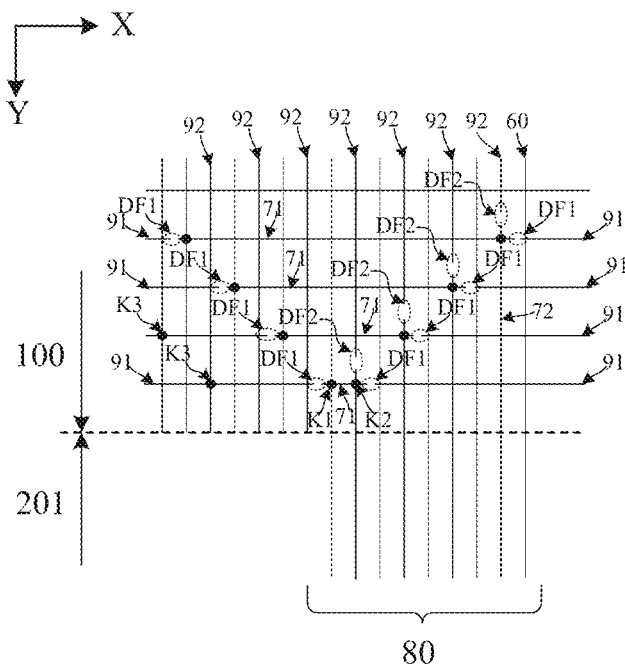
FIG. 7B is a partial enlarged schematic diagram of a region C1 in FIG. 7A.

FIG. 7A is a schematic diagram of another planar structure of a display substrate according to at least one embodiment of the present disclosure. FIG. 7B is a partial enlarged schematic diagram of a region C1 in FIG. 7A. A drive circuit layer of a display region 100 may include a plurality of circuit units which form an array of circuit units, a plurality of data signal lines 60, a plurality of data connection lines 70, and compensation traces 90. Layouts and structures of the plurality of circuit units, the plurality of data signal lines 60, and the plurality of data connection lines 70 are substantially the same as those shown in FIG. 6.

In some examples, as shown in FIG. 7A and FIG. 7B, the compensation traces 90 may include a plurality of first compensation traces 91 extending along a first direction X and a plurality of second compensation traces 92 extending along a second direction Y. The plurality of first compensation traces 91 may be disposed sequentially along the second direction Y, and the plurality of second compensation traces 92 may be disposed sequentially along the first direction X. A first compensation trace 91 and a second compensation trace 92 may be disposed in different conductive layers. The second compensation trace 92 may be disposed between adjacent data signal lines 60. Orthographic projections of the plurality of first compensation traces 91 on a base substrate may intersect with orthographic projections of the plurality of second compensation traces 92 on the base substrate to form a mesh structure. In some examples, at least one second compensation trace 92 may be electrically connected with at least one first compensation trace 91 through a third connection hole K3, so that the plurality of first compensation traces 91 and the plurality of second compensation traces 92 may form a mesh communication structure.

In some examples, a first compensation trace 91 and a first connection line 71 may be disposed in a same layer and formed synchronously through a same patterning process. A second compensation trace 92 and a second connection line 72 may be arranged in a same layer and formed synchronously through a same patterning process. In this example, by disposing the compensation traces 90, an appearance compensation effect may be provided to the data connection lines 70, so that different regions of the display region may achieve substantially the same display effect under both transmitted light and reflected light, effectively eliminating a shadow elimination situation, effectively avoiding poor appearance of a display substrate, and improving display character and display quality.

In some examples, only a first compensation trace 91 may be disposed in at least one unit row and no first connection line 71 is disposed in this unit row. At least one first compensation trace 91 and at least one first connection line 71 may be disposed in at least one unit row. For example, a first compensation trace 91 and a first connection line 71 in at least one unit row may be aligned in the first direction X, and one circuit unit of this unit row may include a first fracture DF1, and the first fracture DF1 may be disposed between the first compensation trace 91 and the first connection line 71. The first fracture DF1 may be configured to achieve that there is no electrical connection relationship between the first compensation trace 91 and the first connection line 71.

In some examples, only a second compensation trace 92 may be disposed in at least one unit column and no second connection line 72 is disposed in this unit column. At least one second compensation trace 92 and at least one second connection line 72 may be disposed in at least one unit column. For example, the second compensation trace 92 and the second connection line 72 in the at least one unit column may be aligned in the second direction Y, and one circuit unit of this unit column may include a second fracture DF2, and the second fracture DF2 may be second fracture DF2ed between the second compensation trace 92 and the second connection line 72. The second fracture DF2 may be configured to achieve that there is no electrical connection relationship between the second compensation trace 92 and the second connection line 72.

In some examples, a first compensation trace 91 and ae second compensation trace 92 may be electrically connected with a second power supply line to continuously receive a low-level signal.

Figure 8:
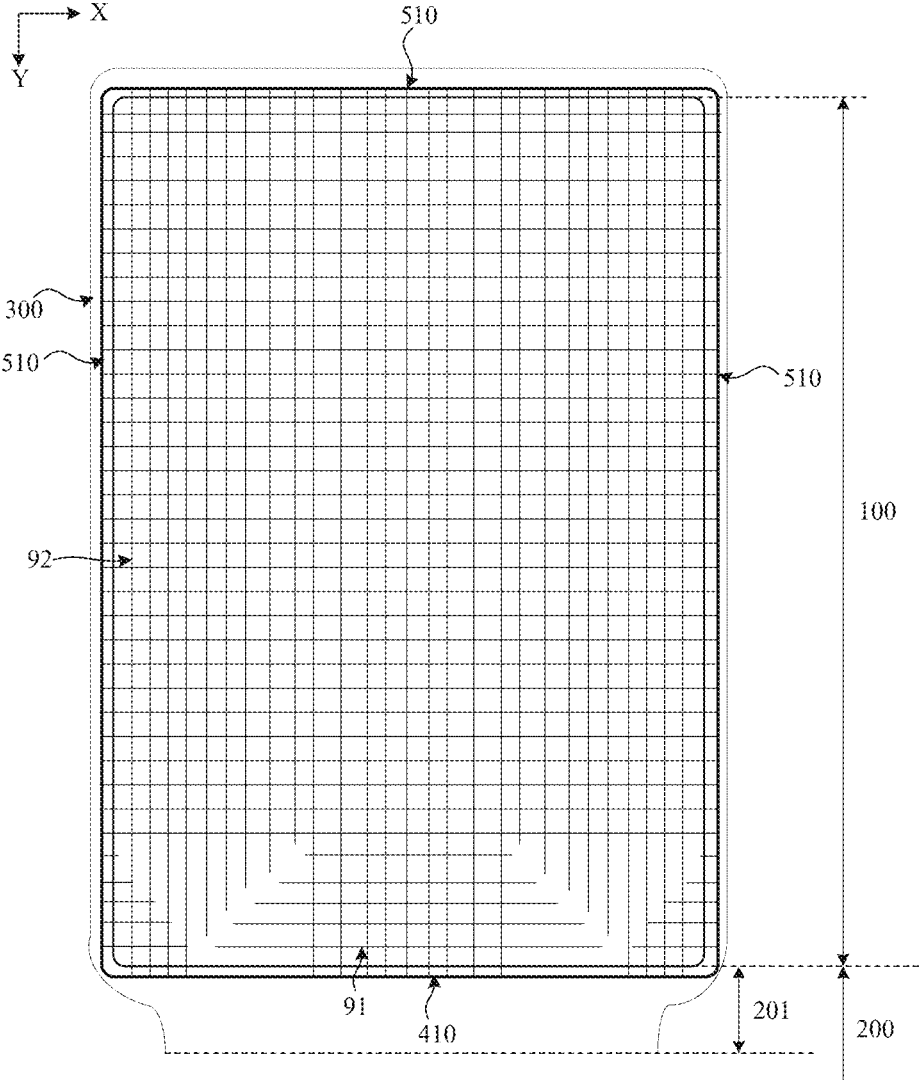
FIG. 8 is a schematic diagram of a planar structure of a compensation trace according to at least one embodiment of the present disclosure.

FIG. 8 is a schematic diagram of a planar structure of a compensation trace according to at least one embodiment of the present disclosure. In some examples, as shown in FIG. 8, a second power supply line may include a bonding power supply lead 410 located in a bonding region 200 and a bezel power supply lead 510 located in a bezel region 300. The bonding power supply lead 410 of the bonding region 200 and the bezel power supply lead 510 of the bezel region 300 may be of an integral structure connected with each other. In some examples, an end or both ends of at least one first compensation trace 91 in a first direction X may be connected with the bezel power supply lead 510. An end of at least one second compensation trace 92 in an opposite direction of a second direction Y may be connected with the bezel power supply lead 510. In some examples, an end of at least one second compensation trace 92 in the second direction Y may be connected with the bezel power supply lead 510. In other examples, an end of at least one second compensation trace 92 in the second direction Y may be connected with the bonding power supply lead 410, and an end in the opposite direction of the second direction Y may be connected with of the bezel power supply lead 510. However, this embodiment is not limited thereto.

In some examples, a first compensation trace 91 and a second compensation trace 92 may be disposed in different conductive layers. As shown in FIG. 7B, at least one second compensation trace 92 may be electrically connected with at least one first compensation trace 91 through a third connection hole K3, so that a plurality of second compensation traces 92 and a plurality of first compensation traces 91 may have a same potential. In this example, by disposing compensation traces electrically connected with the second power supply line in a display region, not only a resistance of a second power supply trace may be effectively reduced, and a voltage drop of a low-voltage power supply signal may be effectively reduced, which achieves low power consumption, but also uniformity of power supply signals in a display substrate may be effectively improved, and display uniformity may be effectively improved, which improves display character and display quality.

In some examples, as shown in FIG. 7A, since the data connection lines 70 are disposed in a partial region of the display region 100, and the data connection lines 70 include a first connection line 71 extending along the first direction X and a second connection line 72 extending along the second direction Y, the display region 100 may be divided into a first region 110, a second region 120, and a third region 130 according to presence or absence of a data connection line and an extension direction of a data connection line. Among them, the first region 110 may be a region where the first connection line 71 is disposed (a region of transverse trace of a fan-out line), the second region 120 may be a region where the second connection line 72 is disposed (a region of longitudinal trace of a fan-out line), and the third region 130 may be a region where no first connection line 71 or second connection line 72 is disposed (a normal region). In some examples, a first compensation trace 91 and a second compensation trace 92 may be disposed in the third region 130.

In some examples, the first region 110 may include a plurality of circuit units, and an orthographic projection of the first connection line 71 on a plane of the display substrate may be at least partially overlapped with an orthographic projection of a pixel drive circuit in the plurality of circuit units of the first region 110 on the plane of the display substrate. The second region 120 may include a plurality of circuit units, and an orthographic projection of the second connection line 72 on the plane of the display substrate may be at least partially overlapped with an orthographic projection of a pixel drive circuit in the plurality of circuit units of the second region 120 on the plane of the display substrate. The third region 130 may include a plurality of circuit units, and an orthographic projection of a pixel drive circuit in the plurality of circuit units of the third region 130 on the plane of the display substrate may not be overlapped with an orthographic projection of each of the first connection line 71 and the second connection line 72 on the plane of the display substrate.

In some examples, division of a plurality of regions shown in FIG. 7A is merely an exemplary illustration. Since the first region 110, the second region 120, and the third region 130 are divided according to presence or absence of a data connection line and an extension direction of a data connection line, shapes of the three regions may be regular polygons or irregular polygons, and the display region 100 may be divided into one or more first regions 110, one or more second regions 120, and one or more third regions 130, which is not limited here in the present disclosure.

In some exemplary implementation modes, in a direction perpendicular to the display substrate, the display substrate may include a base substrate, and a drive circuit layer, a light emitting structure layer, and an encapsulation structure layer which are sequentially disposed on the base substrate. The drive circuit layer may include a first conductive layer, a second conductive layer, a third conductive layer, and a fourth conductive layer which are sequentially disposed on the base substrate. In some examples, the third conductive layer at least includes a first connection line, and the fourth conductive layer at least includes a data signal line and a second connection line. The data signal line may be connected with a first end of the first connection line through a first connection hole, and the second connection line may be connected with a second end of the first connection line through a second connection hole.

In some exemplary implementation modes, the drive circuit layer may further include a first insulation layer, a second insulation layer, a third insulation layer, and a fourth insulation layer. The first insulation layer may be disposed between a semiconductor layer and the first conductive layer, the second insulation layer may be disposed between the first conductive layer and the second conductive layer, the third insulation layer may be disposed between the second conductive layer and the third conductive layer, and the fourth insulation layer may be disposed between the third conductive layer and the fourth conductive layer.

Figure 9A:
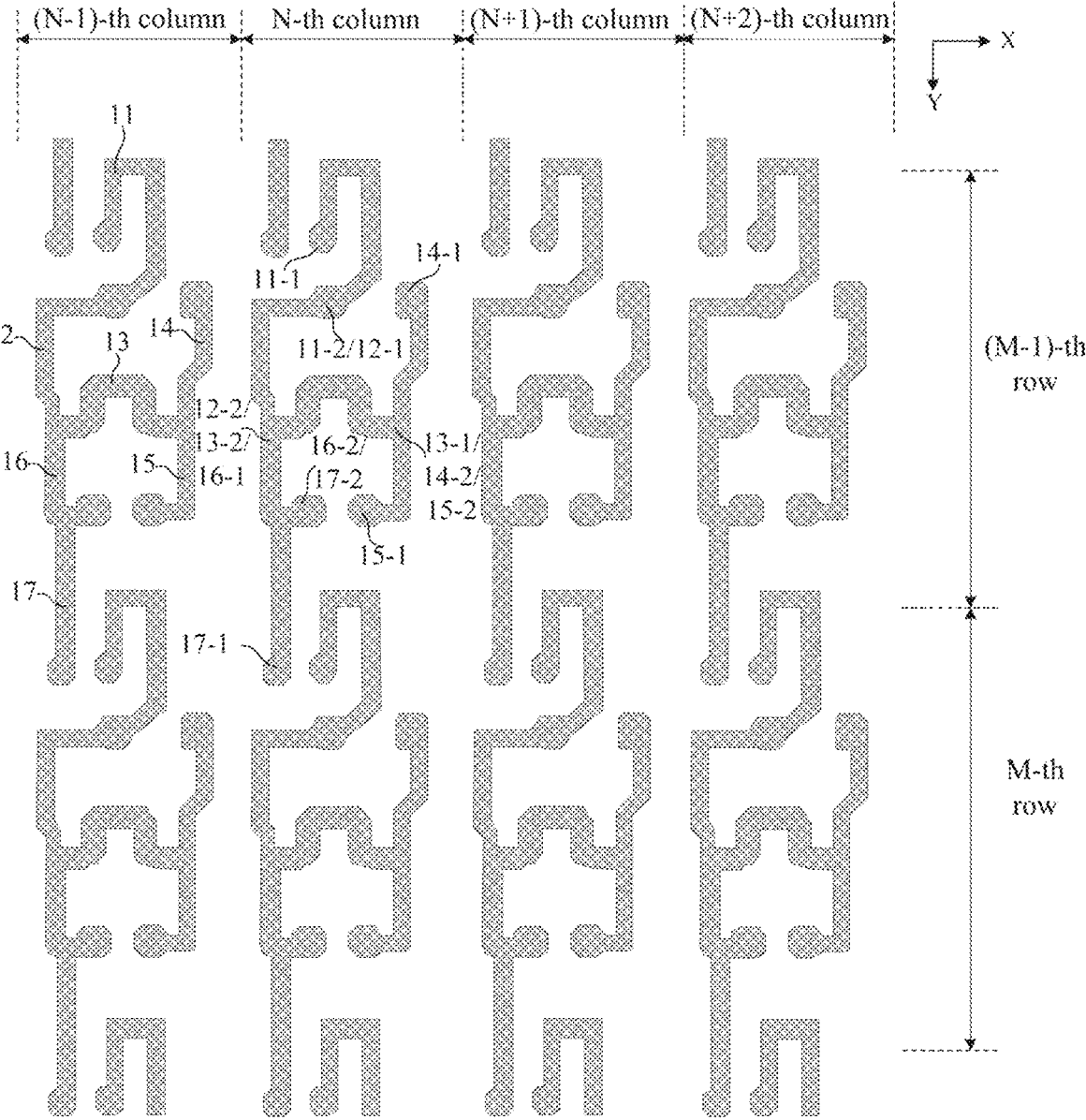
FIG. 9A is a partial enlarged schematic diagram of a display substrate after a semiconductor layer is formed in the region C1 in FIG. 7A.
Figure 9B:
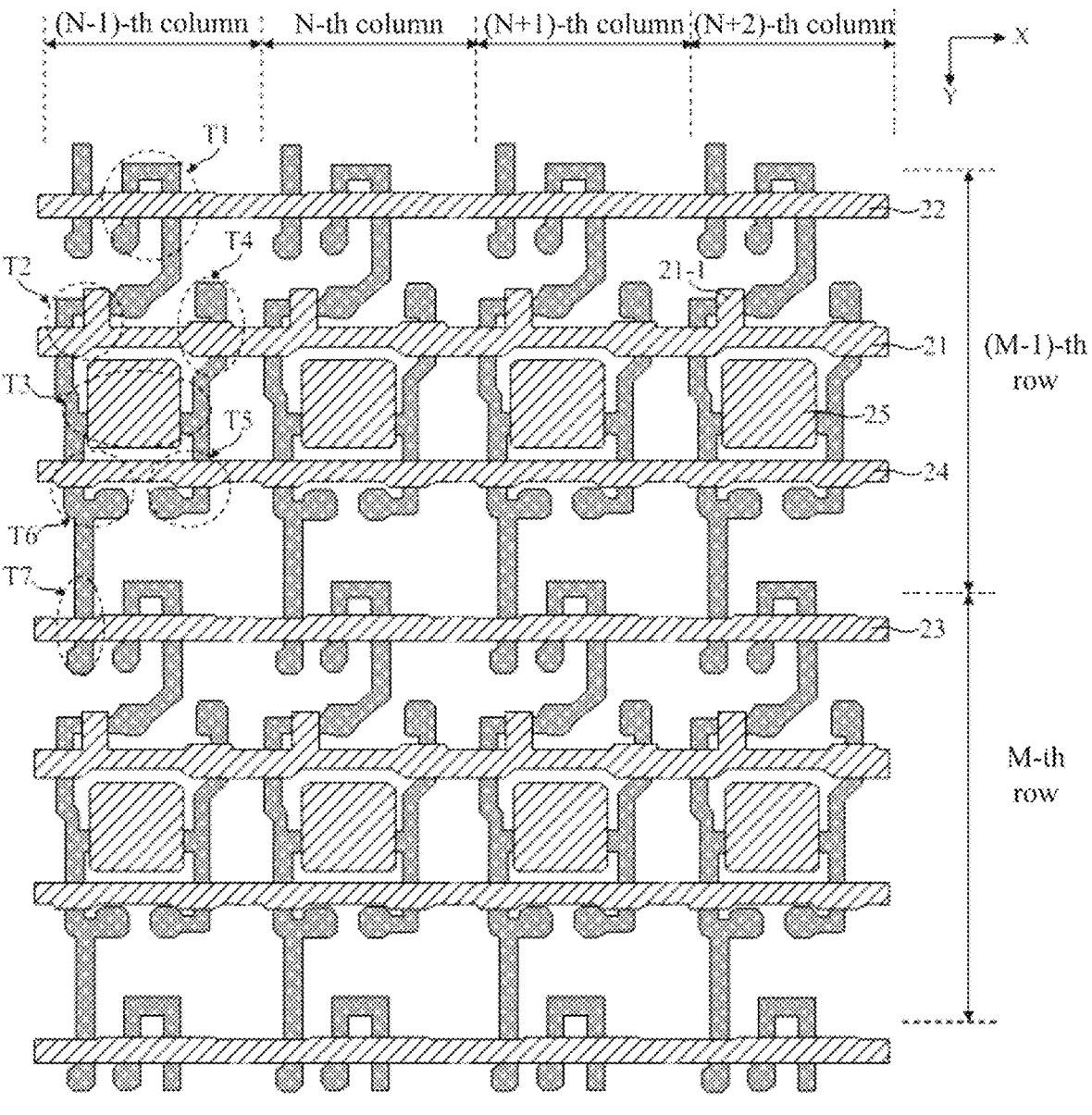
FIG. 9B is a partial enlarged schematic diagram of a display substrate after a first conductive layer is formed in the region C1 in FIG. 7A.
Figure 9C:
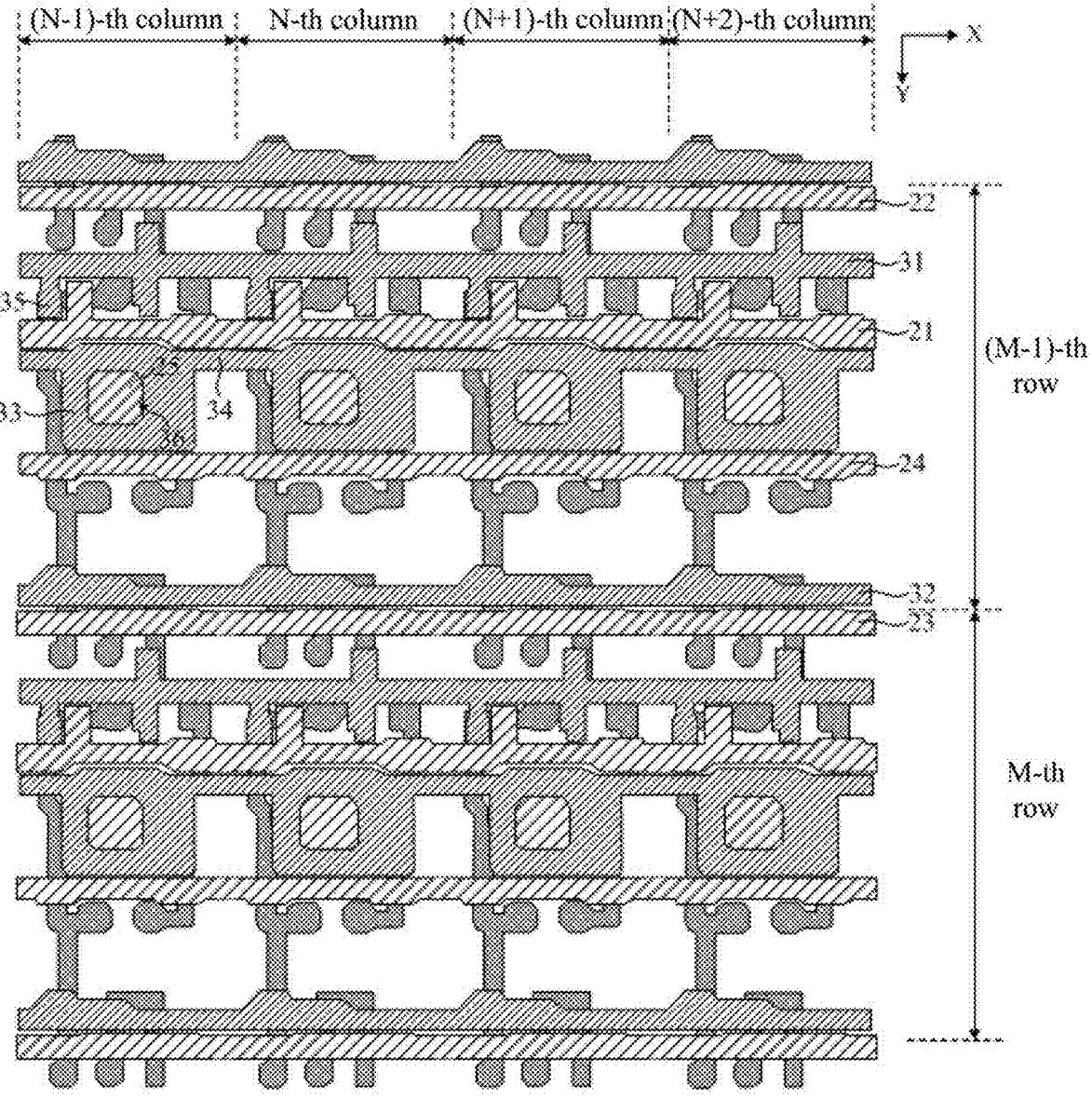
FIG. 9C is a partial enlarged schematic diagram of a display substrate after a second conductive layer is formed in the region C1 in FIG. 7A.
Figure 9D:
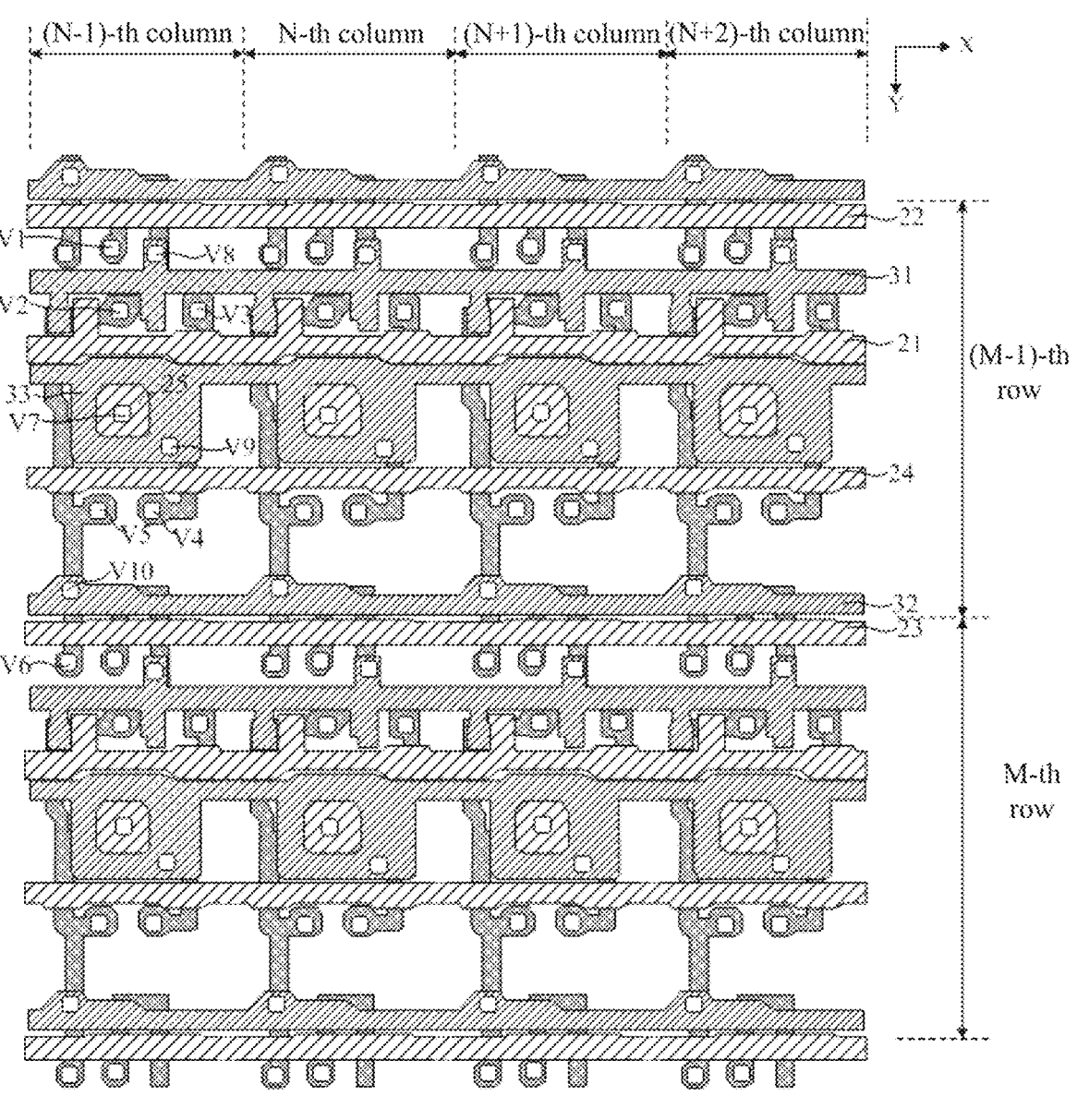
FIG. 9D is a partial enlarged schematic diagram of a display substrate after a third insulation layer is formed in the region C1 in FIG. 7A.
Figure 9E:
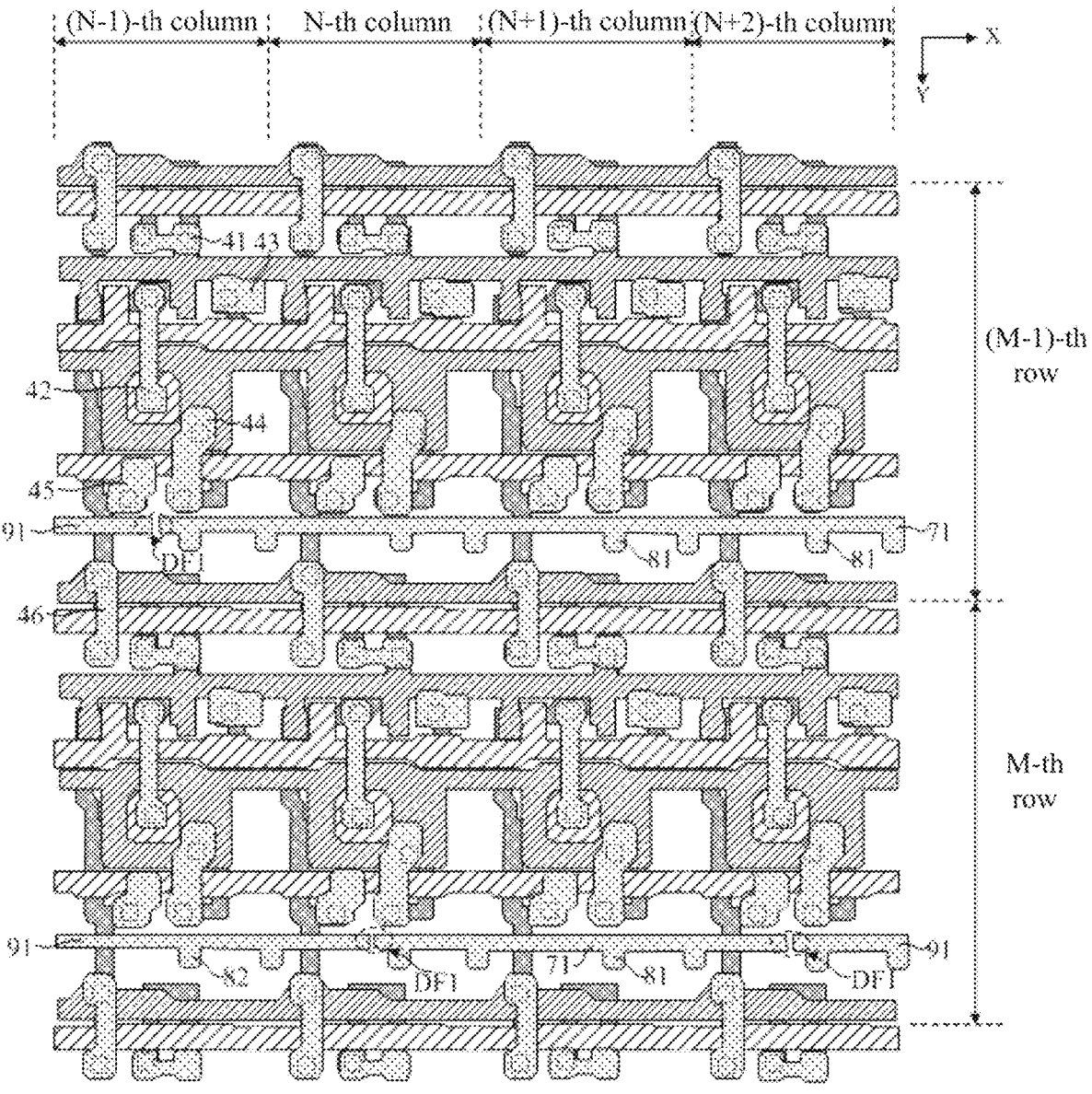
FIG. 9E is a partial enlarged schematic diagram of a display substrate after a third conductive layer is formed in the region C1 in FIG. 7A.
Figure 9F:
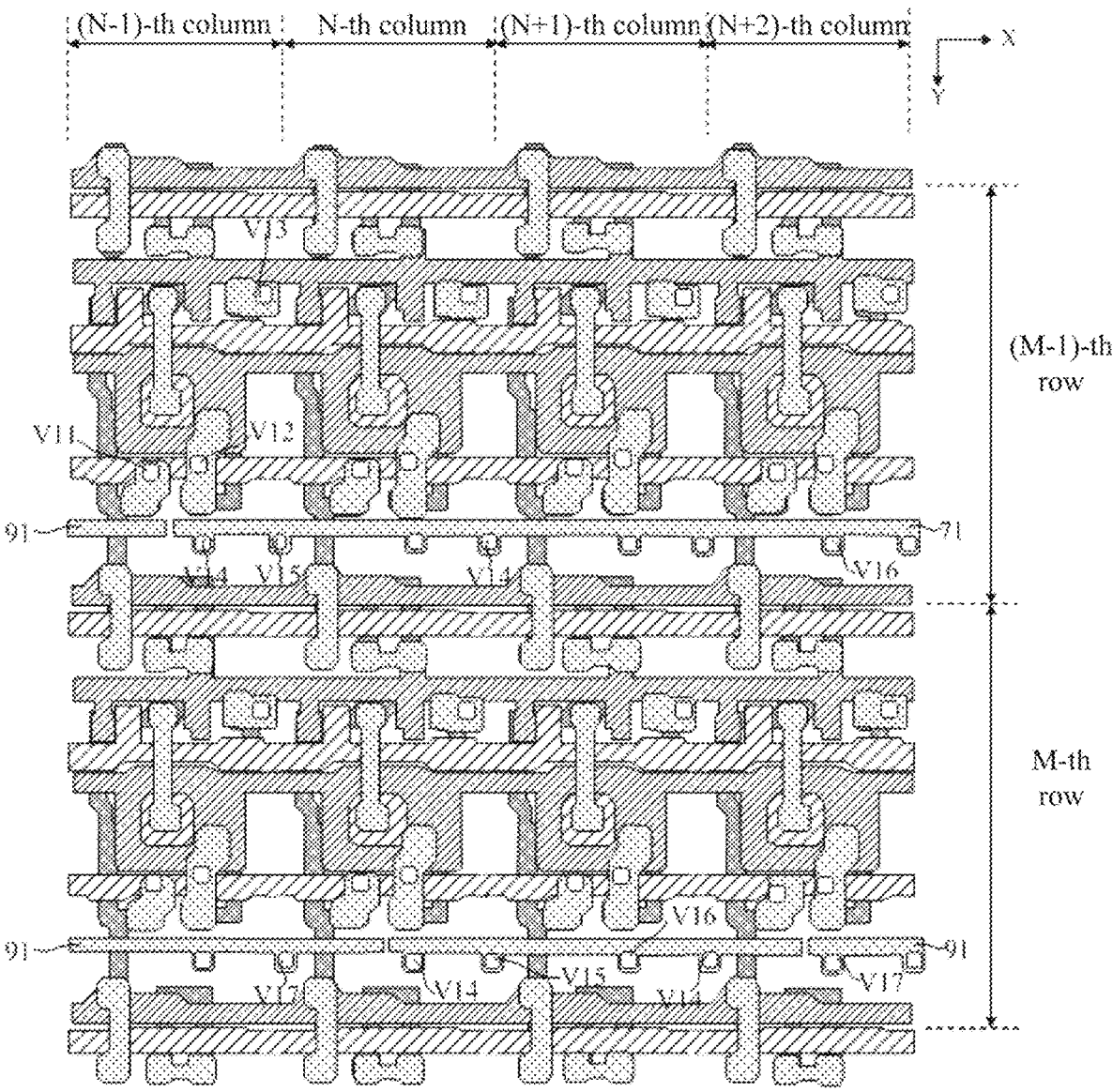
FIG. 9F is a partial enlarged schematic diagram of a display substrate after a fourth insulation layer is formed in the region C1 in FIG. 7A.
Figure 9G:
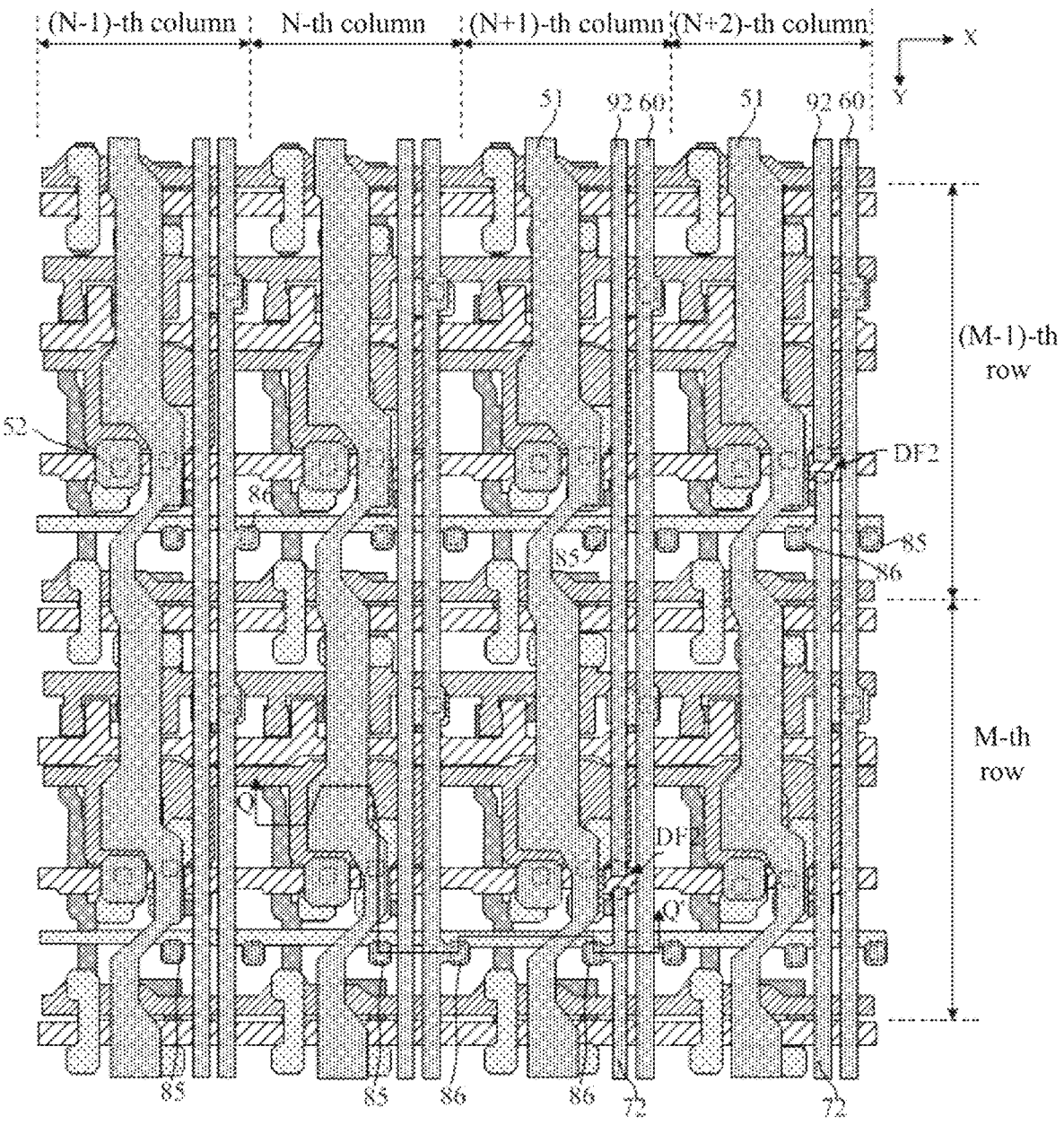
FIG. 9G is a partial enlarged schematic diagram of a display substrate after a fourth conductive layer is formed in the region C1 in FIG. 7A.
Figures 9H, 9I:
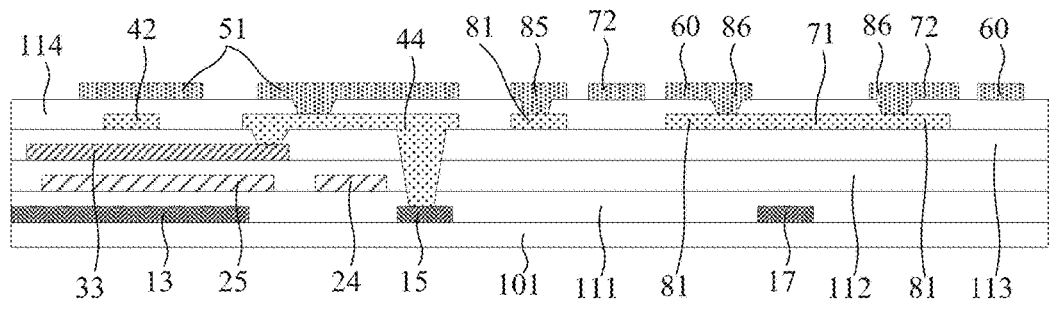
FIG. 9H is a partial enlarged schematic diagram of a third conductive layer and a fourth conductive layer of the region C1 in FIG. 7A.
FIG. 9I is a sectional schematic diagram along a Q-Q' in FIG. 9G.
Figure 10A:
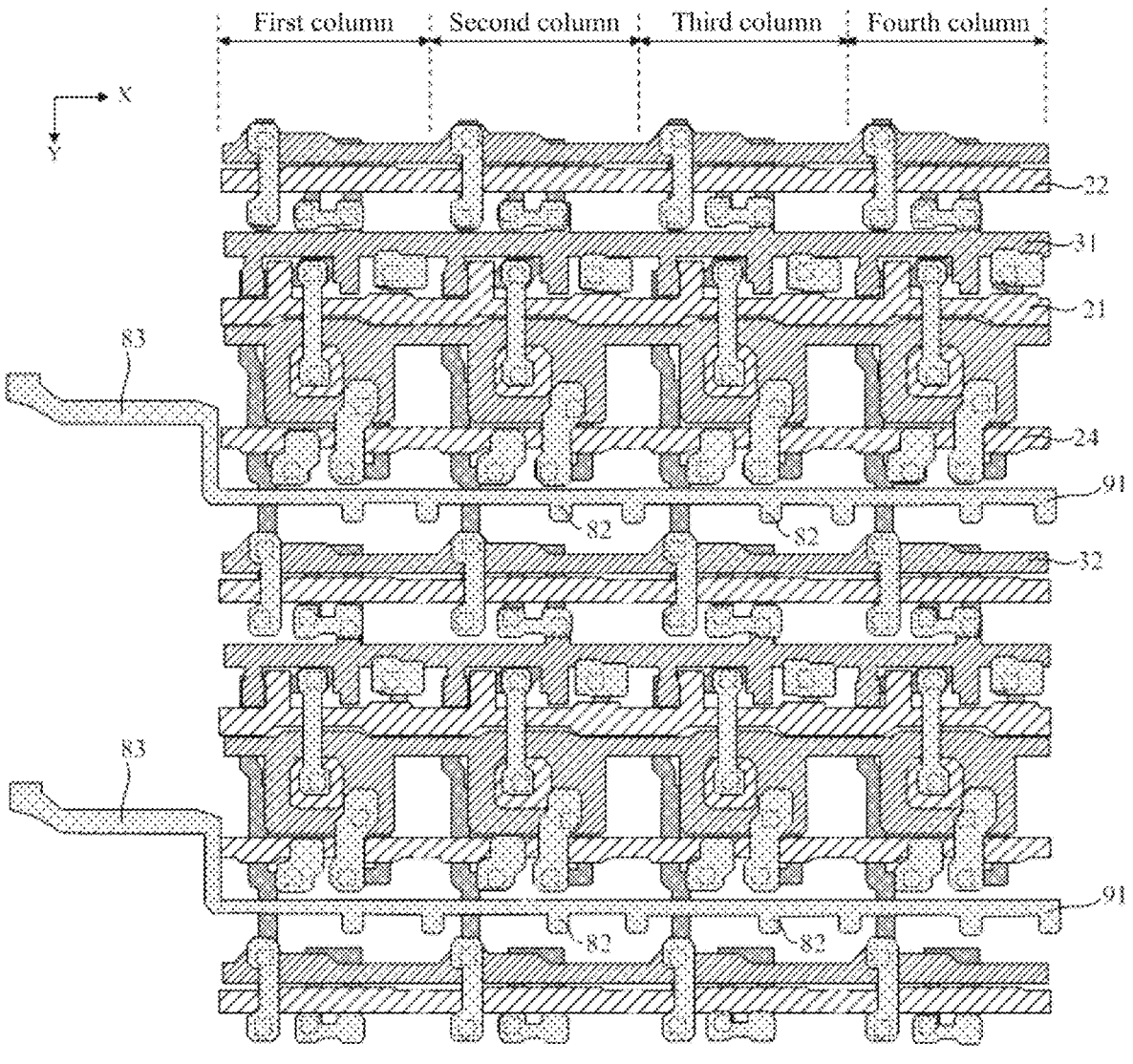
FIG. 10A is a partial enlarged schematic diagram of a display substrate after a third conductive layer is formed in a region C2 in FIG. 7A.
Figure 10B:
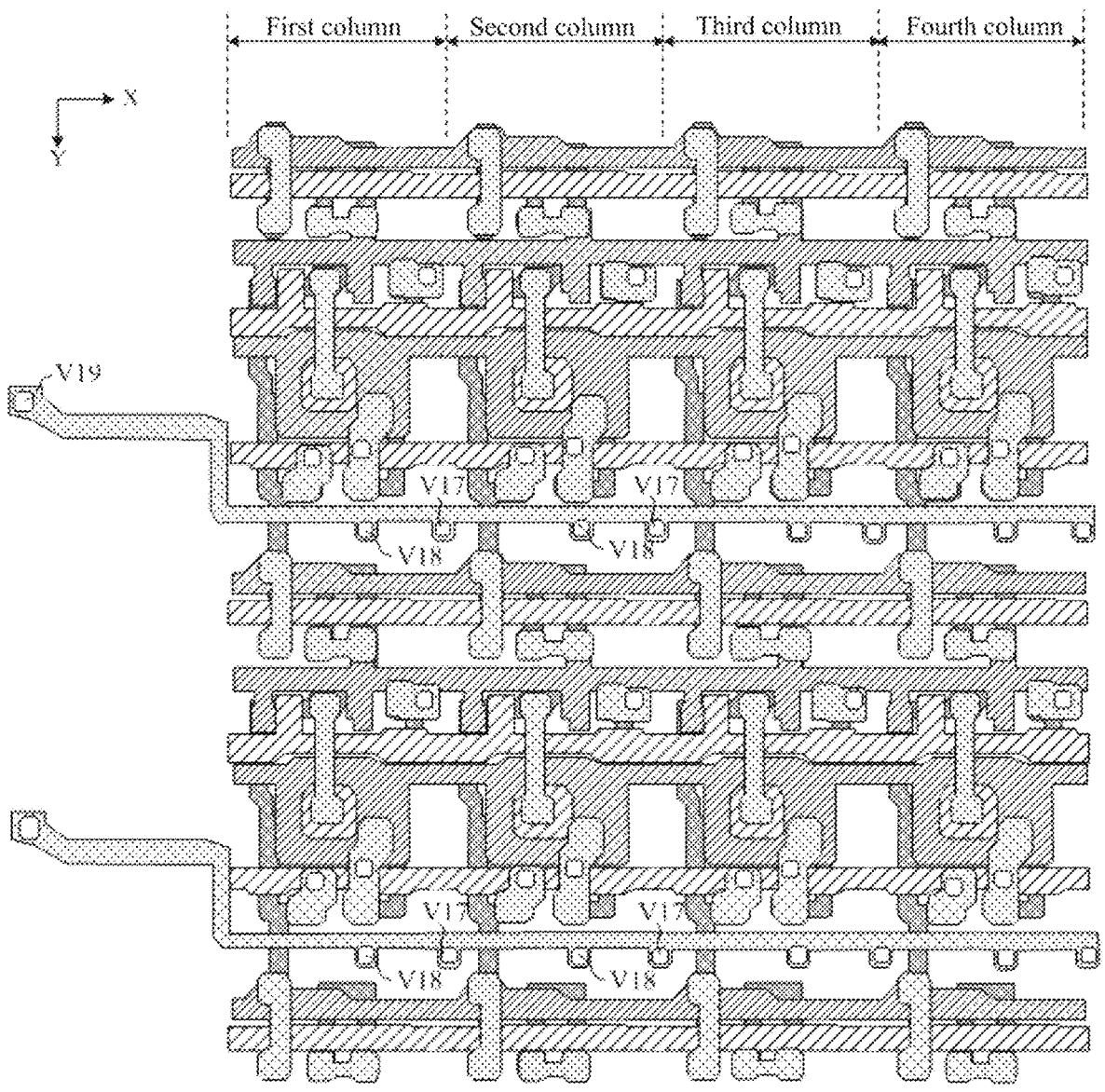
FIG. 10B is a partial enlarged schematic diagram of a display substrate after a fourth insulation layer is formed in the region C2 in FIG. 7A.
Figure 10C:
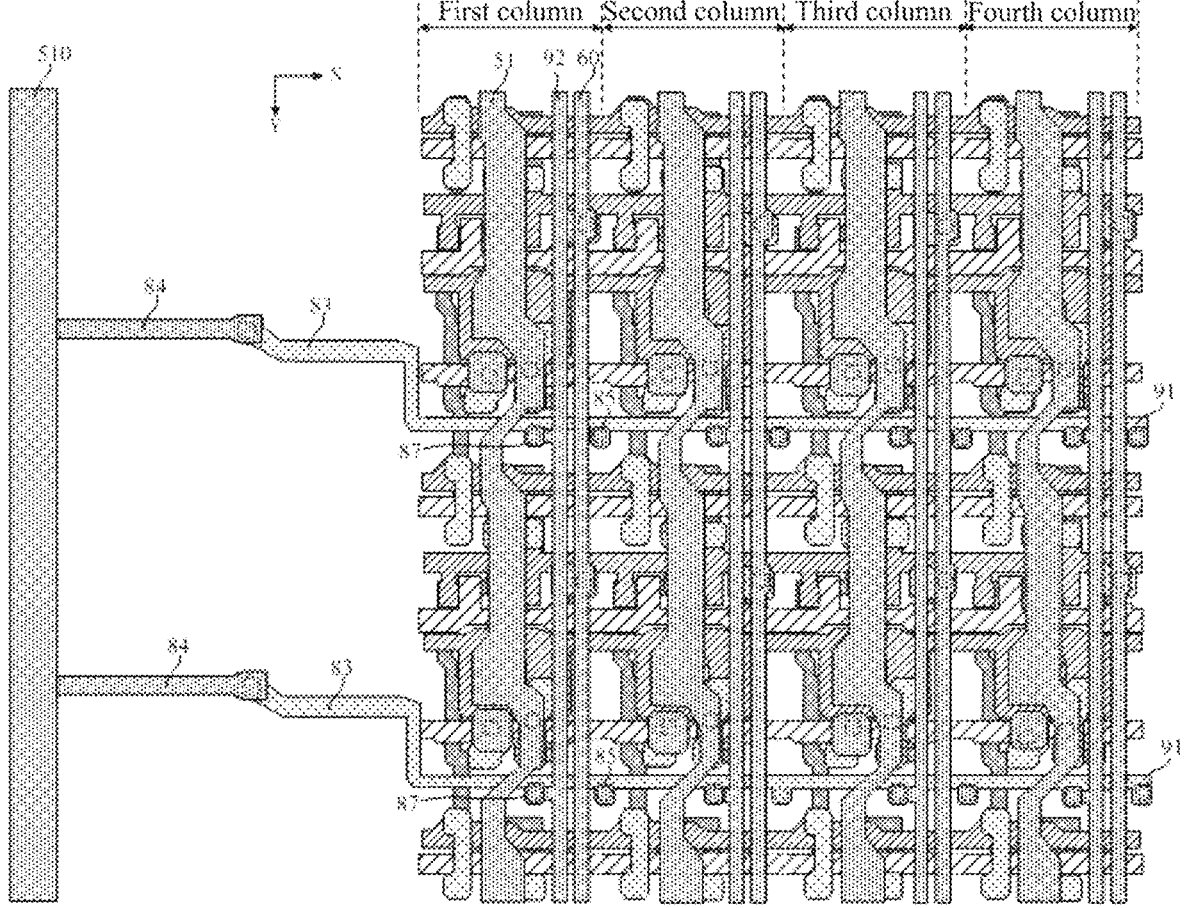
FIG. 10C is a partial enlarged schematic diagram of a display substrate after a fourth conductive layer is formed in the region C2 in FIG. 7A.

Hereinafter, an exemplary description will be given through a preparation process of the display substrate with reference to FIG. 9A to FIG. 10C. Among them, FIG. 9A is a partial enlarged schematic diagram of the display substrate after the semiconductor layer is formed in the region C1 in FIG. 7A. FIG. 9B is a partial enlarged schematic diagram of the display substrate after the first conductive layer is formed in the region C1 in FIG. 7A. FIG. 9C is a partial enlarged schematic diagram of the display substrate after the second conductive layer is formed in the region C1 in FIG. 7A. FIG. 9D is a partial enlarged schematic diagram of the display substrate after the third insulation layer is formed in the region C1 in FIG. 7A. FIG. 9E is a partial enlarged schematic diagram of the display substrate after the third conductive layer is formed in the region C1 in FIG. 7A. FIG. 9F is a partial enlarged schematic diagram of the display substrate after the fourth insulation layer is formed in the region C1 in FIG. 7A. FIG. 9G is a partial enlarged schematic diagram of the display substrate after the fourth conductive layer is formed in the region C1 in FIG. 7A. FIG. 9H is a partial enlarged schematic diagram of the third conductive layer and the fourth conductive layer of the region C1 in FIG. 7A. FIG. 9I is a sectional schematic diagram along a Q-Q' in FIG. 9G. In FIG. 9A to FIG. 9H, circuit units of two unit rows (e.g., an (M−1)-th row and an M-th row) and four unit columns (e.g., an (N−1)-th column to an (N+2)-th column) in the region C1 are taken as an example for illustration. FIG. 10A is a partial enlarged schematic diagram of the display substrate after the third conductive layer is formed in a region C2 in FIG. 7A. FIG. 10B is a partial enlarged schematic diagram of the display substrate after the fourth insulation layer is formed in the region C2 in FIG. 7A. FIG. 10C is a partial enlarged schematic diagram of the display substrate after the fourth conductive layer is formed in the region C2 in FIG. 7A. In FIG. 10A to FIG. 10C, circuit units of two unit rows and two unit columns (e.g., a first column to a fourth column) in the region C2 are taken as an example for illustration.

A "patterning process" mentioned in the present disclosure includes coating with a photoresist, mask exposure, development, etching, photoresist stripping, and other treatments for a metal material, an inorganic material, or a transparent conductive material, and includes coating with an organic material, mask exposure, development, and other treatments for an organic material. Deposition may be any one or more of sputtering, evaporation, and chemical vapor deposition. Coating may be any one or more of spray coating, spin coating, and inkjet printing. Etching may be any one or more of dry etching and wet etching, which is not limited in present disclosure. A "thin film" refers to a layer of thin film made of a material on a base substrate through a process such as deposition and coating. If the "thin film" does not need a patterning process in an entire manufacturing process, the "thin film" may also be called a "layer". If the "thin film" needs a patterning process in an entire manufacturing process, it is called a "thin film" before the patterning process, and called a "layer" after the patterning process. The "layer" after the patterning process includes at least one "pattern". "A and B being disposed in a same layer" mentioned in the present disclosure means that A and B are formed simultaneously through a same patterning process, and a "thickness" of a film layer is a dimension of the film layer in a direction perpendicular to the display substrate. In an exemplary embodiment of the present disclosure, "an orthographic projection of B is within a range of an orthographic projection of A" or "an orthographic projection of A contains an orthographic projection of B" refers to that a boundary of the orthographic projection of B falls within a range of a boundary of the orthographic projection of A, or a boundary of the orthographic projection of A is overlapped with a boundary of the orthographic projection of B.

In some exemplary implementation modes, the preparation process of the display substrate may include following operations.

(1) A pattern of a semiconductor layer is formed. In some exemplary implementation modes, a semiconductor thin film is deposited on a base substrate, and the semiconductor thin film is patterned through a patterning process to form a semiconductor layer disposed on the base substrate, as shown in FIG. 9A. In some examples, the semiconductor layer of each circuit unit in a display region 100 may at least include a first active layer 11 of a first transistor T1 to a seventh active layer 17 of a seventh transistor T7. The first active layer 11 to the seventh active layer 17 may be of an integral structure connected with each other. The first active layer 11, the second active layer 12, and the fourth active layer 14 may be located on one side of the third active layer 13 of a present circuit unit in a second direction Y, and the fifth active layer 15, the sixth active layer 16, and the seventh active layer 17 may be located on the other side of the third active layer 13 of the present circuit unit in the second direction Y.

In some examples, as show in FIG. 9, the first active layer 11 may be in an "n" shape, the second active layer 12 and the fifth active layer 15 may be in an "L" shape, the third active layer 13 may be in a "Ω" shape, the fourth active layer 14, the sixth active layer 16, and the seventh active layer 17 may be in an "I" shape. However, this embodiment is not limited thereto.

In some examples, an active layer of each transistor may include a first region, a second region, and a channel region located between the first region and the second region. In an examples, a first region 11-1 of the first active layer 11, a first region 14-1 of the fourth active layer 14, a first region 15-1 of the fifth active layer 15, and a first region 17-1 of the seventh active layer 17 may be separately disposed. A second region 11-2 of the first active layer 11 may serve as a first region 12-1 of the second active layer 12; a first region 13-1 of the third active layer 13 may simultaneously serve as a second region 14-2 of the fourth active layer 14 and a second region 15-2 of the fifth active layer 15; a second region 13-2 of the third active layer 13 may simultaneously serve as a second region 12-2 of the second active layer 12 and a first region 16-1 of the sixth active layer 16; a second region 16-2 of the sixth active layer 16 may serve as a second region 17-2 of the seventh active layer 17.

In some examples, a lead region of a bonding region may not be provided with a semiconductor layer.

(2) A first conductive layer is formed. In some exemplary implementation modes, a first insulation thin film and a first conductive thin film are sequentially deposited on the base substrate where the aforementioned pattern is formed, and the first conductive thin film is patterned through a patterning process to form a first insulation layer 111 covering the semiconductor layer and the first conductive layer disposed on the first insulation layer 111, as shown in FIG. 9B. In some examples, the first conductive layer may be referred to as a first gate metal (GATE1) layer.

In some examples, as shown in FIG. 9B, the first conductive layer of each circuit unit in the display region at least includes a first scan signal line 21, a second scan signal line 22, a light emitting control line 24, and a first electrode plate 25 of a storage capacitor. Among them, a third scan signal line 23 which is electrically connected with a pixel drive circuit of one unit row is a second scan signal line 22 which is electrically connected with a pixel drive circuit of a next unit row.

In some examples, the first electrode plate 25 of the storage capacitor may be in a rectangular shape, corners of which may be provided with chamfers, and there is an overlapping region between an orthographic projection of the first electrode plate 25 on the base substrate and an orthographic projection of the third active layer 13 of the third transistor T3 on the base substrate. In this example, the first electrode plate 25 may serve as an electrode plate of the storage capacitor and a gate electrode of the third transistor T3 simultaneously.

In some examples, the first scan signal line 21, the second scan signal line 22, the third scan signal line 23, and the light emitting control line 24 may be in a line shape of which a main body portion extends along a first direction X. The first scan signal line 21 and the second scan signal line 22 may be located on a side of the first electrode plate 25 of the present circuit unit in an opposite direction of the second direction Y, the second scan signal line 22 may be located on a side of the first scan signal line 21 of the present circuit unit away from the first electrode plate 25, the third scan signal line 23 and the light emitting control line 24 may be located on a side of the first electrode plate 25 of the present circuit unit in the second direction Y, and the third scan signal line 23 may be located on a side of the light emitting control line 24 of the present circuit unit away from the first electrode plate 25.

In some examples, the first scan signal line 21 may be provided with a gate block 21-1 protruding toward a side of the second scan signal line 22, and a region where the first scan signal line 21 and the gate block 21-1 are overlapped with the second active layer 12 may serve as a gate electrode of the second transistor T2, forming the second transistor T2 with a double-gate structure. A region where the first scan signal line 21 is overlapped with the fourth active layer 14 may serve as a gate electrode of the fourth transistor T4. A region where the second scan signal line 22 is overlapped with the first active layer 11 may serve as a gate electrode of the first transistor T1 with a double-gate structure. A region where the third scan signal line 23 is overlapped with the seventh active layer 17 may serve as a gate electrode of the seventh transistor T7. A region where the light emitting control line 24 is overlapped with the fifth active layer 15 may serve as a gate electrode of the fifth transistor T5, and a region where the light emitting control line 24 is overlapped with the sixth active layer 16 may serve as a gate electrode of the sixth transistor T6.

In some examples, the first scan signal line 21 and the third scan signal line 23 may be connected with a same signal source, that is, output signals of the first scan signal line 21 and the third scan signal line 23 are the same.

In some examples, after the first conductive layer is formed, the semiconductor layer may be subjected to a conductive treatment by using the first conductive layer as a shield. The semiconductor layer in a region, which is shielded by the first conductive layer, forms channel regions of the first transistor T1 to the seventh transistor T7, and the semiconductor layer in a region, which is not shielded by the first conductive layer, is made to be conductive, that is, first regions and second regions of the first active layer 11 to the seventh active layer 17 are all made to be conductive.

(3) A second conductive layer is formed. In some exemplary implementation modes, a second insulation thin film and a second conductive thin film are sequentially deposited on the base substrate where the aforementioned pattern is formed, and the second conductive thin film is patterned by using a patterning process to form a second insulation layer 112 covering the first conductive layer and the second conductive layer disposed on the second insulation layer, as shown in FIG. 9C. In some examples, the second conductive layer may be referred to as a second gate metal (GATE2) layer.

In some examples, as shown in FIG. 9C, the second conductive layer of each circuit unit in the display region at least includes a first initial signal line 31, a second initial signal line 32, a second electrode plate 33 of the storage capacitor Cst, an electrode plate connection line 34, and a shield electrode 35.

In some examples, the first initial signal line 31 and the second initial signal line 32 may be in a line shape of which a main body portion may extend along the first direction X. The first initial signal line 31 may be located between the first scan signal line 21 and the second scan signal line 22 of the present circuit unit, and the second initial signal line 32 may be located on a side of the third scan signal line 23 of the present circuit unit close to the light emitting control line 24.

In some examples, a contour shape of the second electrode plate 33 may be a rectangular shape, corners of which may be provided with chamfers, and there is an overlapping region between an orthographic projection of the second electrode plate 33 on the base substrate and an orthographic projection of the first electrode plate 25 on the base substrate. The second electrode plate 33 serves as another electrode plate of the storage capacitor and is located between the first scan signal line 21 and the light emitting control line 24 of the present circuit unit, and the first electrode plate 25 and the second electrode plate 33 constitute a storage capacitor of a pixel drive circuit.

In some examples, the electrode plate connection line 34 may be disposed on a side of the second electrode plate 33 in the first direction X or an opposite direction of the first direction X, a first end of the electrode plate connection line 34 is connected with the second electrode plate 33 of the present circuit unit, and a second end of the electrode plate connection line 34 is connected with a second electrode plate 33 of an adjacent circuit unit after extending along the first direction X or the opposite direction of the first direction X, so that second electrode plates 33 of adjacent circuit units in one unit row are connected with each other. In some examples, second electrode plates of a plurality of circuit units in one unit row may form an integral structure connected with each other through an electrode plate connection line. The second electrode plates with the integral structure may be multiplexed as power supply signal connection lines, which ensures that a plurality of second electrode plates in one unit row have a same potential, which is beneficial to improve uniformity of a panel, avoiding poor display of the display substrate, and ensuring a display effect of the display substrate.

In some examples, the second electrode plate 33 is provided with an opening 36, the opening 36 may be located in a middle of the second electrode plate 33, and a shape of the opening 36 may be a rectangle, so that the second electrode plate 33 forms an annular structure. The opening 36 exposes the second insulation layer 112 covering the first electrode plate 25, and an orthographic projection of the first electrode plate 25 on the base substrate contains an orthographic projection of the opening 36 on the base substrate. In some examples, the opening 36 is configured to accommodate a seventh via subsequently formed, the seventh via may be located in the opening 36 and exposes the first electrode plate 25, so that a second electrode of the first transistor T1 subsequently formed is connected with the first electrode plate 25.

In some examples, the shield electrode 35 may be located on a side of the first initial signal line 31 close to the first scan signal line 21, and is connected with the first initial signal line 31. The shield electrode 35 and the first initial signal line 31 may be of an integral structure. An orthographic projection of the shield electrode 35 on the base substrate is at least partially overlapped with an orthographic projection of the first region 12-1 of the second active layer 12 on the base substrate. The shield electrode 35 may be configured to shield an influence of data voltage jump on a key node, avoid an influence of data voltage jump from on a potential of a key node of a pixel drive circuit, and improve a display effect.

(4) A third insulation layer is formed. In some exemplary implementation modes, a third insulation thin film is deposited on the base substrate on which the aforementioned patterns are formed, and the third insulation thin film is patterned by using a patterning process to form a third insulation layer 113 covering the second conductive layer, as shown in FIG. 9D. In some examples, a plurality of vias may be disposed in a single circuit unit. For example, a plurality of vias of each circuit unit in the display region may at least include a first via V1 to a tenth via V10. Among them, the third insulation layer 113, the second insulation layer 112, and the first insulation layer 111 within the first via V1 to the sixth via V6 are removed to expose a surface of the semi-conductor layer. The third insulation layer 113 and the second insulation layer 112 within the seventh via V7 are etched away to expose a surface of the first electrode plate 25 of the storage capacitor located in the first conductive layer. The third insulation layer 113 within the eighth via V8 to the tenth via V10 is removed to expose a surface of the second conductive layer.

(5) A third conductive layer is formed. In some exemplary implementation modes, a third conductive thin film is deposited on the base substrate where the aforementioned patterns are formed, and the third conductive thin film is patterned by using a patterning process to form a third conductive layer disposed on the third insulation layer 113, as shown in FIG. 9E and FIG. 10A. In some examples, the third conductive layer may be referred to as a first source-drain metal (SD1) layer.

In some examples, as shown in FIG. 9E, the third conductive layer of the plurality of circuit units in the display region may each include a first connection electrode 41, a second connection electrode 42, a third connection electrode 43, a fourth connection electrode 44, a fifth connection electrode 45, and a sixth connection electrode 46.

In some examples, one end of the first connection electrode 41 may be connected with a first region 11-1 of the first active layer 11 through the first via V1, and the other end of the first connection electrode 41 may be connected with a first initial signal line 31 through the eighth via V8. One end of the second connection electrode 42 may be connected with a second region 11-2 of the first active layer 11 through the second via V2, and the other end may be connected with the first electrode plate 25 through the seventh via V7. The third connection electrode 43 may be connected with a first region 14-1 of the fourth active layer 14 through the third via V3. One end of the fourth connection electrode 44 may be connected with a first region 15-1 of the fifth active layer 15 through the fourth via V4, and the other end may be connected with the second electrode plate 33 through the ninth via V9. The fifth connection electrode 45 may be connected with a second region 16-2 of the sixth active layer 16 through the fifth via V5. One end of the sixth connection electrode 46 may be connected with a first region 17-1 of the seventh active layer 17 through the sixth via V6, and the other end may be connected with a second initial signal line 32 through the tenth via V10.

In some examples, as shown in FIG. 9E, the third conductive layer of a first region of the display region may further include a plurality of first connection lines 71 and a plurality of first data connection electrodes 81. As shown in FIG. 9E and FIG. 10A, the third conductive layer of a third region of the display region may further include a plurality of first compensation traces 91 and a plurality of first compensation connection electrodes 82. As shown in FIG. 10A, the third conductive layer of a bezel region may include a plurality of first compensation connection lines 83.

In some examples, as shown in FIG. 9E, a shape of the first connection line 71 may be a line shape of which a main body portion extends along the first direction X. In at least one circuit unit of the first region, at least one first data connection electrode 81 may be disposed on a side of the first connection line 71 in the second direction Y. For example, in one circuit unit of the first region, two first data connection electrodes 81 may be located on a same side of the first connection line 71 in the second direction Y. The first connection line 71 is electrically connected with a plurality of first data connection electrodes 81, for example, may be of an integral structure. In some examples, an orthographic projection of the first connection line 71 on the base substrate may be located between orthographic projections of a light emitting control line 24 and a second initial signal line 32, on the base substrate, that are electrically connected in a unit row. Orthographic projections of the first connection line 71 and the plurality of first data connection electrodes 81 on the base substrate may not be overlapped with orthographic projections of the light emitting control line 24 and the second initial signal line 32 on the base substrate.

In some examples, as shown in FIG. 9E and FIG. 10A, a shape of a first compensation trace 91 may be a line shape of which a main body portion extends along the first direction X. In at least one circuit unit of the third region, at least one first compensation connection electrode 82 may be disposed on a side of the first compensation trace 91 in the second direction Y. For example, in one circuit unit of the third region, two first compensation connection electrodes 82 may be located on a same side of a first compensation trace 91 in the second direction Y. The first compensation trace 91 is electrically connected with a plurality of first compensation connection electrodes 82, for example, may be of an integral structure. In some examples, an orthographic projection of a first compensation trace 91 on the base substrate may be located between orthographic projections of a light emitting control line 24 and a second initial signal line 32, on the base substrate, that are electrically connected in a unit row. Orthographic projections of the first compensation trace 91 and the plurality of first compensation connection electrodes 82 on the base substrate may not be overlapped with orthographic projections of the light emitting control line 24 and the second initial signal line 32 on the base substrate. A plurality of data connection electrodes 81 and a plurality of first compensation connection electrodes 82 located in a same unit row may be sequentially arranged along the first direction X. In some examples, shapes and sizes of the plurality of first compensation connection electrodes 82 and the plurality of data connection electrodes 81 may be the same.

In some examples, as shown in FIG. 9E, a first fracture DF1 is disposed between a first compensation trace 91 and a first connection line 71 located in a same unit row and aligned in the first direction X. The first fracture DF1 cuts off the first connection line 71 and the first compensation trace 91 in the same unit row. For example, two opposite sides of the first connection line 71 in the first direction X are both adjacent to first fractures DF1, wherein one first fracture DF1 is a first connection line 71 on a side of the first direction X and is a first compensation trace 91 on a side of an opposite direction of the first direction X, and the other first fracture DF1 is a first compensation trace 91 on the side of the first direction X and is a first compensation trace 91 on the side of the opposite direction of the first direction X.

In some examples, as shown in FIG. 10A, one end of at least one first compensation trace 91 may extend to the bezel region and be electrically connected with a first compensation connection line 83 within the bezel region. For example, the first compensation trace 91 and the first compensation connection line 83 may be of an integral structure. For example, the first compensation connection line 83 may first extend along an opposite direction of the second direction Y, and then extend along the first direction X or the opposite direction of the first direction X.

(6) A fourth insulation layer is formed. In some exemplary implementation modes, a first planarization thin film is coated on the base substrate where the aforementioned patterns are formed, and the first planarization thin film is patterned by using a patterning process to form a fourth planarization layer 114, as shown in FIG. 9F and FIG. 10B. In this example, the fourth insulation layer 114 may also be referred to as a first planarization layer. The fourth insulation layer 114 is provided with a plurality of vias. In some examples, as shown in FIG. 9F, a plurality of vias of each circuit unit in the display region may each include an eleventh via V11 to a thirteenth via V13. The fourth insulation layer 114 within the eleventh via V11 to the thirteenth via V13 is removed to expose a surface of the third conductive layer. As shown in FIG. 9F, the plurality of circuit units in the first region and the plurality of circuit units in the second region may further include a fourteenth via V14 to a sixteenth via V16. The fourth insulation layer 114 within the fourteenth via V14 to the sixteenth via V16 may be removed to expose a surface of a first data connection electrode 81 of the third conductive layer. As shown in FIG. 9F and FIG. 10B, the plurality of circuit units in the third region may further include a seventeenth via V17 and an eighteenth via V18. The fourth insulation layer 114 within the seventeenth via V17 to the eighteen via V18 is removed to expose a surface of a first compensation connection electrode 82 of the third conductive layer. As shown in FIG. 10B, the bezel region may further include a nineteenth via V19. The fourth insulation layer 114 within the nineteenth via V19 is removed to expose a surface of a first compensation connection line 83.

(7) A fourth conductive layer is formed. In some exemplary implementation modes, a fourth conductive thin film is deposited on the base substrate where the aforementioned patterns are formed, and the fourth conductive thin film is patterned by using a patterning process to form a fourth conductive layer disposed on the fourth insulation layer 114, as shown in FIG. 9G and FIG. 10C. In some examples, the fourth conductive layer may be referred to as a second source-drain metal (SD2) layer.

In some examples, as shown in FIG. 9G, the fourth conductive layer of a plurality of circuit units in the display region may each include a first power supply line 51, an anode connection electrode 52, and a data signal line 60.

In some examples, as shown in FIG. 9G, a shape of the first power supply line 51 may be a polygonal line shape of which a main body portion extends along the second direction Y. The first power supply line 51 may be electrically connected with a fourth connection electrode 44 through the twelfth via V12 in the display region, and since the fourth connection electrode 44 may be connected with the second electrode plate 33 of the storage capacitor and the first region 15-1 of the fifth active layer 15, respectively, through a via, it is achieved that the first power supply line 51 writes a power supply signal to a first electrode of the fifth transistor T5, and the second electrode plate 33 of the storage capacitor has a same potential as the first power supply line 51. The first power supply line 51 may also extend to a lead region and be electrically connected with a high-voltage lead of the lead region, so as to achieve continuous reception of high-level signals.

In some examples, as shown in FIG. 9G and FIG. 10C, an orthographic projection of the first power supply line 51 on the base substrate may be at least partially overlapped with an orthographic projection of the second connection electrode 42 on the base substrate, the first power supply line 51 may effectively shield an influence of data voltage jump on a key node in a pixel drive circuit, which avoids an influence of the data voltage jump on a potential of the key node in the pixel drive circuit, and improves a display effect.

In some examples, as shown in FIG. 9G and FIG. 10C, the first power supply line 51 may be designed with unequal widths, and the first power supply lines 51 with an unequal width design may not only facilitate a layout of a pixel structure, but also reduce a parasitic capacitance between a first power supply line and a data signal line.

In some examples, as shown in FIG. 9G and FIG. 10C, a shape of the anode connection electrode 52 may be a rectangular shape. The anode connection electrode 52 may be electrically connected with the fifth connection electrode 45 through the eleventh via V11. In some examples, the anode connection electrode 52 may be configured to be connected with an anode formed subsequently, and since the fifth connection electrode 45 may be connected with the second region 16-2 of the sixth active layer 16 through a via, it is achieved that the anode is electrically connected with a second electrode of the sixth transistor T6 through the anode connection electrode 52 and the fifth connection electrode 45.

In some examples, as shown in FIG. 9G and FIG. 10C, a shape of the data signal line 60 may be a straight line shape of which a main body portion extends along the second direction Y. The data signal line 60 may be electrically connected with the third connection electrode 43 through the thirteenth via V13. Since the third connection electrode 43 may be connected with the first region 14-1 of the fourth active layer 14 through a via, it is achieved that the data signal line 60 writes a data signal to a first electrode of the fourth transistor T4. One data signal line 60 may be configured to provide a data signal to a plurality of pixel drive circuits of one unit column.

In some examples, as shown in FIG. 9G, the fourth conductive layer of the plurality of circuit units of the first region may further include a second data connection electrode 86 and a plurality of dummy electrodes 85. The fourth conductive layer of the plurality of circuit units of the second region may further include a second connection line 72, a second data connection electrode 86, and a plurality of dummy electrodes 85. As shown in FIG. 9G and FIG. 10C, the fourth conductive layer of the plurality of circuit units of the third region may further include a second compensation trace 92, a plurality of second compensation connection electrodes 87, and a plurality of dummy electrodes 85.

In some examples, as shown in FIG. 9G, a shape of the second connection line 72 may be a straight line shape of which a main body portion extends along the second direction Y. In at least one unit column of the second region, the first power supply line 51, the second connection line 72, and the data signal line 60 are sequentially arranged along the first direction X. The second connection line 72 may be located between the first power supply line 51 and the data signal line 60. A second data connection electrode 86 or a dummy electrode 85 may be disposed between the first power supply line 51 and the second connection line 72. The second connection line 72 may be electrically connected with an adjacent second data connection electrode 86, for example, may be of an integral structure. One side of the data signal line 60 along the first direction X may be provided with a second data connection electrode 86 or a dummy electrode 85. The data signal line 60 may be electrically connected with an adjacent second data connection electrode 86, for example, may be of an integral structure.

In some examples, as shown in FIG. 9G, a second data connection electrode 86 located in an M-th row and an N-th column may be electrically connected with a first data connection electrode 81 through the fifteenth via V15, thereby achieving an electrical connection between a data signal line 60 located in the N-th column and a first connection line 71 located in the M-th row. A second data connection electrode 86 located in the M-th row and an (N+1)-th column may be electrically connected with a first data connection electrode 81 through the sixteenth via V16, thereby achieving an electrical connection between a second connection line 72 located in the (N+1)-th column and the first connection line 71 located in the M-th row. Thus, the data signal line 60 located in the N-th column may be electrically connected with the second connection line 72 located in the (N+1)-th column through the first connection line 71 located in the M-th row. In this example, the fifteenth via V15 may be referred to as a first connection hole, and the sixteenth via V16 may be referred to as a second connection hole. In this example, dummy electrodes 85 of the first region and the second region may be electrically connected with a first data connection electrode 81 through the fourteenth via V14.

In some examples, as shown in FIG. 10C, a shape of the second compensation trace 92 may be a straight line shape of which a main body portion extends along the second direction Y. In at least one unit column of the third region, the first power supply line 51, the second compensation trace 92, and the data signal line 60 may be arranged sequentially in the first direction X. The second compensation trace 92 may be located between the first power supply line 51 and the data signal line 60. A second compensation connection electrode 87 or a dummy electrode 85 may be disposed between the first power supply line 51 and the second compensation trace 92. The second compensation trace 92 may be electrically connected with an adjacent second compensation connection electrode 87, for example, may be of an integral structure. A dummy electrode 85 may be disposed on a side of the data signal line 60 along the first direction X.

In some examples, as shown in FIG. 10C, at least one second compensation connection electrode 87 may be electrically connected with a first compensation connection electrode 82 through the eighteenth via V18, thereby achieving an electrical connection between the first compensation trace 91 and the second compensation trace 92. In this example, the eighteenth via V18 may be referred to as a third connection hole. In some examples, the plurality of second compensation traces 92 and the plurality of first compensation traces 91 may be connected with each other, thereby forming a mesh communication structure. In this example, a dummy electrode 85 of the third region may be electrically connected with the first compensation connection electrode 82 through the seventeenth via V17.

In some examples, as shown in FIG. 9G and FIG. 10C, an orthographic projection of a dummy electrode 85 on the base substrate may be overlapped with an orthographic projection of the first data connection electrode 81 or the first compensation connection electrode 82 on the base substrate. The dummy electrode 85 may present a same morphology and structure as the second compensation connection electrode 87 and the second data connection electrode 86, which not only may improve uniformity of a preparation process, but also enables different regions to have substantially a same transfer connection structure, and different regions may each achieve substantially a same display effect under transmitted light and reflected light, thus effectively eliminating a shadow elimination situation, effectively avoiding poor appearance of the display substrate, and improving display character and display quality.

In some examples, as shown in FIG. 9E and FIG. 9H, an orthographic projection of the fourth conductive layer on the base substrate may cover a first fracture DF1. For example, an orthographic projection of the first power supply line 51 of the fourth conductive layer on the base substrate may cover the first fracture DF1. As shown in FIG. 9G, an orthographic projection of the first conductive layer (e.g., the light emitting control line 24) on the base substrate may cover a second fracture DF2. In this example, the first fracture surface DF1 and the second fracture surface DF2 are covered through a conductive layer on an upper side or a lower side, so that substantially a same display effect may be achieved in different regions under transmitted light and reflected light, and appearance consistency of the display substrate is ensured.

In some examples, as shown in FIG. 10C, the fourth conductive layer of the bezel region may include a plurality of second compensation connection lines 84 and a bezel power supply lead 510. A second compensation connection line 84 may extend along the first direction X and one end may be electrically connected with the bezel power supply lead 510, and the other end may be electrically connected with the first compensation connection line 83 through the nineteenth via V19. In some examples, the second compensation connection line 84 and the bezel power supply lead 510 may be of an integral structure. However, this embodiment is not limited thereto. In other examples, the bezel power supply lead 510 may be located in the third conductive layer, and the second compensation connection line 84 may be electrically connected with the bezel power supply lead 510 through a via disposed in the fourth insulation layer.

In this example, an electrical connection between the first compensation trace 91 and the bezel power supply lead 510 may be achieved through the first compensation connection line 83 and the second compensation connection line 84. A structure of a connection between the second compensation trace 92 and the bezel power supply lead 510 or a bonding power supply lead 410 is similar, and thus will not be repeated here.

So far, a drive circuit layer has been prepared on the base substrate. In a plane parallel to the display substrate, the drive circuit layer may include a plurality of circuit units, each circuit unit may include a pixel drive circuit, and a first scan signal line, a second scan signal line, a third scan signal line, a light emitting control line, a first power supply line, a first initial signal line, and a second initial signal line which are connected with the pixel drive circuit. In a plane perpendicular to the display substrate, the drive circuit layer may at least include a semiconductor layer, a first insulation layer, a first conductive layer, a second insulation layer, a second conductive layer, a third insulation layer, a third conductive layer, a fourth insulation layer, and a fourth conductive layer which are stacked sequentially on the base substrate.

In some exemplary embodiments, the base substrate 101 may be a flexible base substrate or may be a rigid base substrate. The rigid base substrate may be made of, but is not limited to, one or more of glass and quartz. The flexible base substrate may be made of, but is not limited to, one or more of polyethylene terephthalate, ethylene terephthalate, polyether ether ketone, polystyrene, polycarbonate, polyary-late, polyarylester, polyimide, polyvinyl chloride, polyeth-ylene, and textile fibers. In an exemplary embodiment, the flexible base substrate may include a first flexible material layer, a first inorganic material layer, a semiconductor layer, a second flexible material layer, and a second inorganic material layer which are stacked. Materials of the first flexible material layer and the second flexible material layer may be Polyimide (P1), Polyethylene Terephthalate (PET), or surface treated polymer soft films. Materials of the first inorganic material layer and the second inorganic material layer may be Silicon Nitride (SiNx), or Silicon Oxide (SiOx), etc., for improving water and oxygen resistance of the base substrate, and a material of the semiconductor layer may be amorphous silicon (a-si).

In an exemplary embodiment, the first conductive layer, the second conductive layer, the third conductive layer, and the fourth conductive layer may be made of a metal material, such as any one or more of Argentum (Ag), Copper (Cu), Aluminum (Al), and Molybdenum (Mo), or an alloy mate-rial of the above metals, such as an Aluminum Neodymium alloy (AlNd) or a Molybdenum Niobium alloy (MoNb), and may be of a single-layer structure or a multi-layer composite structure, such as Mo/Cu/Mo. The first insulation layer 111, the second insulation layer 112, and the third insulation layer 113 may be made of any one or more of Silicon Oxide (SiOx), Silicon Nitride (SiNx), and Silicon Oxynitride (SiON), and may be a single layer, a multi-layer, or a composite layer. The first insulation layer 111 and the second insulation layer 112 are referred to as Gate Insulation (GI) layers, and the third insulation layer 113 is referred to as an Interlayer Dielectric (ILD) layer. The fourth insulation layer 114 may be made of an organic material such as resin. An active layer may be made of a material such as amorphous Indium Gallium Zinc Oxide (a-IGZO), Zinc Oxynitride (ZnON), Indium Zinc Tin Oxide (IZTO), amorphous Silicon (a-Si), poly Silicon (p-Si), hexathiophene, or polythiophene. That is, the present disclosure is applicable to transistors that are manufactured based on an oxide technology, a silicon technology, or an organic matter technology.

In some exemplary embodiments, after the drive circuit layer is prepared, a light emitting structure layer and an encapsulation structure layer may be sequentially prepared on the drive circuit layer, which will not be repeated here.

As may be seen from a structure and the preparation process of the display substrate described above, according to this exemplary embodiment, a data connection line is disposed in a display region, so that a lead-out line of a bonding region is connected with a data signal line through the data connection line, and no fan-shaped oblique line needs to be disposed in a lead region, which effectively reduces a length of the lead region, greatly reduces a width of a lower bezel, and increases a screen-to-body ratio, which is beneficial to achieving full-screen display. In this example, a first connection line and a second connection line of data connection lines are disposed in different conductive layers, which may facilitate a layout of data connection lines, and may avoid a collective arrangement of a large number of traces, so that substantially a same display effect may be achieved in different regions under transmitted light and reflected light, which effectively eliminates a shadow elimination situation, effectively avoids poor appearance of the display substrate, and improves display character and display quality. In this example, by arranging compensation traces and dummy electrodes, a traces arrangement of the display region may be further balanced, a shadow elimina-tion situation may be effectively eliminated, and poor appearance of the display substrate may be effectively avoided. In this example, by arranging compensation traces to be of a mesh communication structure, not only a resis-tance of a power supply trace may be effectively reduced, and a voltage drop of a low-voltage power supply signal effectively may be reduced, which achieves low power consumption, but also uniformity of a power supply signal in the display substrate may be effectively improved, and display uniformity may be effectively improved, which improves display character and display quality. The prepa-ration process of the present disclosure may be compatible well with an existing preparation process, and is simple in process implementation, easy to implement, high in produc-tion efficiency, low in production cost, and high in yield.

The aforementioned structure shown in the present dis-closure and the preparation process thereof are merely exemplary description. In an exemplary embodiment, cor-responding structures may be changed and patterning pro-cesses may be added or reduced according to actual needs, which is not limited here in the present disclosure. For example, a buffer layer may be disposed between the semi-conductor layer and the base substrate.

Figure 11A:
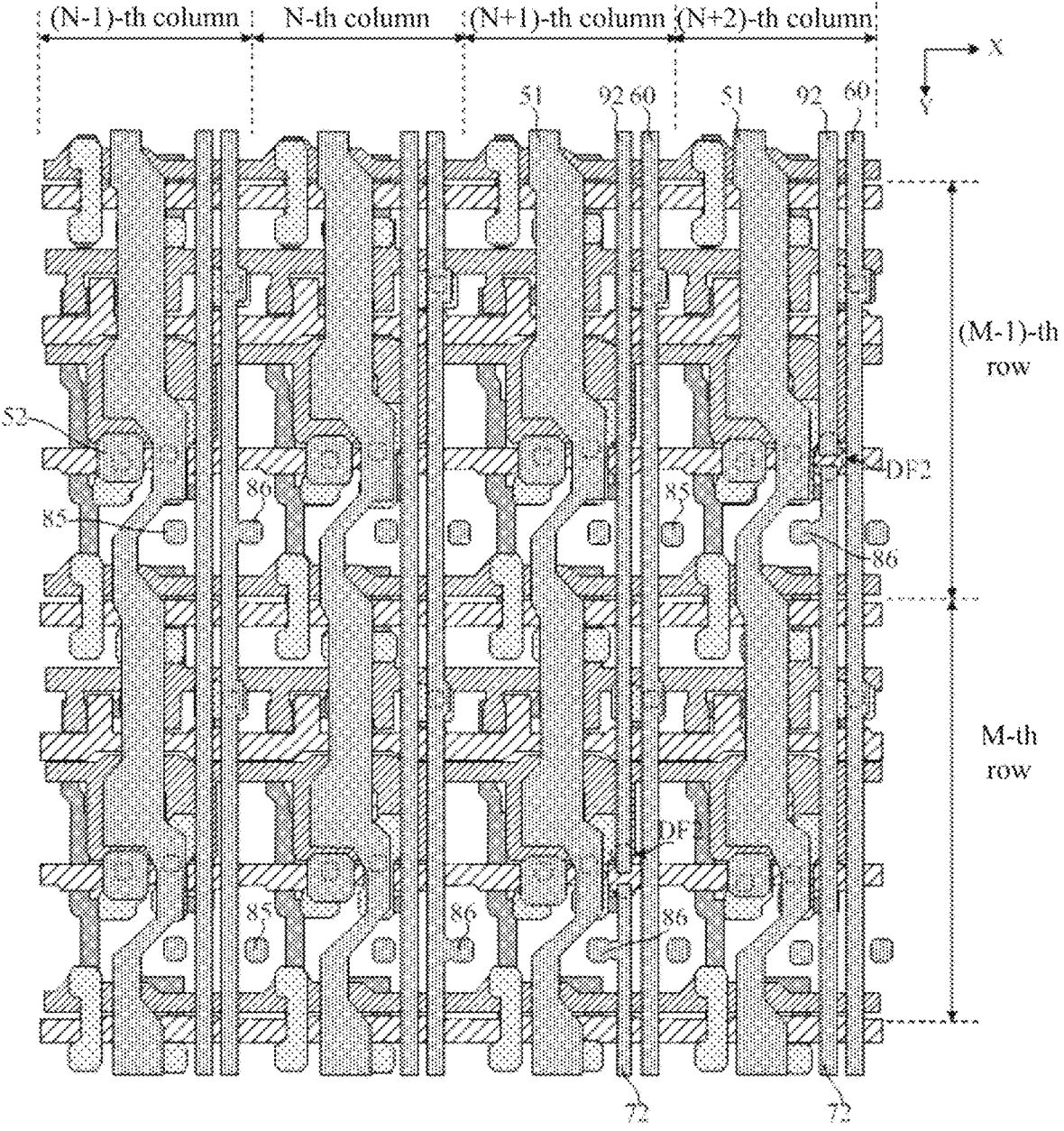
FIG. 11A is another partial enlarged schematic diagram of a display substrate after a fourth conductive layer is formed in the region C1 in FIG. 7A.
Figure 11B:
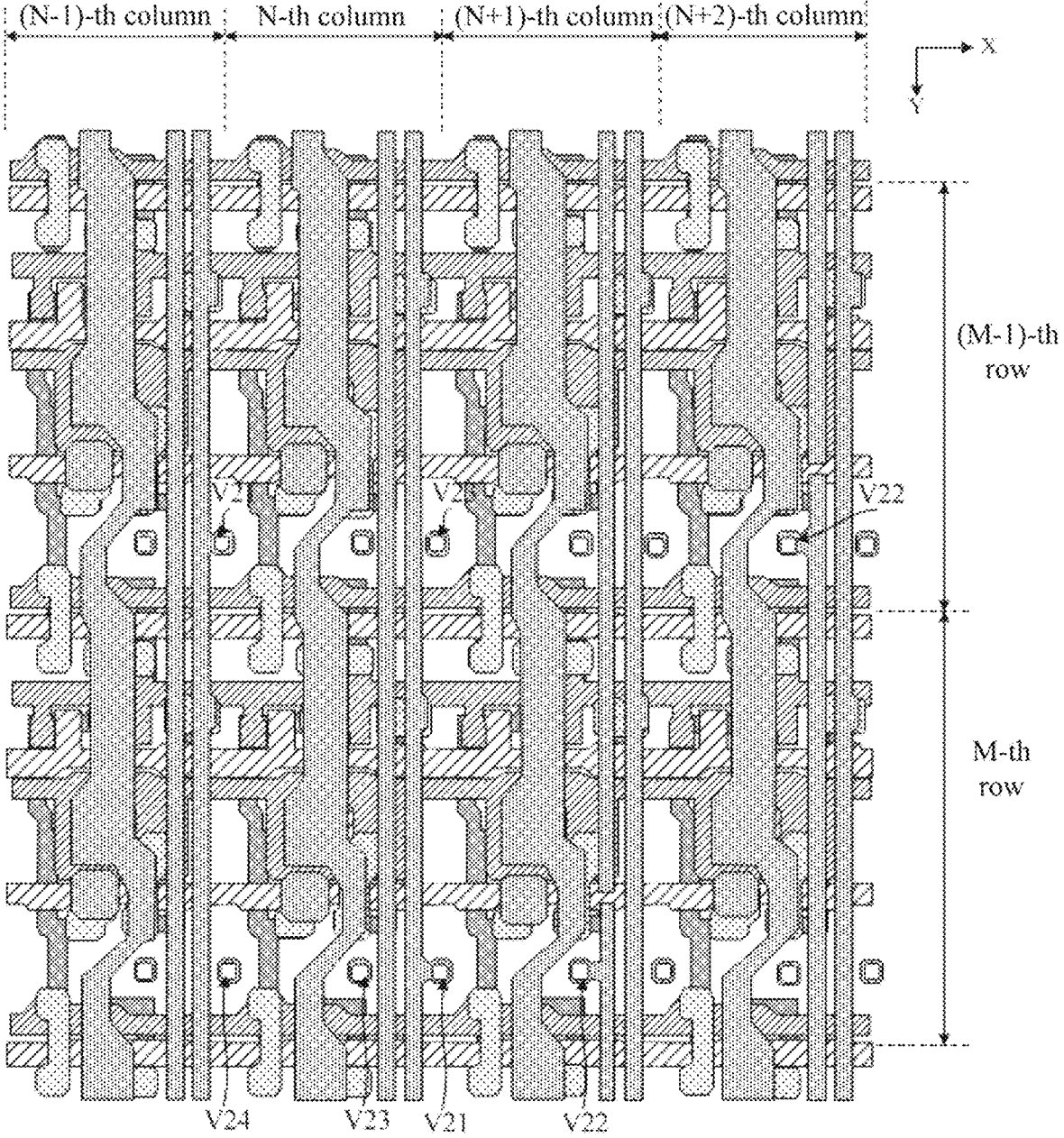
FIG. 11B is another partial enlarged schematic diagram of a display substrate after a fifth insulation layer is formed in the region C1 in FIG. 7A.
Figure 11C:
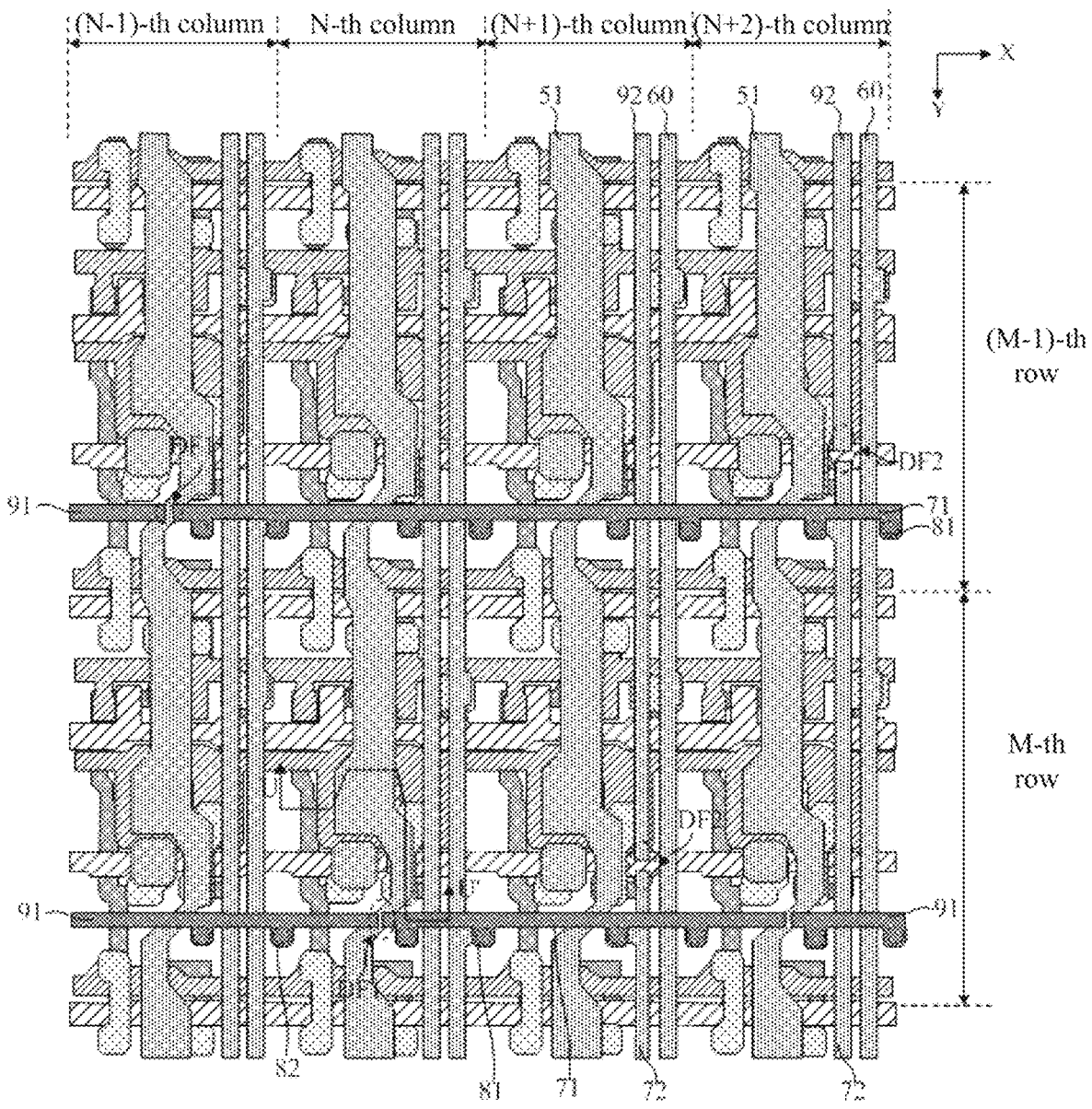
FIG. 11C is another partial enlarged schematic diagram of a display substrate after a fifth conductive layer is formed in the region C1 in FIG. 7A.
Figures 11D, 11E:
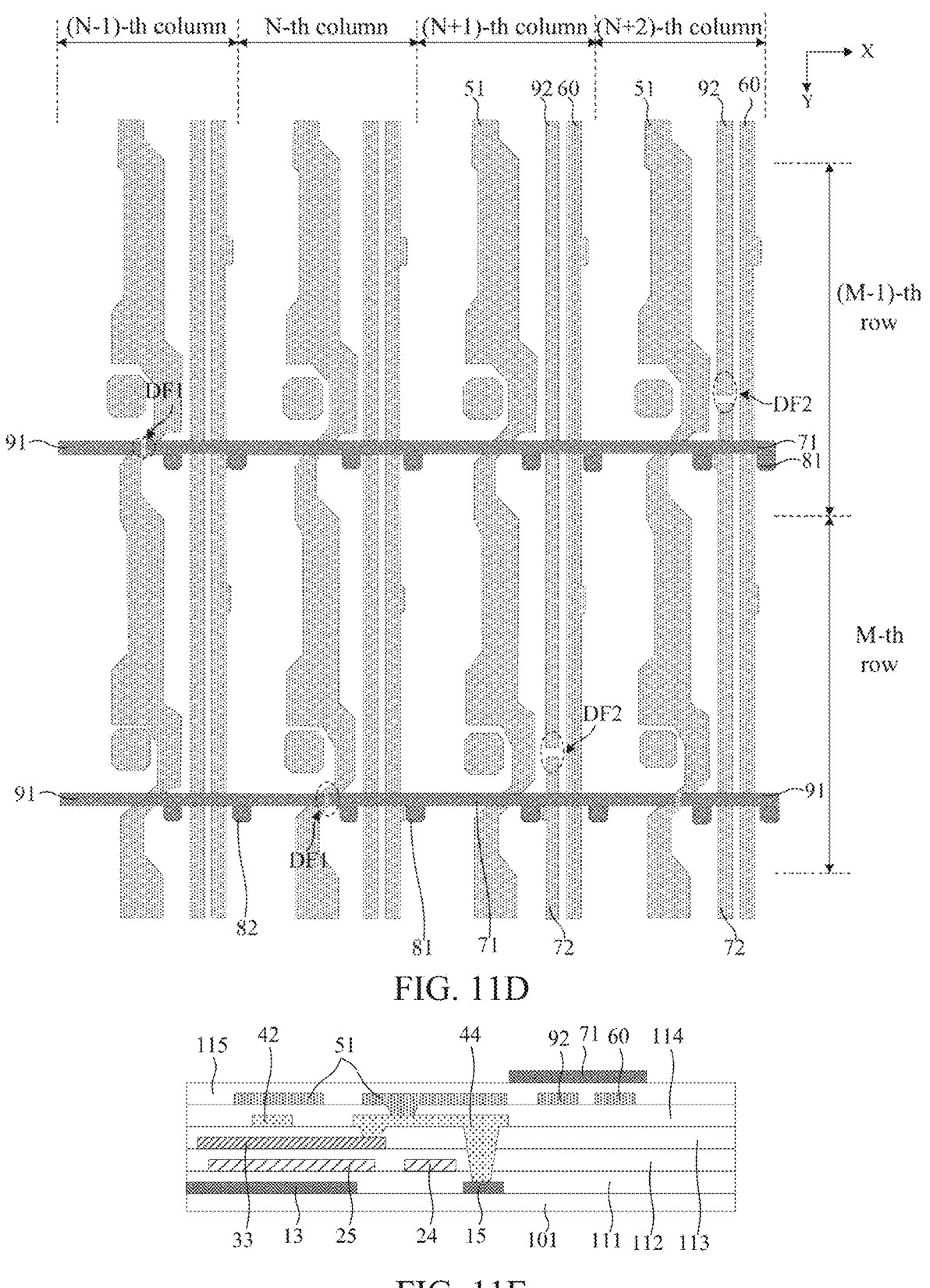
FIG. 11D is a partial enlarged schematic diagram of a fourth conductive layer and a fifth conductive layer of the region C1 in FIG. 7A.
FIG. 11E is a sectional schematic diagram along a U-U' direction in FIG. 11C.

FIG. 11A is another partial enlarged schematic diagram of a display substrate after a fourth conductive layer is formed in the region C1 in FIG. 7A. FIG. 11B is another partial enlarged schematic diagram of a display substrate after a fifth insulation layer is formed in the region C1 in FIG. 7A. FIG. 11C is another partial enlarged schematic diagram of a display substrate after a fifth conductive layer is formed in the region C1 in FIG. 7A. FIG. 11D is a partial enlarged schematic diagram of a fourth conductive layer and a fifth conductive layer of the region C1 in FIG. 7A. FIG. 11E is a sectional schematic diagram along a U-U' direction in FIG. 11C.

In some exemplary implementation modes, as shown in FIG. 11A to FIG. 11E, in a direction perpendicular to the display substrate, a drive circuit layer may include a first conductive layer, a second conductive layer, a third conduc-tive layer, a fourth conductive layer, and a fifth conductive layer which are disposed sequentially on a base substrate 101. The fourth conductive layer may include a data signal line 60, a second connection line 72, and a second compen-sation trace 92, and the fifth conductive layer may include a first connection line 71 and a first compensation trace 91. A first insulation layer 111 may be disposed between a semi-conductor layer and the first conductive layer, a second insulation layer 112 may be disposed between the first conductive layer and the second conductive layer, a third insulation layer 113 may be disposed between the second conductive layer and the third conductive layer, and a fourth insulation layer 114 may be disposed between the third conductive layer and the fourth conductive layer. A fifth insulation layer 115 may be disposed between the fourth conductive layer and the fifth conductive layer. The drive circuit layer of this example may include three source-drain metal layers.

In some examples, as shown in FIG. 11A, the fourth conductive layer of a plurality of circuit units in a display region may each include a first power supply line 51, an anode connection electrode 52, and a data signal line 60. The fourth conductive layer of the display region may further include a second connection line 72, a second data connec-tion electrode 86, a second compensation trace 92, a second compensation connection electrode, and a plurality of dummy electrodes 85.

In some examples, as shown in FIG. 11B, the fifth insulation layer 115 of the display region may be provided with a plurality of vias. For example, a plurality of circuit units in a first region and a plurality of circuit units in a second region may include a twenty-first via V21 to a twenty-third via V23. A plurality of circuit units in a third region may at least include a twenty-fourth via V24. The fifth insulation layer 115 within the twenty-first via V21 to the twenty-fourth via V24 is removed to expose a surface of the fourth conductive layer.

In some examples, as shown in FIG. 11C, the fifth conductive layer of the display region may include a first connection line 71, a first compensation trace 91, a first data connection electrode 81, and a first compensation connection electrode 82. The first connection line 71 and a plurality of first data connection electrodes 81 may be of an integral structure. The first compensation trace 91 and a plurality of first compensation connection electrodes 82 may be of an integral structure.

In some examples, a first data connection electrode 81 located in an M-th row and an N-th column may be electrically connected with a second data connection electrode 86 through the twenty-first via V21, thereby achieving an electrical connection between a first connection line 71 located in the M-th row and a data signal line 60 located in the N-th column. A first data connection electrode 81 located in the M-th row and an (N+1)-th column may be electrically connected with a second data connection electrode 86 through the twenty-second via V22, thereby achieving an electrical connection between the first connection line 71 located in the M-th column and a second connection line 72 located in the (N+1)-th column. In this example, the twenty-first via V21 may be referred to as a first connection hole, and the twenty-second via V22 may be referred to as a second connection hole. In some examples, a first data connection electrode 81 may be electrically connected with a dummy electrode 85 through the twenty-third via V23. A first compensation connection electrode 82 may be electrically connected with a dummy electrode 85 through the twenty-fourth via V24. A first compensation connection electrode may also be electrically connected with a second compensation connection electrode to achieve an electrical connection between a first compensation trace and a second compensation trace.

In some examples, as shown in FIG. 11D, an orthographic projection of a first fracture DF1, which is disposed between a first compensation trace 91 and a first connection line 71, on the base substrate may be located within a range of an orthographic projection of the fourth conductive layer, for example, may be covered by an orthographic projection of the first power supply line 51. As shown in FIG. 11C, an orthographic projection of a second fracture DF2, which is disposed between a second compensation trace 92 and a second connection line 72, on the base substrate, may be located within a range of an orthographic projection of the first conductive layer, for example, may be covered by an orthographic projection of a light emitting control line. However, this embodiment is not limited thereto.

Rest of a structure of the drive circuit layer according to this example may be referred to description of the aforementioned embodiments, and thus will not be repeated here.

In some examples, in a preparation process of the display substrate, after forming the fourth conductive layer, a second planarization thin film may be coated and is patterned by using a patterning process to form a fifth insulation layer 115, and then a fifth conductive thin film is deposited and is patterned by using a patterning process to form a fifth conductive layer disposed on the fifth insulation layer 115. In some examples, the fifth conductive layer may be referred to as a third source-drain metal (SD3) layer. The fifth insulation layer may also be referred to as a second planarization layer. In some examples, the fifth conductive layer may be made of a metal material, such as any one or more of Argentum (Ag), Copper (Cu), Aluminum (Al), and Molybdenum (Mo), or an alloy material of the above metals, such as an Aluminum Neodymium alloy (AlNd) or a Molybdenum Niobium alloy (MoNb), and may be of a single-layer structure or a multi-layer composite structure, such as Mo/Cu/Mo. The fifth insulation layer may be made of an organic material such as resin. Rest of the preparation process of the display substrate according to this embodiment may be referred to description of the aforementioned embodiments, and thus will not be repeated here.

The display substrate provided by this example may reduce a load of a first connection line by disposing the first connection line in the fifth conductive layer, and is suitable for a display substrate with a relatively high refresh rate.

Figure 12A:
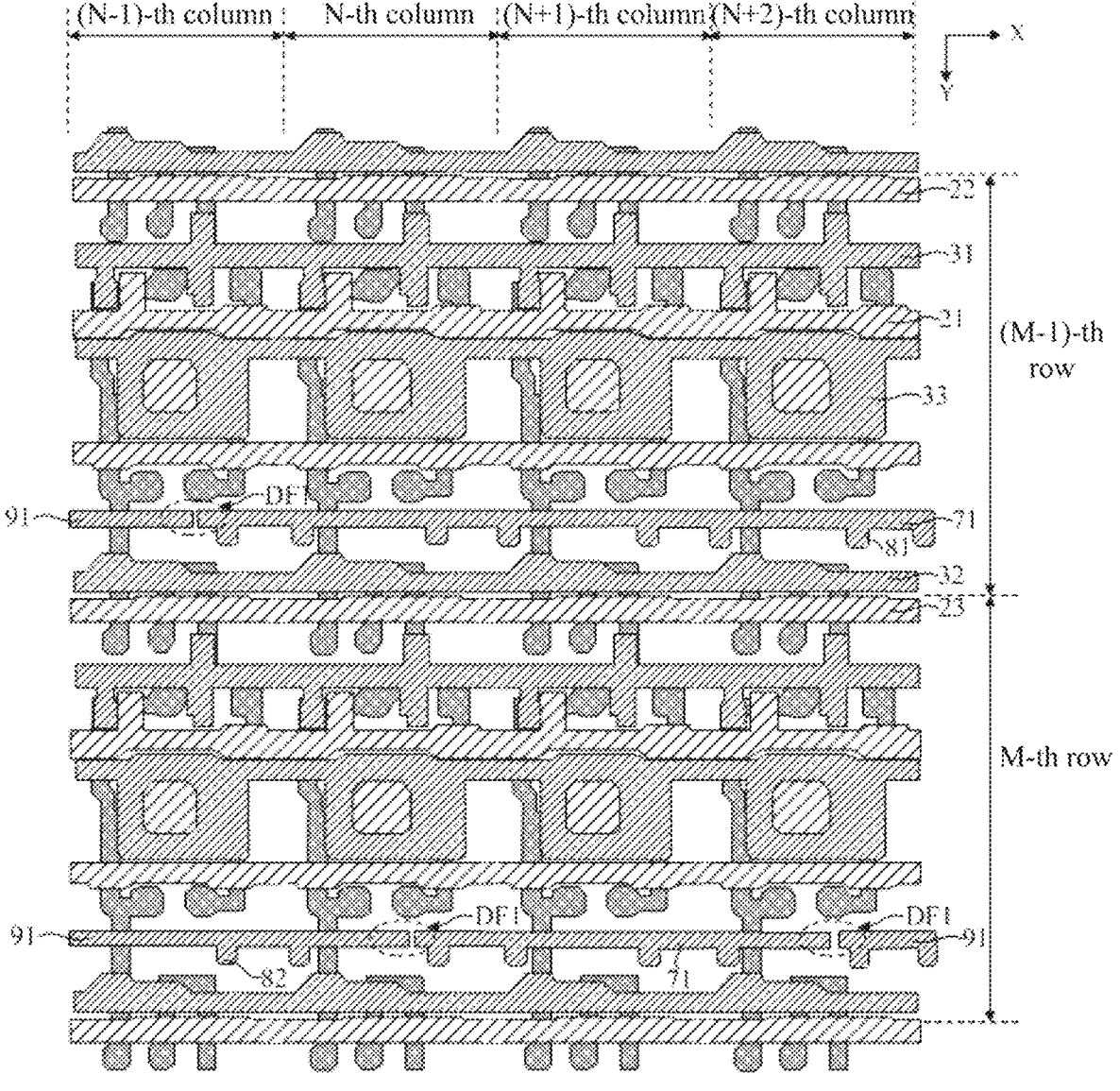
FIG. 12A is another partial enlarged schematic diagram of a display substrate after a second conductive layer is formed in the region C1 in FIG. 7A.
Figure 12B:
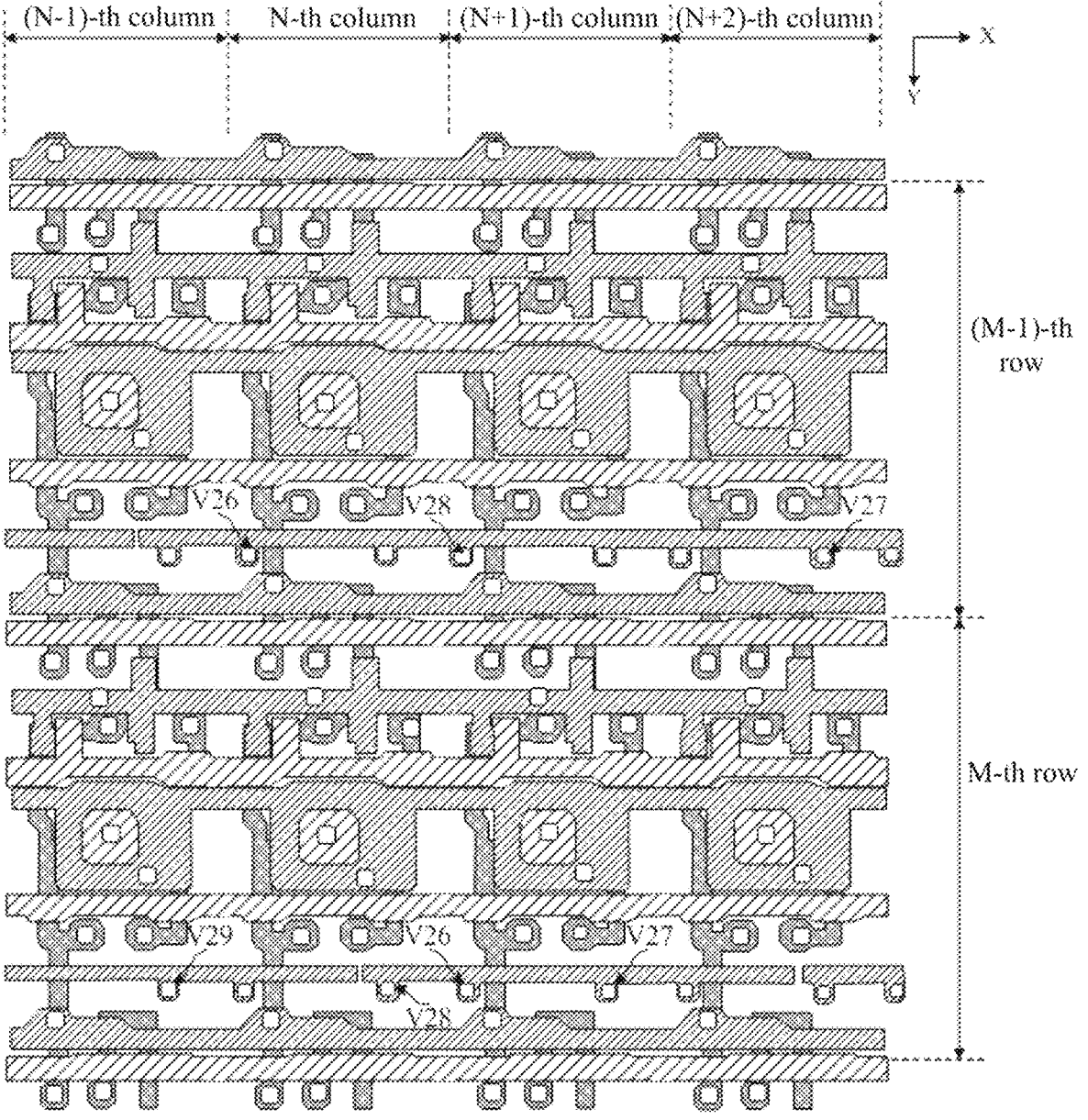
FIG. 12B is another partial enlarged schematic diagram of a display substrate after a third insulation layer is formed in the region C1 in FIG. 7A.
Figure 12C:
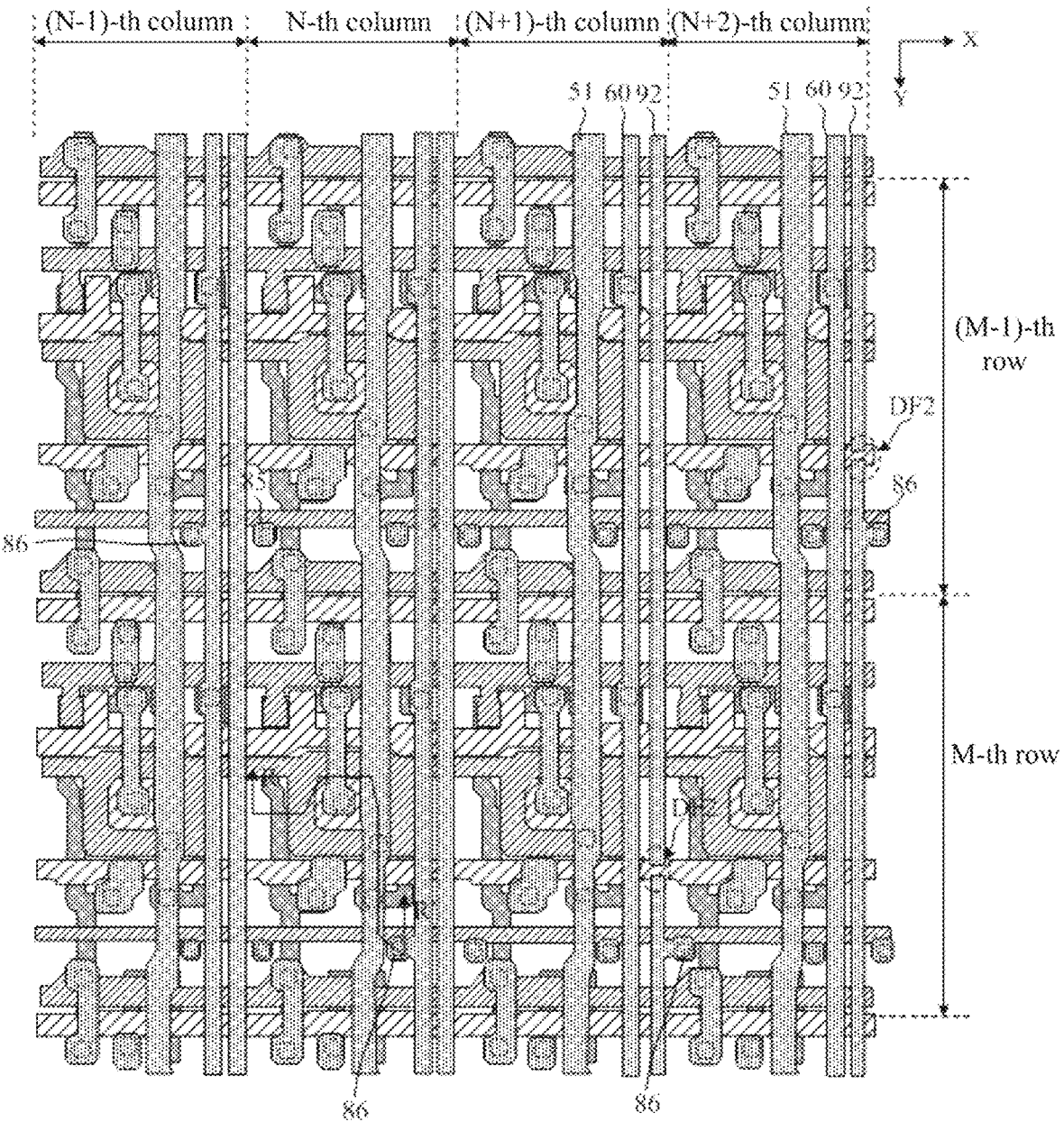
FIG. 12C is another partial enlarged schematic diagram of a display substrate after a third conductive layer is formed in the region C1 in FIG. 7A.
Figures 12D, 12E:
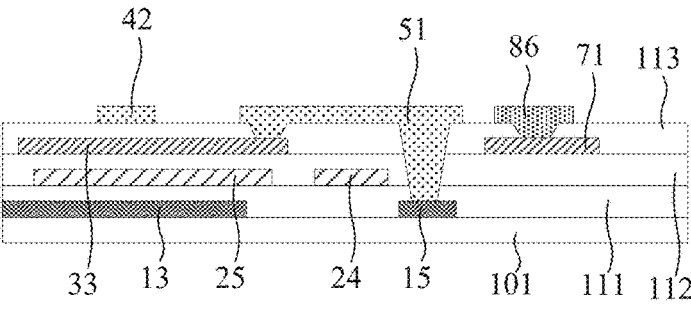
FIG. 12D is a partial enlarged schematic diagram of a second conductive layer and a third conductive layer of the region C1 in FIG. 7A.
FIG. 12E is a sectional schematic diagram along an R-R' direction in FIG. 12C.

FIG. 12A is another partial enlarged schematic diagram of a display substrate after a second conductive layer is formed in the region C1 in FIG. 7A. FIG. 12B is another partial enlarged schematic diagram of a display substrate after a third insulation layer is formed in the region C1 in FIG. 7A. FIG. 12C is another partial enlarged schematic diagram of a display substrate after a third conductive layer is formed in the region C1 in FIG. 7A. FIG. 12D is a partial enlarged schematic diagram of a second conductive layer and a third conductive layer of the region C1 in FIG. 7A. FIG. 12E is a sectional schematic diagram along an R-R' direction in FIG. 12C.

In some exemplary implementation modes, as shown in FIG. 12A to FIG. 12E, in a direction perpendicular to the display substrate, a drive circuit layer may include a first conductive layer, a second conductive layer, and a third conductive layer which are disposed sequentially on a base substrate 101. A first insulation layer 111 may be disposed may between a semiconductor layer and the first conductive layer, a second insulation layer 112 may be disposed between the first conductive layer and the second conductive layer, and a third insulation layer 113 may be disposed between the second conductive layer and the third conductive layer.

In some examples, as shown in FIG. 12A, the second conductive layer of each circuit unit in a display region may include a first initial signal line 31, a second initial signal line 32, a second electrode 33 of a storage capacitor, an electrode plate connection line 34, and a shield electrode 35. A plurality of circuit units of a first region of the display region may include a first connection line 71 and a plurality of first data connection electrodes 81. A plurality of circuit units of a third region of the display region may include a first compensation trace 91 and a plurality of first compensation connection electrodes 82.

In some examples, as shown in FIG. 12B, the third insulation layer may be provided with a plurality of vias. For example, the plurality of circuit units in the first region and a plurality of circuit units in a second region may further include a twenty-sixth via V26 to a twenty-eighth via V28. The plurality of circuit units in the third region may further include a twenty-ninth via V29. The third insulation layer 113 within the twenty-sixth via V26 to the twenty-ninth via V29 is removed to expose a surface of the second conductive layer.

In some examples, as shown in FIG. 12C, the third conductive layer of a plurality of circuit units in the first region and the second region may further include a second connection line 72, a second data connection electrode 86, and a plurality of dummy electrodes 85. The third conductive layer of the plurality of circuit units in the third region may further include a second compensation trace 92, a second compensation connection electrode, and a plurality of dummy electrodes 85. In some examples, a first power supply line 51 may be located in the third conductive layer and a shape of the first power supply line 51 may be a straight segment of which a main body portion extends along a second direction Y. In one unit column, the second compensation trace 92 and the second connection line 72 may be located on a side of a data signal line 60 away from the first power supply line 51.

In some examples, a second data connection electrode 86 located in an M-th row and an N-th column may be electrically connected with a first data connection electrode 81 through the twenty-sixth via V26, thereby achieving an electrical connection between a first connection line 71 located in the M-th row and a data signal line 60 located in the N-th column. A second data connection electrode 87 located in the M-th row and an (N+1)-th column may be electrically connected with a first data connection electrode 81 through the twenty-seventh via V27, thereby achieving an electrical connection between the first connection line 71 located in the M-th column and a second connection line 72 located in the (N+1)-th column. In this example, the twenty-sixth via V26 may be referred to as a first connection hole, and the twenty-seventh via V27 may be referred to as a second connection hole. In some examples, a dummy electrode 85 may be electrically connected with a first data connection electrode 81 through the twenty-eighth via V28. A dummy electrode 85 may be electrically connected with a first compensation connection electrode 82 through the twenty-ninth via V29. A first compensation connection electrode may also be electrically connected with a second compensation connection electrode to achieve an electrical connection between a first compensation trace and a second compensation trace.

In some examples, as shown in FIG. 12D, an orthographic projection of a first fracture DF1, which is disposed between a first compensation trace 91 and a first connection line 71, on the base substrate may be located within a range of an orthographic projection of the third conductive layer, for example, may be covered by an orthographic projection of the first power supply line 51. As shown in FIG. 12C, an orthographic projection of a second fracture DF2, which is disposed between a second compensation trace 92 and a second connection line 72, on the base substrate may be located within a range of an orthographic projection range of the first conductive layer, for example, may be covered by an orthographic projection of a light emitting control line. However, this embodiment is not limited thereto.

In the display substrate provided by this example, the drive circuit layer only includes three conductive layers, which may reduce a process flow, reduce a use amount of a mask and a use amount of a fabrication material, and thereby reduce a cost.

Rest of a structure of the display substrate according to this example may be referred to description of the aforementioned embodiments, and thus will not be repeated here.

Figure 13:
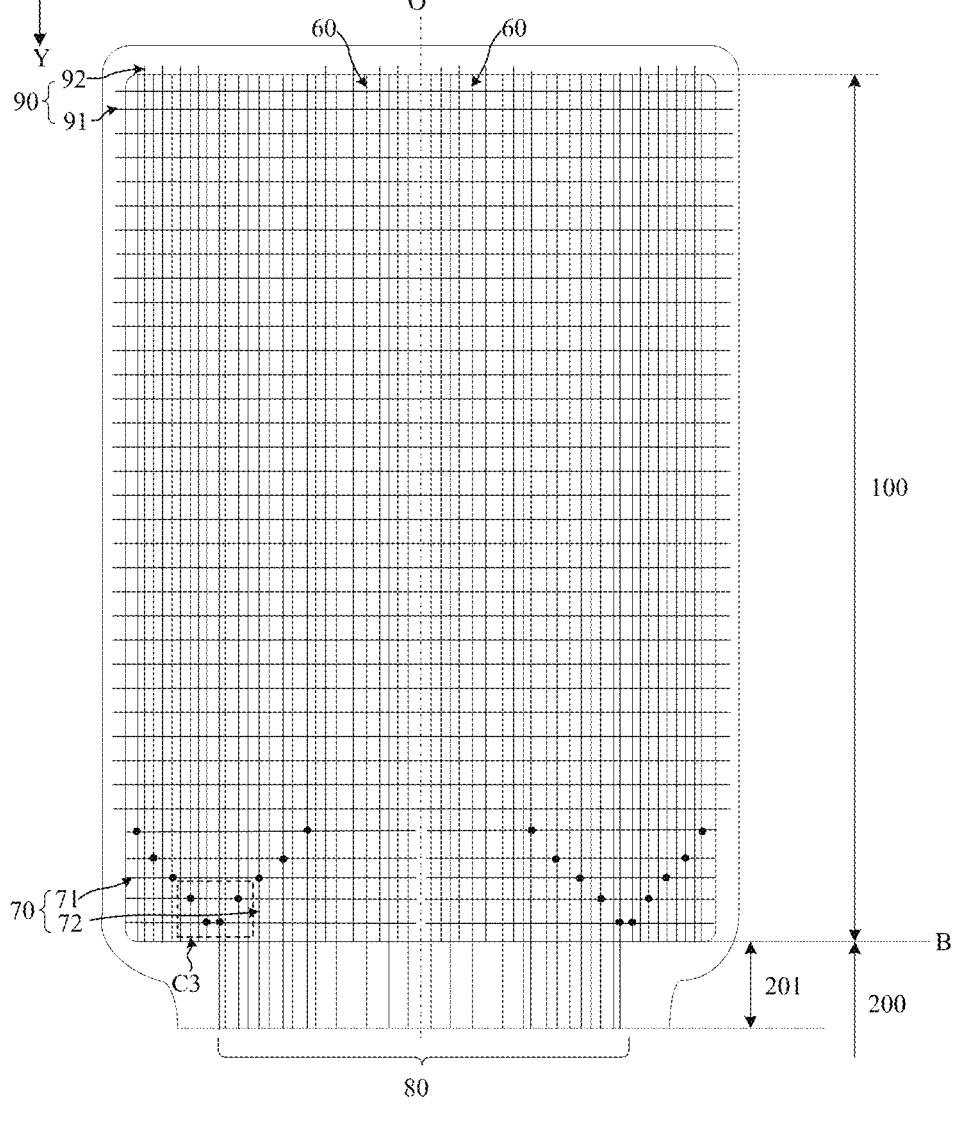
FIG. 13 is a schematic diagram of another planar structure of a display substrate according to at least one embodiment of the present disclosure.

FIG. 13 is a schematic diagram of another planar structure of a display substrate according to at least one embodiment of the present disclosure. In some examples, as shown in FIG. 13, only one first compensation trace 91 may be disposed in at least one unit row, and only at least one first connection line 71 may be disposed in the at least one unit row. The first connection line 71 may extend toward a center line O from a side close to a bezel region on a left or right side. One end of the first connection line 71 may extend to a boundary between the bezel region on the left or right side and a display region, and the other end may extend to the center line O. At least two first connection lines 71 in at least one unit row may be aligned in a first direction, and a fracture may be disposed between adjacent first connection lines 71 to achieve a connection between different data signal lines 60 and a data connection line 70. Only a second compensation trace 92 may be disposed in at least one unit column, and only a second connection line 72 may be disposed in the at least one unit column. In this example, the second connection line 72 may penetrate through the display region 100 along a second direction D2. One end of the second connection line 72 may extend to a boundary between the bezel region on an upper side and the display region, and the other end may extend to a boundary B between a bonding region and the display region.

Figure 14:
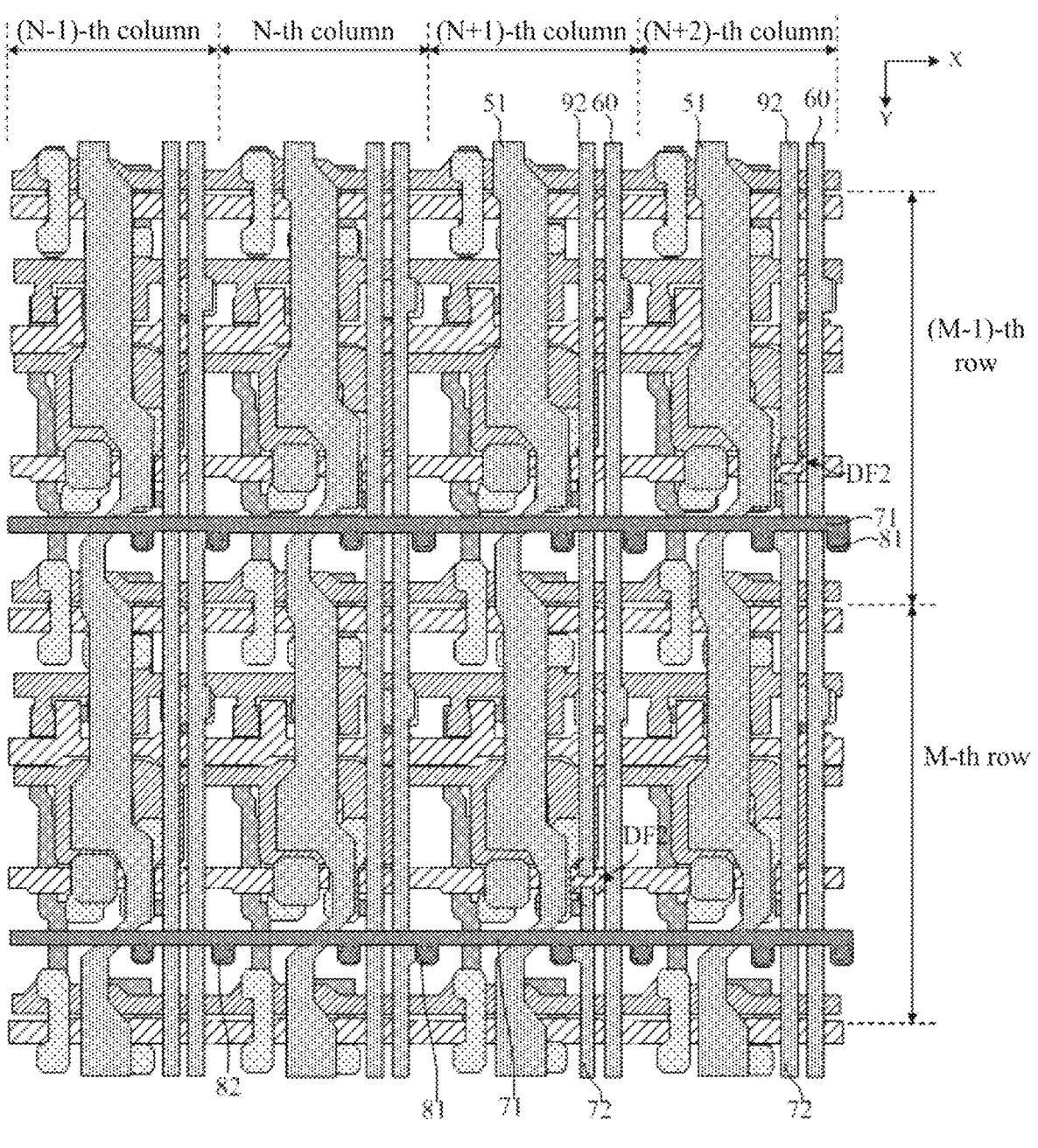
FIG. 14 is a partial enlarged schematic diagram of a drive circuit layer of a region C3 in FIG. 13.

FIG. 14 is a partial enlarged schematic diagram of a drive circuit layer of a region C3 in FIG. 13. In this example, a case that the drive circuit layer includes three source-drain metal layers is taken as an example for illustration. As shown in FIG. 14, a first connection line 71, a first compensation trace 91, a first data connection electrode 81, and a first compensation connection electrode 82 may be located in a fifth conductive layer, and a second connection line 72, a second compensation trace 92, a data signal line 60, a first power supply line 51, a second data connection electrode, a second compensation connection electrode, and a dummy electrode may be located in a fourth conductive layer. In this example, by disposing a first connection line in the fifth conductive layer, a load of the first connection line may be reduced, thereby increasing a length of the first connection line and simplifying a trace arrangement. Rest of a structure of the display substrate according to this embodiment may be referred to description of the aforementioned embodiments, and thus will not be repeated here.

Figures 15, 16:
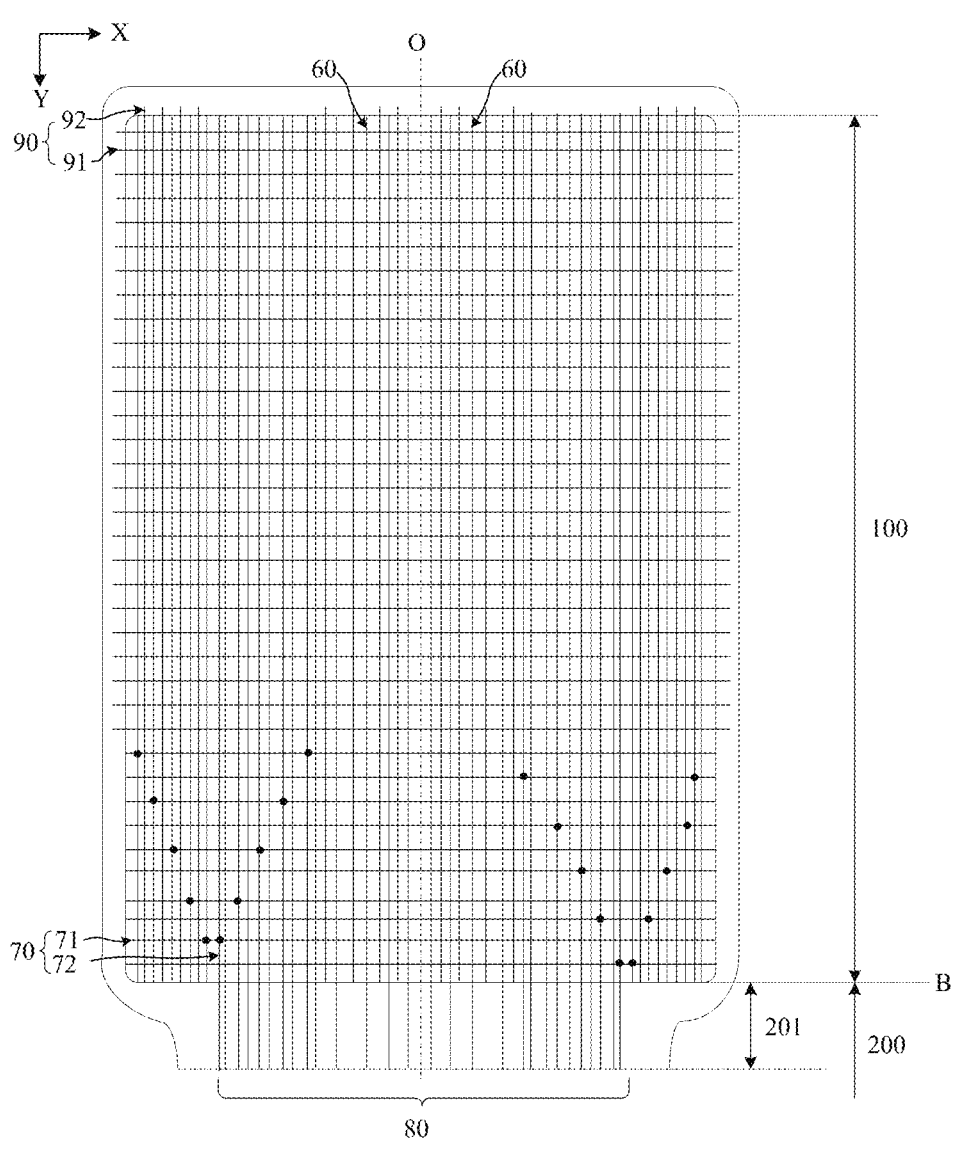
FIG. 15 is a schematic diagram of another planar structure of a display substrate according to at least one embodiment of the present disclosure.
FIG. 16 is a schematic diagram of an arrangement of circuit units according to at least one embodiment of the present disclosure.

FIG. 15 is a schematic diagram of another planar structure of a display substrate according to at least one embodiment of the present disclosure. In some examples, as shown in FIG. 15, a first connection line 71 may penetrate through a display region 100 along a first direction X. One end of the first connection line 71 may extend to a boundary between a bezel region on a left side and the display region, and the other end may extend to a boundary between the bezel region on a right side and the display region. At least one unit row may be provided with only one first connection line 71. The first connection line 71 may be electrically connected with a data signal line 60 and a second connection line 72. A first compensation trace 91 may be disposed parallel to and in a same layer as the first connection line 71, and the first compensation trace 91 may extend from the bezel region on the left side to the bezel region on the right side.

In some examples, as shown in FIG. 15, the second connection line 72 may penetrate through the display region along a second direction Y. One end of the second connection line 72 may extend to a boundary between the bezel region on an upper side and the display region, and the other end may extend to a boundary between a bonding region and the display region. A second compensation trace 92 may be disposed parallel to and in a same layer as the second connection line 72. The second compensation trace 92 may extend from the bezel region on the upper side to the bonding region.

In some examples, the first connection line 71 and the first compensation trace 91 may be located in a fifth conductive layer, and the second connection line 72, the second compensation trace 92, and the data signal line 60 may be located in a fourth conductive layer. However, this embodiment is not limited thereto.

Rest of a structure of the display substrate according to this embodiment may be referred to description of the aforementioned embodiments, and thus will not be repeated here.

In some exemplary implementation modes, at least one circuit unit of the display region may include a plurality of invalid pixel circuits. An orthographic projection of at least one second connection line on a base substrate may be overlapped with an orthographic projection of an invalid pixel drive circuit of at least one unit column on the base substrate. In some examples, the display region of the display substrate may include an Under Display Camera (UDC) region and a normal display region, and an orthographic projection of a photosensitive sensor (e.g., hardware such as a camera) on the display substrate may be located in the Under Display Camera region. By compressing pixel drive circuits of the display region, pixel drive circuits connected with light emitting elements located in the Under Display Camera region may be arranged, and invalid pixel drive circuits may also be generated simultaneously.

FIG. 16 is a schematic diagram of an arrangement of circuit units according to at least one embodiment of the present disclosure. In some examples, a plurality of unit columns of the display region may include a plurality of first unit columns 75 and a plurality of second unit columns 76. A first unit column 75 may include a plurality of valid pixel drive circuits. A second unit column 76 may include a plurality of invalid pixel drive circuits. The first unit columns 75 and the second unit columns 76 may be arranged at intervals along a first direction X. For example, four first unit columns 75 may be disposed between two adjacent second unit columns 76. However, this embodiment is not limited thereto. For example, one or more first unit columns may be disposed between two adjacent second unit columns.

Figure 17:
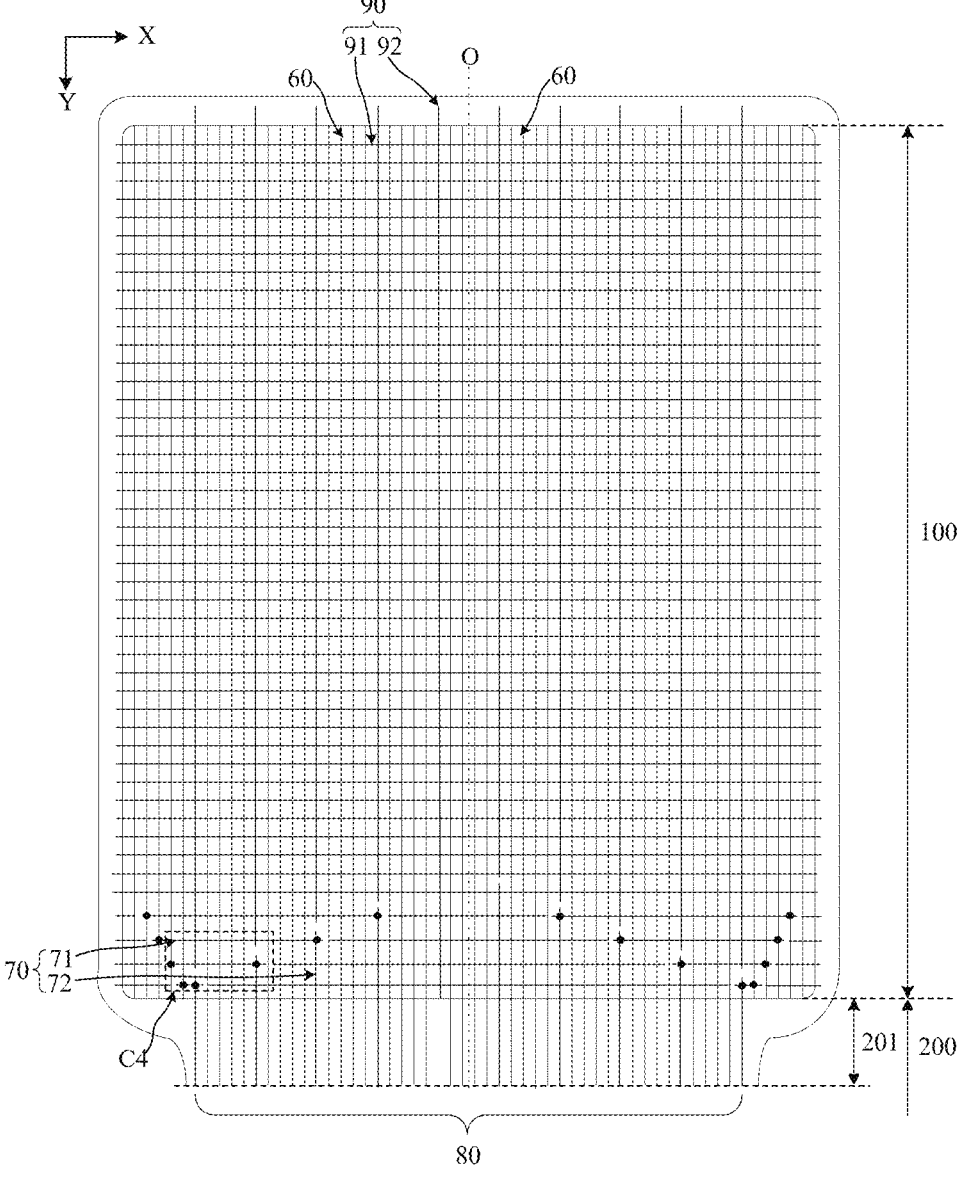
FIG. 17 is a schematic diagram of another planar structure of a display substrate according to at least one embodiment of the present disclosure.
Figure 18A:
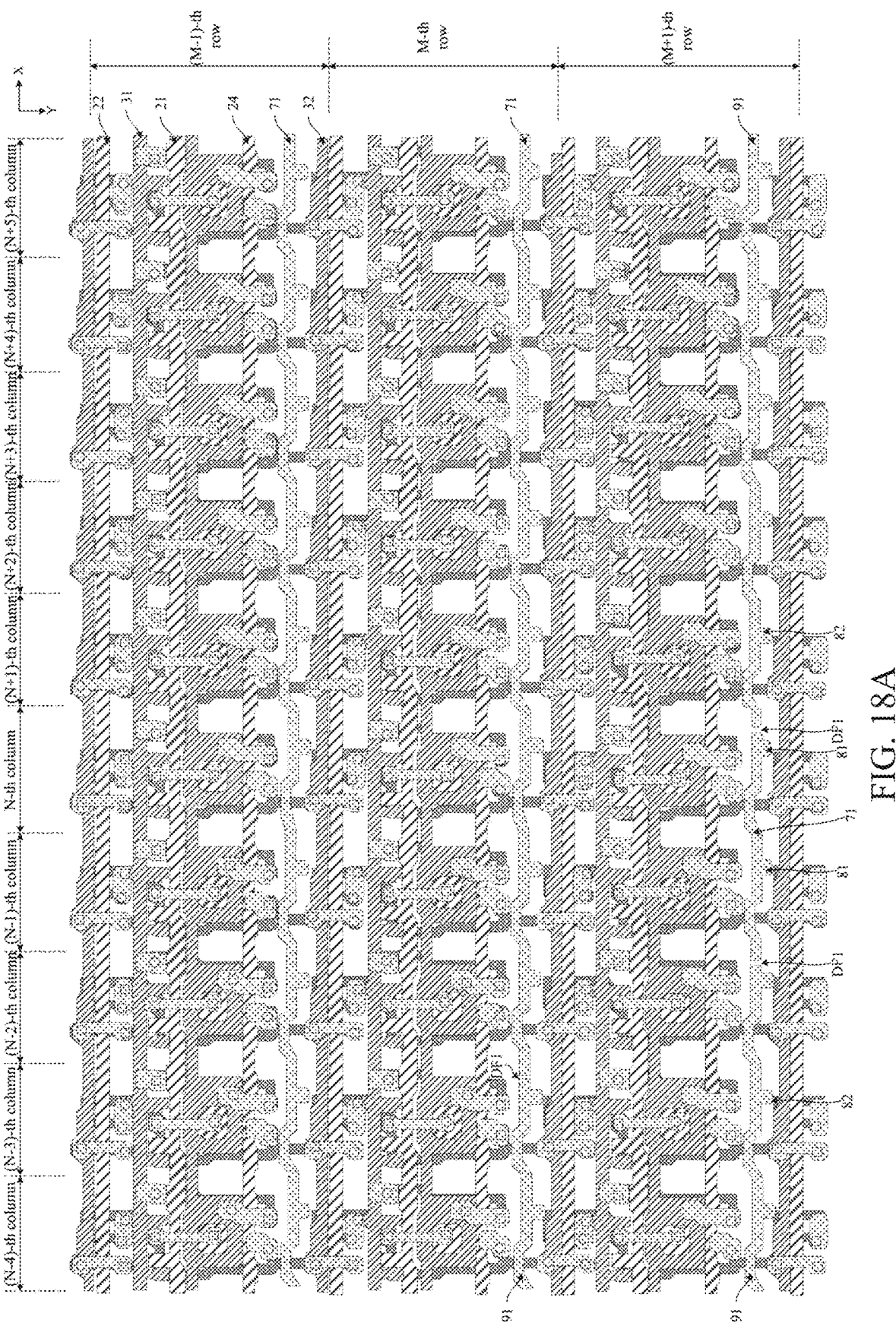
FIG. 18A is a partial enlarged schematic diagram of a display substrate after a third conductive layer is formed in a region C4 in FIG. 17.
Figure 18B:
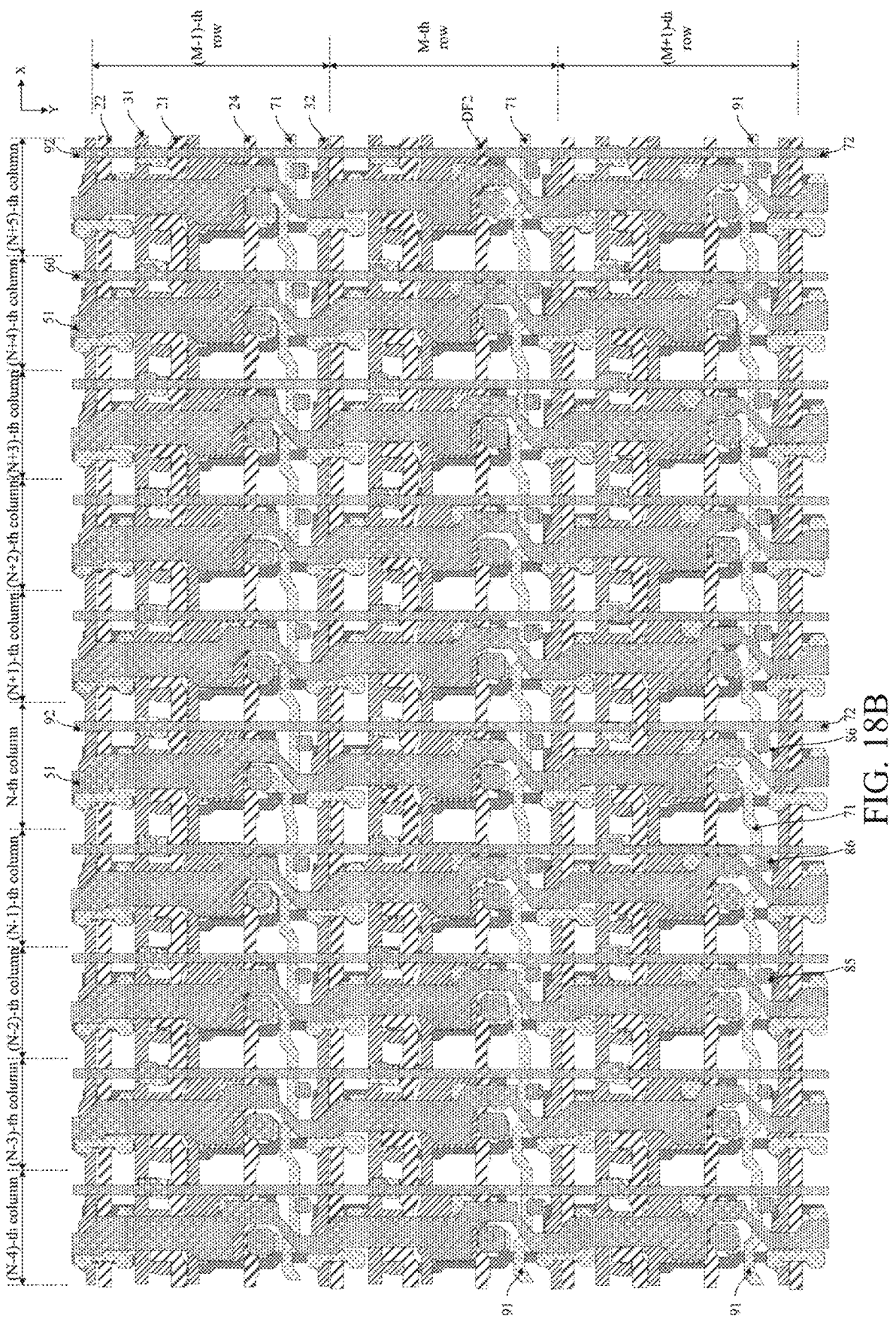
FIG. 18B is a partial enlarged schematic diagram of a display substrate after a fourth conductive layer is formed in the region C4 in FIG. 17.
Figure 18C:
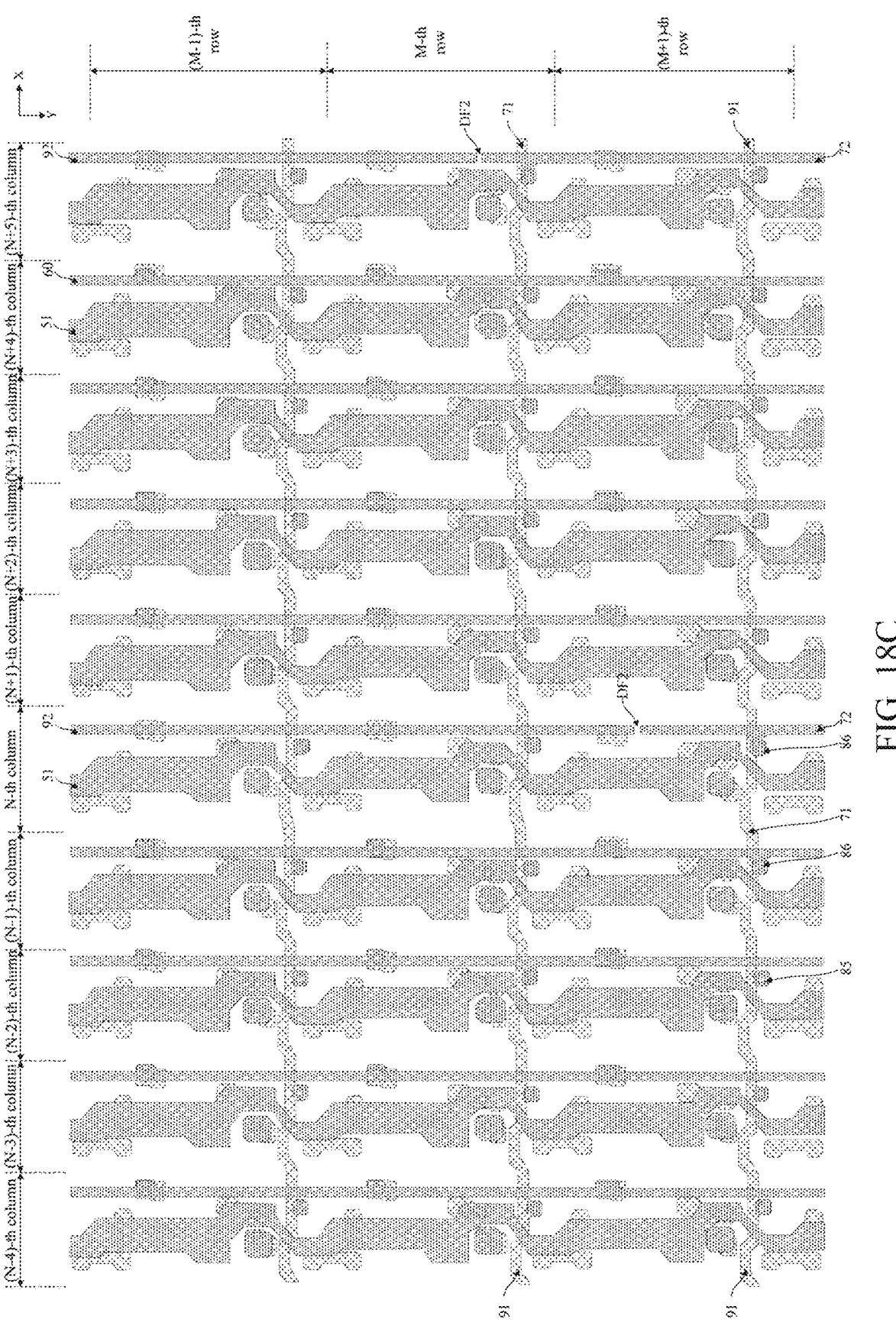
FIG. 18C is a schematic diagram of a third conductive layer and a fourth conductive layer in FIG. 18B.

FIG. 17 is a schematic diagram of another planar structure of a display substrate according to at least one embodiment of the present disclosure. FIG. 18A is a partial enlarged schematic diagram of a display substrate after a third conductive layer is formed in a region C4 in FIG. 17. FIG. 18B is a partial enlarged schematic diagram of a display substrate after a fourth conductive layer is formed in the region C4 in FIG. 17. FIG. 18C is a schematic diagram of a third conductive layer and a fourth conductive layer in FIG. 18B.

In some examples, as shown in FIG. 17, second connection lines 72 may be arranged in a unit column including an invalid pixel drive circuit (i.e., the aforementioned second unit column). At least one second unit column may include at least one second connection line 72 and at least one second compensation trace 92. For example, at least one second unit column may include one second connection line 72 and one second compensation trace 92. However, this embodiment is not limited thereto.

In some examples, as shown in FIG. 18A to FIG. 18C, a drive circuit layer of the display substrate may include a semiconductor layer, a first conductive layer, a second conductive layer, a third conductive layer, and a fourth conductive layer which are disposed on a base substrate. A first insulation layer is disposed between the semiconductor layer and the first conductive layer. A second insulation layer is disposed between the first conductive layer and the second conductive layer. A third insulation layer is disposed between the second conductive layer and the third conductive layer. A fourth insulation layer is disposed between the third conductive layer and the fourth conductive layer. The drive circuit layer of this example may include two source-drain metal layers.

In some examples, as shown in FIG. 18A, the third conductive layer of a display region may at least include a first connection line 71, a first compensation trace 91, a first data connection electrode 81, and a first compensation connection electrode 82. In some examples, a shape of the first connection line 71 may be a polygonal line shape of which a main body portion extends along a second direction Y. For example, the first connection line 71 may be a curve or an S-shaped line. The first connection line 71 and a plurality of first data connection electrodes 81 may be of an integral structure. A shape of the first compensation trace 91 may be a polygonal line shape of which a main body portion extends along the second direction Y. For example, the first compensation trace 91 may be a curve or an S-shaped line. The first compensation trace 91 and a plurality of first compensation connection electrodes 82 may be of an integral structure.

In some examples, as shown in FIG. 18B, the fourth conductive layer of the display region may at least include a second connection line 72, a second compensation trace 92, a data signal line 60, a first power supply line 51, a second data connection electrode 86, a dummy electrode 85, and a second compensation connection electrode. The second connection line 72 and a second data connection electrode 86 adjacent thereto may be of an integral structure. The data signal line 60 and a second data connection electrode 86 adjacent thereto may be of an integral structure. In some examples, a second unit column (i.e., a unit column including an invalid pixel circuit) may not be provided with a data signal line, leaving space for arranging a second connection line and a second compensation trace. For example, the second unit column may be arranged with at least one second connection line and a second compensation trace. In some examples, an anode connection electrode of the fourth conductive layer of the second unit column and a first power supply line may not be electrically connected with the third conductive layer. However, this embodiment is not limited thereto.

In some examples, as shown in FIG. 18A to FIG. 18C, an N-th column and an (N+5)-th column may be second unit columns. An (N−4)-th column to an (N−1)-th column and an (N+1)-th column to an (N+4)-th column may be first unit columns. The fourth conductive layer of the N-th column and the (N+5)-th column may include a first power supply line 51, a second connection line 72, a second compensation trace 92, a second data connection electrode 86, and a dummy electrode 85. The first power supply line of the fourth conductive layer of the second unit columns may not be electrically connected with the third conductive layer. In the second unit columns, the first power supply line 51 may be adjacent to the second connection line 72 and the second compensation trace 92. The fourth conductive layer of the (N−4)-th column to the (N−1)-th column and the (N+1)-th column to the (N+4)-th column may include a first power supply line 51, a data signal line 60, a dummy electrode 85, and a second data connection electrode 86.

In some examples, as shown in FIG. 18A to FIG. 18C, a second connection line 72 located in an N-th column may be electrically connected with a data signal line 60 located in an (N−1)-th column through a first connection line 71 located in an (M+1)-th row. A second connection line 72 located in an (N+5)-th column may be electrically connected with a data signal line 60 located in an (N−2)-th column through a first connection line 71 located in an M-th row. Among them, one end of a first connection line 71 and a first data connection electrode 81 may be of an integral structure, and the first data connection electrode 81 may be electrically connected with a second data connection electrode 86 through a via of the fourth insulation layer. Since the second data connection electrode 86 and a data signal line 60 may be of an integral structure, an electrical connection between the first connection line 71 and the data signal line 60 is achieved. The other end of the first connection line 71 and another first data connection electrode 81 may be of an integral structure, and the first data connection electrode 81 may be electrically connected with another second data connection electrode 86 through a via of the fourth insulation layer. Since the second data connection electrode 86 and a second connection line 72 may be of an integral structure, an electrical connection between the first connection line 71 and the second connection line 72 is achieved.

In some examples, a dummy electrode 85 may present a same morphology and structure as a second compensation connection electrode and a second data connection electrode 86, which not only may improve uniformity of a preparation process, but also enables different regions to have substantially a same transfer connection structure, and different regions may each achieve substantially a same display effect under transmitted light and reflected light, thus effectively eliminating a shadow elimination situation, effectively avoiding poor appearance of the display substrate, and improving display character and display quality.

In this example, by disposing a second connection line and a second compensation trace in a second unit column, a collective arrangement of a large number of traces may be avoided, so that substantially a same display effect may be achieved in different regions under transmitted light and reflected light, which effectively eliminates a shadow elimination situation, effectively avoids poor appearance of the display substrate, and improves display character and display quality.

Rest of a structure of the display substrate according to this embodiment may be referred to description of the aforementioned embodiments, and thus will not be repeated here.

Figure 19:
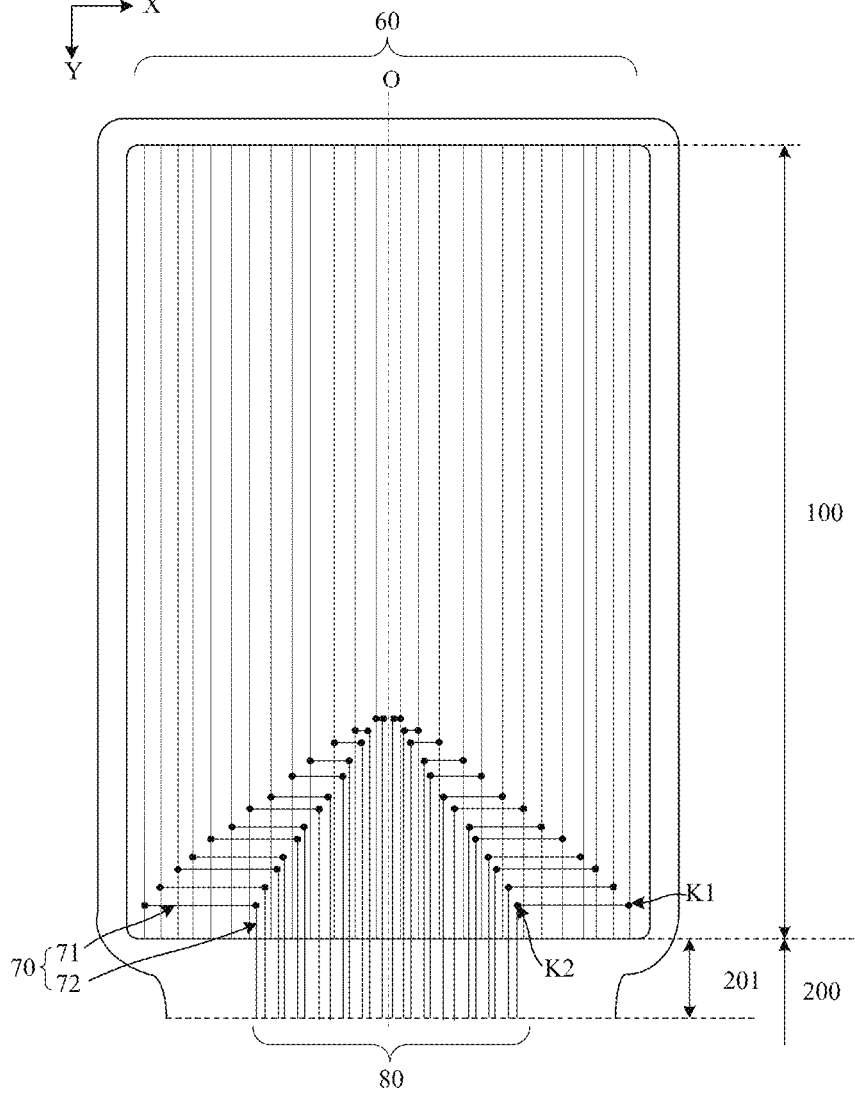
FIG. 19 is a schematic diagram of another planar structure of a display substrate according to at least one embodiment of the present disclosure.

FIG. 19 is a schematic diagram of another planar structure of a display substrate according to at least one embodiment of the present disclosure. In some exemplary implementation modes, as shown in FIG. 19, a plurality of data signal lines 60 of a display region 100 may extend along a second direction Y and are sequentially arranged at a set interval along a first direction X in an increasing number manner. The plurality of data signal lines 60 of the display region may each be connected correspondingly with data connection lines 70. A plurality of lead-out lines 80 of a lead region 201 may each be connected correspondingly with the data connection lines 70. In this example, all lead-out lines 80 may not be directly connected with the data signal lines 60, but may be connected through the data connection lines 70. In this example, all the data signal lines 60 are connected with the lead-out lines 80 through the data connection lines 70.

In some examples, as shown in FIG. 19, a data connection line 70 may include a first connection line 71 extending along the first direction X, and a second connection line 72 extending along the second direction Y. For example, the display region has a center line O in the first direction X. Within a region on a side of the center line O, a first connection line 71, which is electrically connected with a data signal line 60 close to the center line O, may be located on a side of a first connection line 71, which is electrically connected with a data signal line 60 away from the center line O, away from a bonding region 200. A second connection line 72, which is electrically connected with a data signal line 60 close to the center line O, may be located on a side a second connection line 72, which is electrically connected with a data signal line 60 away from the center line O, close to the center line O. In this example, within the region on the side of the center line O, lengths of a plurality of first connection lines 71 along the first direction X may gradually increase along the second direction. Lengths of the plurality of second connection lines 72 along the second direction Y may gradually increase along the first direction X. However, this embodiment is not limited thereto.

Figure 20:
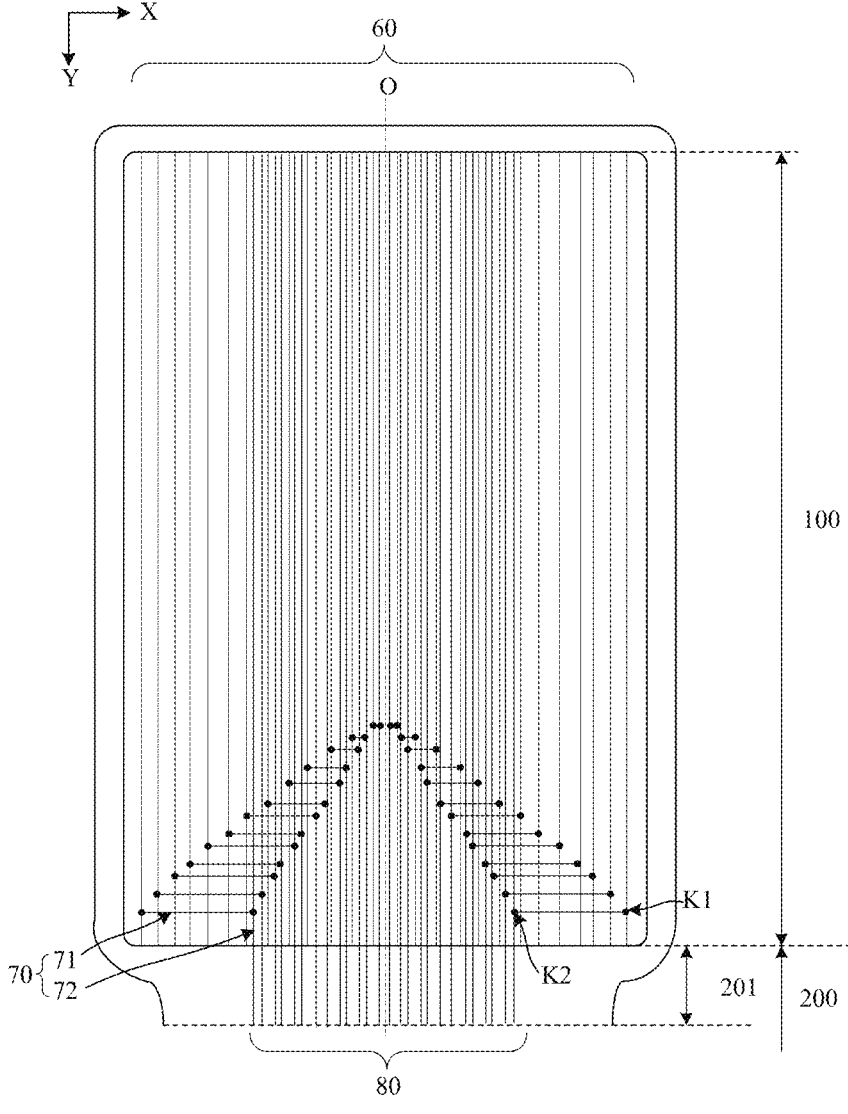
FIG. 20 is a schematic diagram of another planar structure of a display substrate according to at least one embodiment of the present disclosure.

FIG. 20 is a schematic diagram of another planar structure of a display substrate according to at least one embodiment of the present disclosure. In some examples, as shown in FIG. 20, a plurality of second connection line 72 may penetrate through a display region 100 along a second direction Y. One end of a second connection line 72 may extend to a boundary between a bezel region on an upper side and the display region 100, and the other end may extend to a boundary between the display region 100 and a bonding region 200. Rest of a structure of the display substrate according to this embodiment may be referred to description of the embodiment shown in FIG. 19, and thus will not be repeated here.

Figure 21:
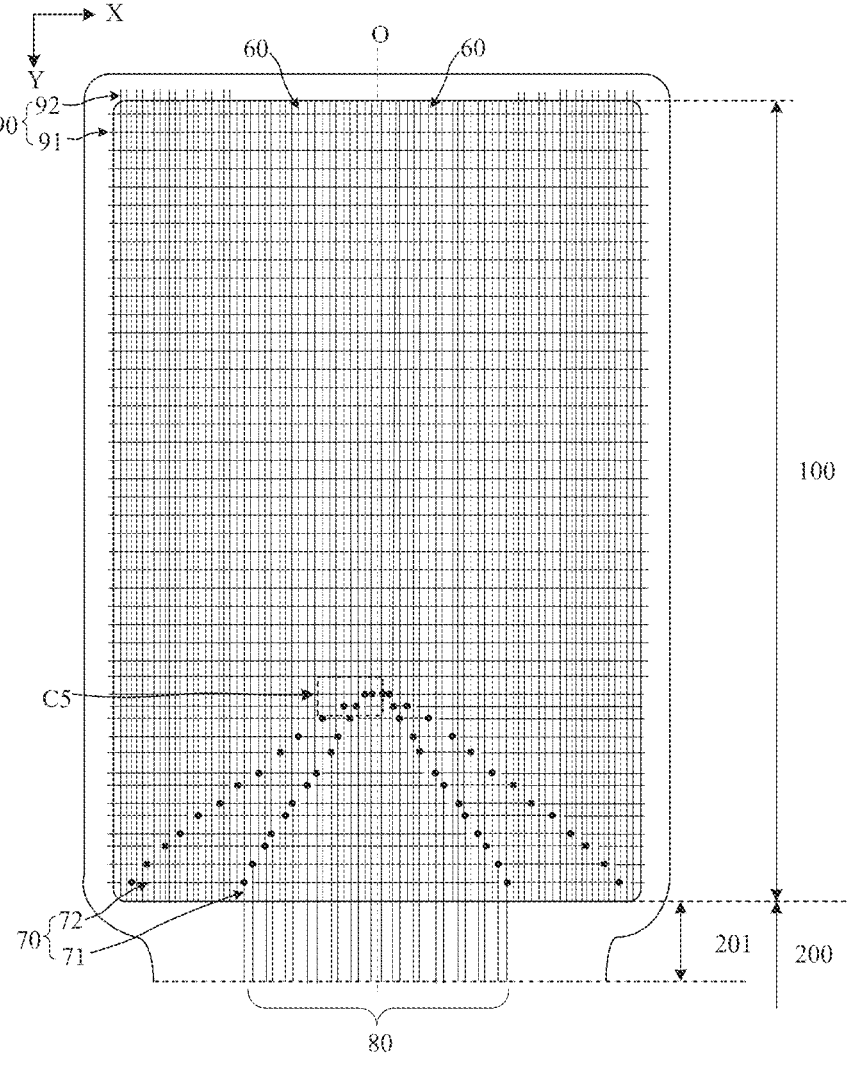
FIG. 21 is a schematic diagram of another planar structure of a display substrate according to at least one embodiment of the present disclosure.
Figure 22:
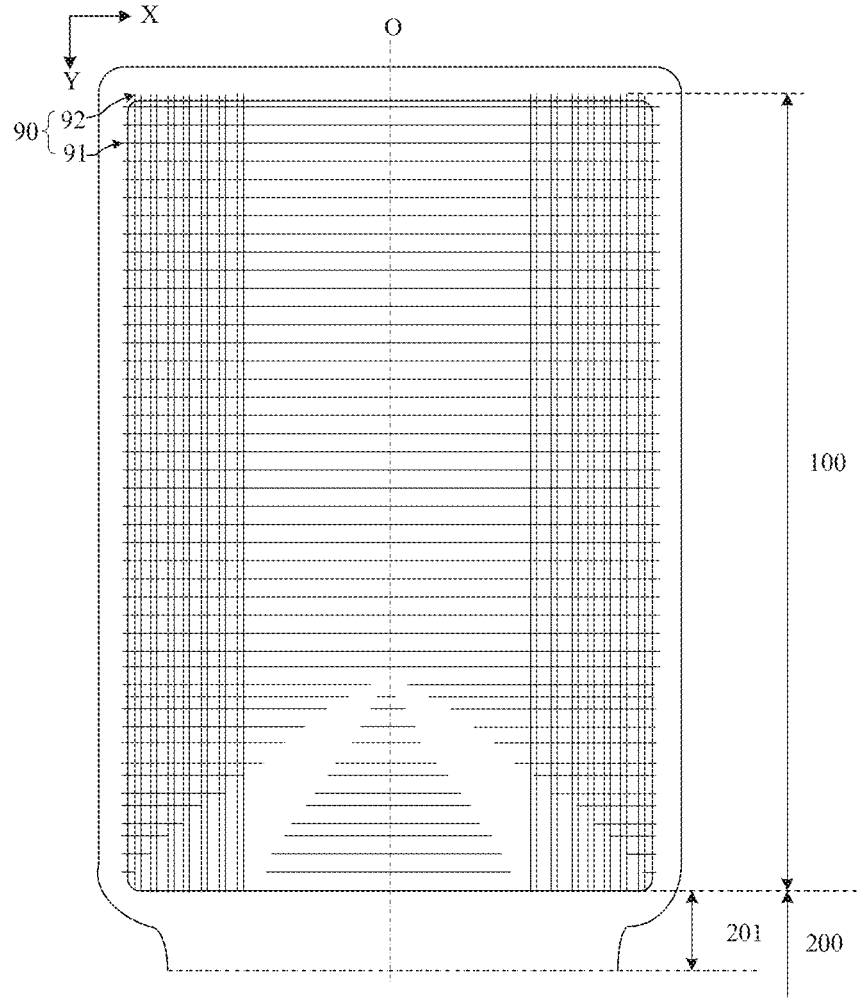
FIG. 22 is a view of a planar structure of a compensation trace according to at least one embodiment of the present disclosure.

FIG. 21 is a schematic diagram of another planar structure of a display substrate according to at least one embodiment of the present disclosure. FIG. 22 is a view of a planar structure of a compensation trace according to at least one embodiment of the present disclosure. In some examples, as shown in FIG. 21 and FIG. 22, a drive circuit layer of a display region 100 may include a plurality of circuit units constituting an array of circuit units, a plurality of data signal lines 60, a plurality of data connection lines 70, and compensation traces 90. Layouts and structures of the plurality of circuit units, the plurality of data signal lines 60, and the plurality of data connection lines 70 are substantially the same as those shown in FIG. 20. The compensation traces 90 may include a plurality of first compensation traces 91 extending along a first direction X and a plurality of second compensation traces 92 extending along a second direction Y. The plurality of first compensation traces 91 may be disposed sequentially along the second direction Y, and the plurality of second compensation traces 92 may be disposed sequentially along the first direction X. The first compensation traces 91 and the second compensation traces 92 may be disposed in different conductive layers. For example, a first compensation trace 91 and a first connection line 71 may be disposed in a same layer, and a second compensation trace 92 and a second connection line 72 may be disposed in a same layer.

Figure 23A:
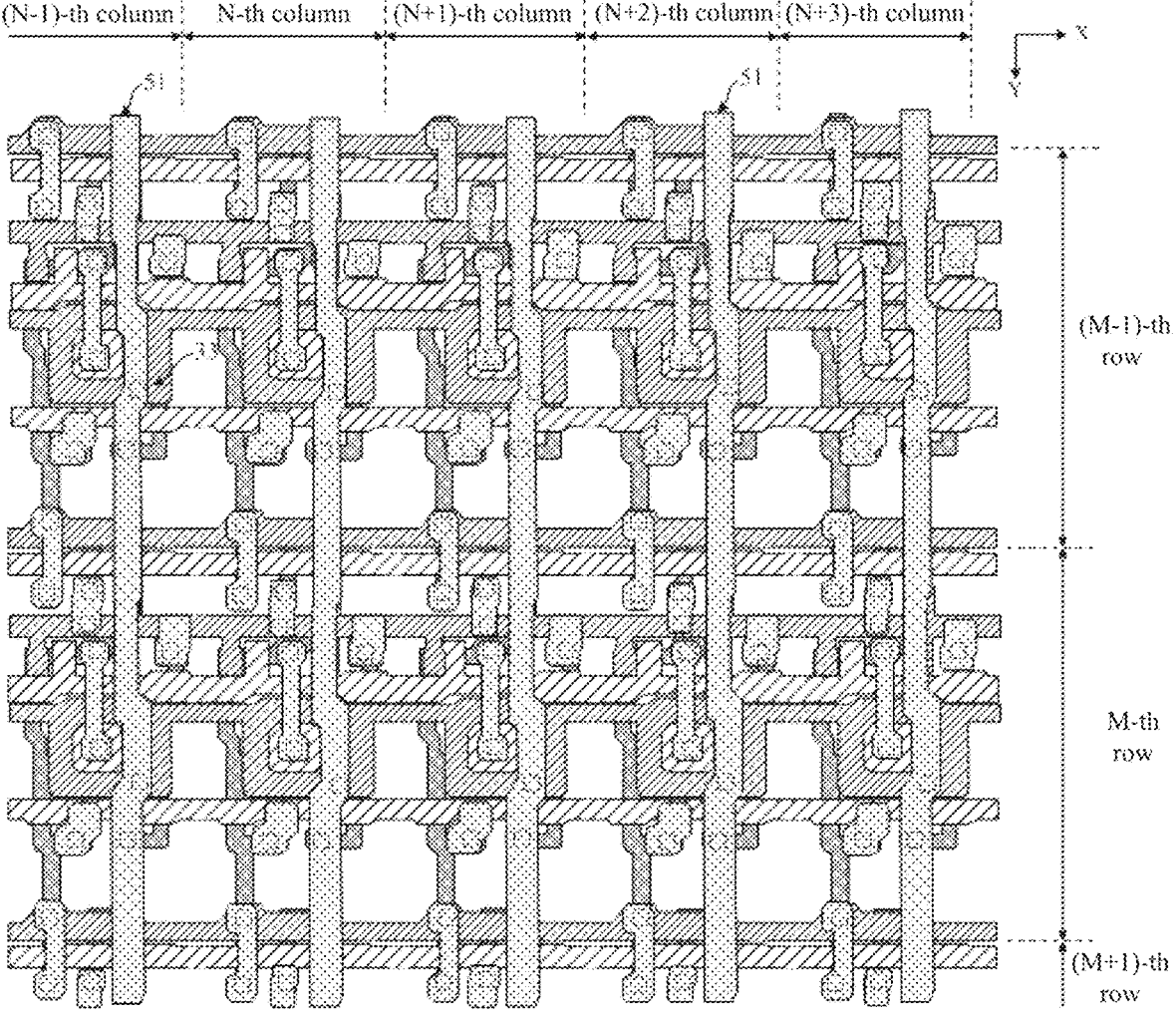
FIG. 23A is a partial enlarged schematic diagram of a display substrate after a third conductive layer is formed in a region C5 in FIG. 21.
Figure 23B:
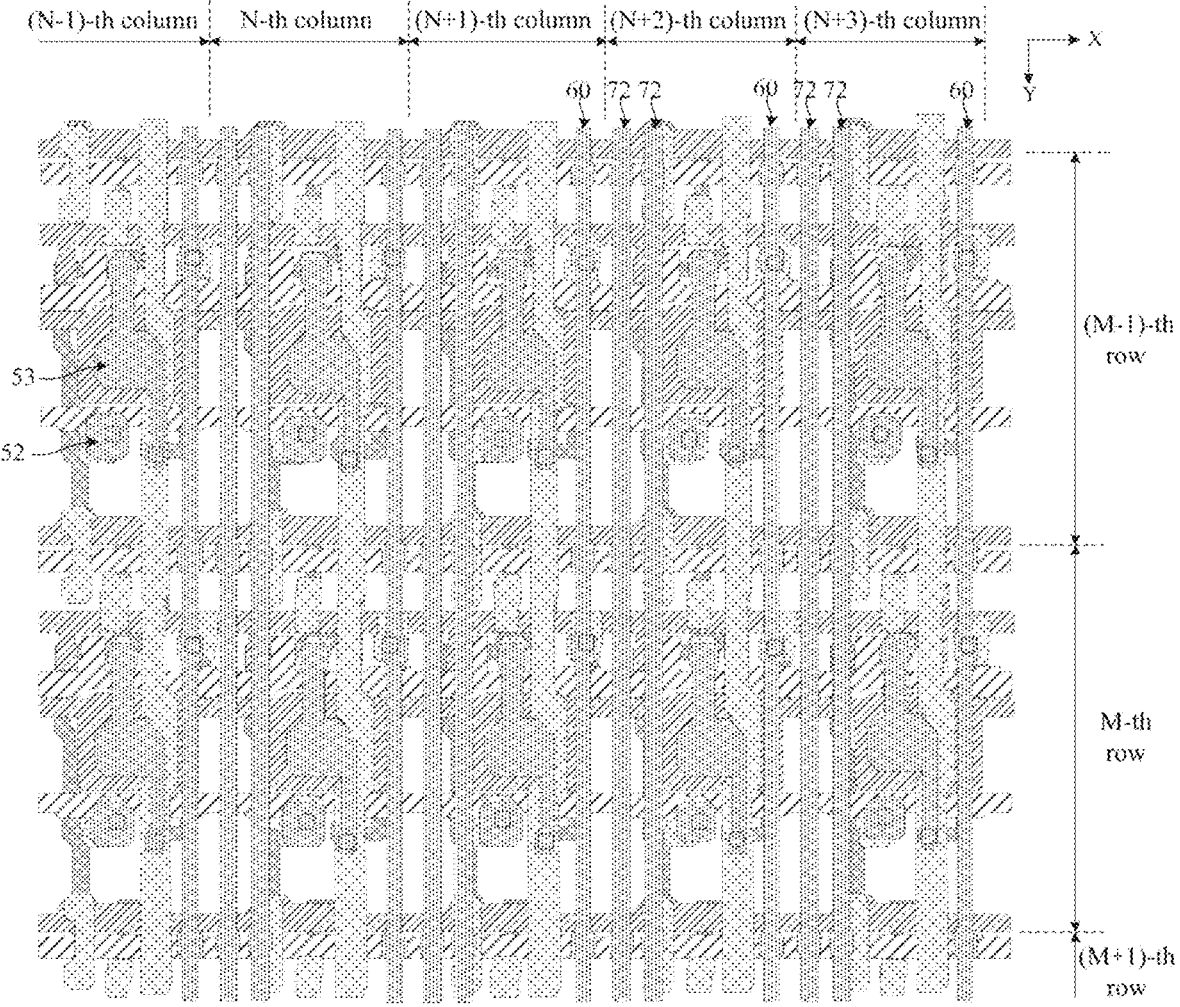
FIG. 23B is a partial enlarged schematic diagram of a display substrate after a fourth conductive layer is formed in the region C5 in FIG. 21.
Figure 23C:
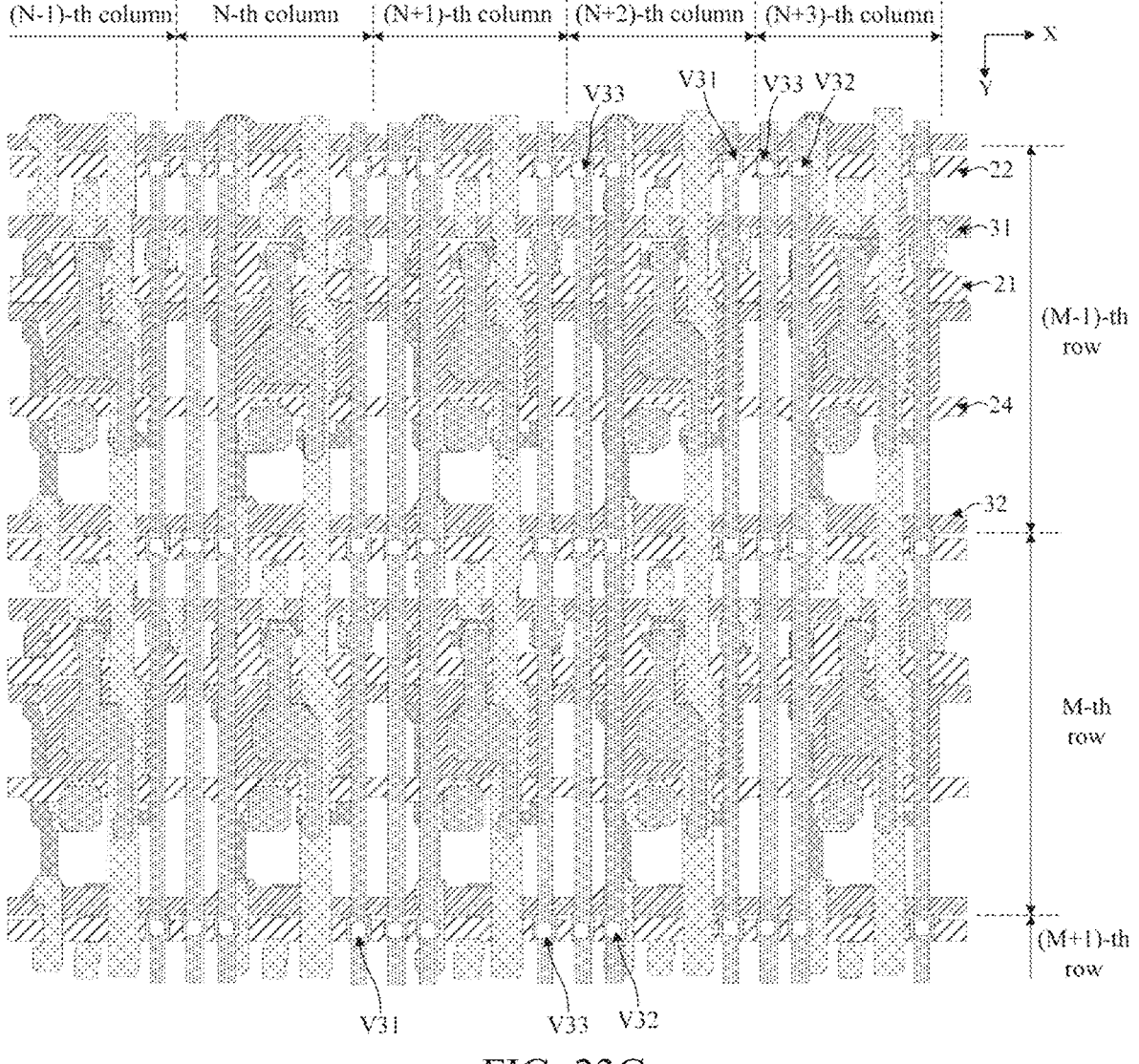
FIG. 23C is a partial enlarged schematic diagram of a display substrate after a fifth insulation layer is formed in the region C5 in FIG. 21.
Figure 23D:
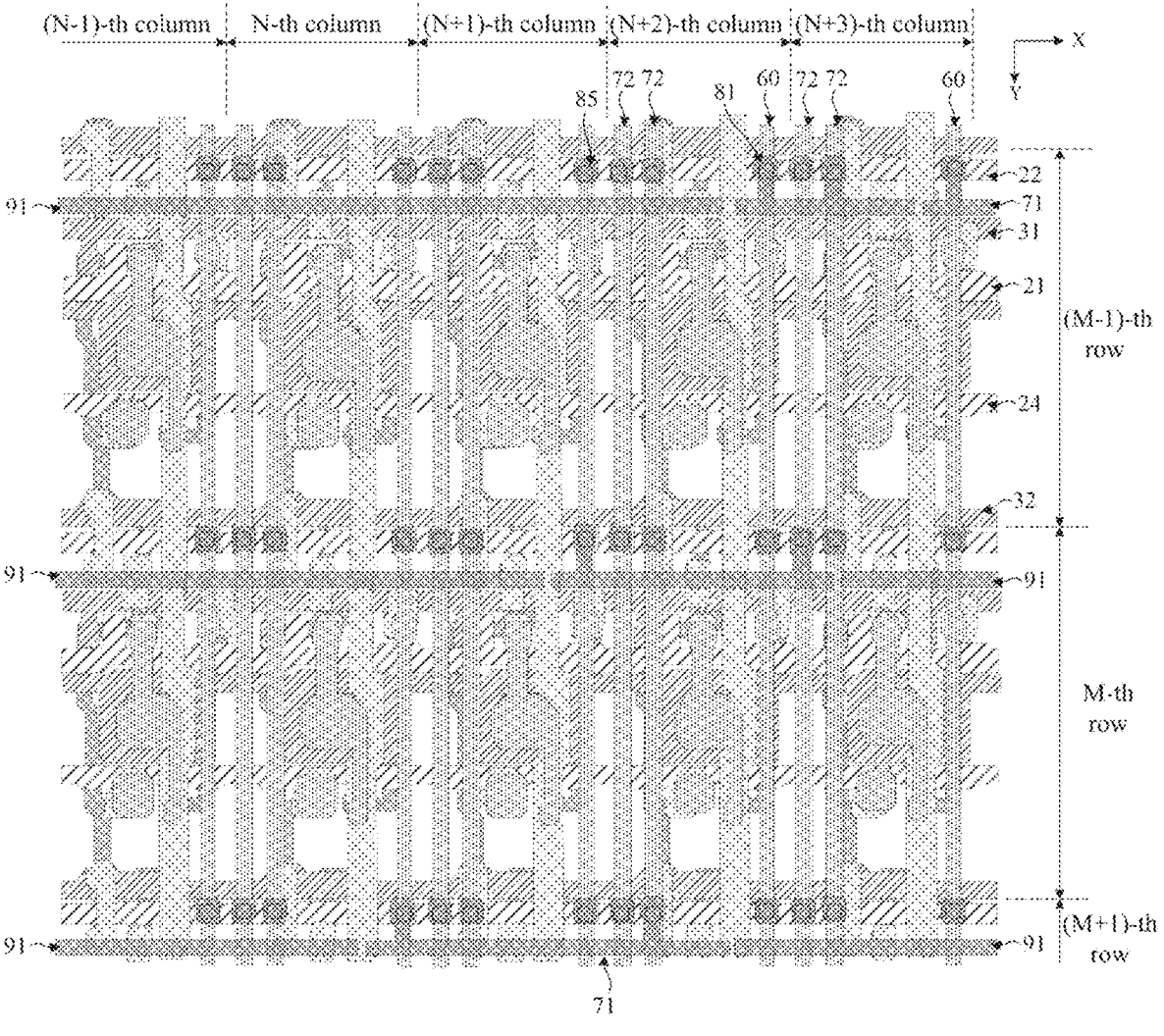
FIG. 23D is a partial enlarged schematic diagram of a display substrate after a fifth conductive layer is formed in the region C5 in FIG. 21.
Figures 23E, 24:
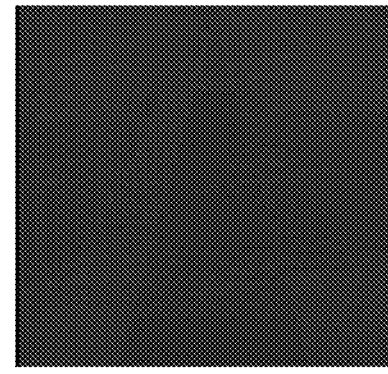
FIG. 23E is a partial enlarged schematic diagram of a third conductive layer, a fourth conductive layer, and a fifth conductive layer of the region C5 in FIG. 21.
FIG. 24 is a schematic diagram of an appearance effect of a display substrate according to at least one embodiment of the present disclosure.

FIG. 23A is a partial enlarged schematic diagram of a display substrate after a third conductive layer is formed in a region C5 in FIG. 21. FIG. 23B is a partial enlarged schematic diagram of a display substrate after a fourth conductive layer is formed in the region C5 in FIG. 21. FIG. 23C is a partial enlarged schematic diagram of a display substrate after a fifth insulation layer is formed in the region C5 in FIG. 21. FIG. 23D is a partial enlarged schematic diagram of a display substrate after a fifth conductive layer is formed in the region C5 in FIG. 21. FIG. 23E is a partial enlarged schematic diagram of a third conductive layer, a fourth conductive layer, and a fifth conductive layer of the region C5 in FIG. 21. In FIG. 23A to FIG. 23E, only structures of several unit rows (e.g., including an (M−1)-th row and an M-th row) and several unit columns (e.g., including an (N−1)-th column to an (N+3)-th column) in the region C5 are illustrated.

In some exemplary implementation modes, a drive circuit layer of the display substrate may include a semiconductor layer, a first conductive layer, a second conductive layer, a third conductive layer, a fourth conductive layer, and a fifth conductive layer which are sequentially disposed on a base substrate. A first insulation layer is disposed between the semiconductor layer and the first conductive layer. A second insulation layer is disposed between the first conductive layer and the second conductive layer. A third insulation layer is disposed between the second conductive layer and the third conductive layer. A fourth insulation layer is disposed between the third conductive layer and the fourth conductive layer. A fifth insulation layer is disposed between the fourth conductive layer and the fifth conductive layer. The drive circuit layer of this example may include three source-drain metal layers.

In some examples, as shown in FIG. 23A, the third conductive layer of a display region may include a plurality of connection electrodes and a first power supply line 51. The first power supply line 51 may be connected with a second electrode plate 33 of a storage capacitor and a first region of a fifth active layer through a via disposed in the third insulation layer. Description of the plurality of connection electrodes of the third conductive layer, the third insulation layer, the second conductive layer, the second insulation layer, the first conductive layer, the first insulation layer, and the semiconductor layer may be referred to relevant description of the aforementioned embodiments, and therefore will not be repeated here.

In some examples, as shown in FIG. 23B, the fourth conductive layer of the display region may at least include an anode connection electrode 52, a shielding electrode 53, a data signal line 60, a second connection line 72, and a second compensation trace. The shielding electrode 53 may be electrically connected with a first power supply line 51 through a via disposed in the fourth insulation layer. In some examples, a gate electrode of a third transistor T3, a second electrode of a first transistor T1, a first electrode of a second transistor T2, and a first electrode plate of a storage capacitor of a pixel drive circuit are electrically connected with a first node N1. An orthographic projection of the shielding electrode 53 on the base substrate may cover an orthographic projection of the first node N1 on the base substrate, which may thereby effectively shield an influence of data voltage jump on a key node in the pixel drive circuit, avoid an influence of the data voltage jump on a potential of the key node in the pixel drive circuit, and improve a display effect. At least one unit column may be provided with a data signal line 60 and at least two second connection lines 72. The two second connection lines 72 may be adjacent to the data signal line 60. For example, an orthographic projection of the data signal line 60 on the base substrate may be located between orthographic projections of the first power supply line 51 and the second connection lines 72 on the base substrate. However, this embodiment is not limited thereto. For example, at least one unit column may include a plurality of second connection lines. For another example, two adjacent unit columns may include three second connection lines.

In some examples, as shown in FIG. 23C, the fifth insulation layer of the display region may be provided with a plurality of vias. For example, the plurality of vias disposed in the fifth insulation layer may include a thirty-first via V31 to a thirty-third via V33. The fifth insulation layer within the thirty-first via V31 to the thirty-third via V33 may be removed to expose a surface of the fourth conductive layer. For example, the plurality of vias disposed in the fifth insulation layer may be arranged sequentially along a first direction X. For example, orthographic projections of a plurality of vias within one unit row on the base substrate may be overlapped with an orthographic projection of a second scan line 22 of the present unit row on the base substrate. In this example, by disposing a plurality of vias regularly arranged, it is helpful to improve uniformity of a preparation process.

In some examples, as shown in FIG. 23D, the fifth conductive layer of the display region may include a first connection line 71 and a first compensation trace 91 extending along a first direction X, a first data connection electrode 81, and a dummy electrode 85. The first connection line 71 and the first compensation trace 91 may be in a straight line shape extending along the first direction X. Both ends of the first connection line 71 may be electrically connected with the first data connection electrode 81, respectively, for example, may be of an integral structure. For example, a first end of a first connection line 71 located in an (M−1)-th row may be electrically connected with a data signal line 60 located in an (N+2)-th column through a first data connection electrode 81 via the thirty-first via V31, and a second end may be electrically connected with one second connection line 72 located in an (N+3)-th column through another first data connection electrode 81 via the thirty-second via V32. A first end of a first connection line 71 located in an M-th row may be electrically connected with a data signal line 60 located in an (N+1)-th column through one first data connection electrode 81 via the thirty-first via V31, and a second end may be electrically connected with another second connection line 72 located in an (N+3)-th column through another first data connection electrode 81 via the thirty-second via V32. Similarly, a data signal line 60 located in the (N+3)-th column may be electrically connected with one second connection line 72 on a right side of this data signal line 60 through another first connection line 71 located in the (M−1)-th row. In this example, a first data connection electrode may be directly electrically connected with a data signal line or a second connection line without being transferred through another connection electrode, thereby saving arrangement space. However, this embodiment is not limited thereto. In other examples, the fourth conductive layer may further include a second data connection electrode and a second compensation connection electrode. The second data connection electrode and a data signal line or a second connection line may be of an integral structure, and the second compensation connection electrode and a second compensation trace may be of an integral structure. A first data connection electrode may be electrically connected with the second data connection electrode, and the second compensation connection electrode may be electrically connected with a first compensation connection electrode.

In some examples, as shown in FIG. 23D and FIG. 23E, a plurality of first data connection electrodes 81 and a plurality of dummy electrodes 85 may be located on a same side of a first connection line 71 in a second direction Y. In one unit row, a plurality of first data connection electrodes 81 and a plurality of dummy electrodes 85 may be aligned and arranged along a first direction X. A dummy electrode 85 may be electrically connected with a data signal line 60 or a second connection line 72 through the thirty-third via V33. An orthographic projection of the dummy electrode 85 on the base substrate may be at least partially overlapped with an orthographic projection of the data signal line 60 or the second connection line 72 on the base substrate. The dummy electrode 85 may present a same morphology and structure as the first data connection electrode 81, which not only may improve uniformity of a preparation process, but also enables different regions to have substantially a same transferring connection structure, and different regions may each achieve substantially a same display effect under transmitted light and reflected light, thus effectively eliminating a shadow elimination situation, effectively avoiding poor appearance of the display substrate, and improving display character and display quality.

In some examples, the fifth conductive layer of the display region may further include a plurality of first compensation connection electrodes. A first compensation trace 91 and the plurality of first compensation connection electrodes may be of an integral structure. The first compensation trace 91 may be electrically connected with a second compensation trace 92 through a first compensation connection electrode. A morphology and structure of the first compensation connection electrode may be the same as that of a first data connection electrode 81, thus uniformity of a preparation process may be improved.

In some examples, as shown in FIG. 23E, a first fracture DF1 is disposed between a first connection line 71 and a first compensation trace 91. An orthographic projection of the first fracture DF1 on the base substrate may be located within a region covered by the third conductive layer or the fourth conductive layer. For example, the orthographic projection of the first fracture DF1 on the base substrate may be covered by an orthographic projection of a second connection line of the fourth conductive layer on the base substrate. For another example, the orthographic projection of the first fracture DF1 on the base substrate may be covered by an orthographic projection of a first power supply line 51 of the third conductive layer on the base substrate.

Rest of a structure and a preparation process of the display substrate of this embodiment may be referred to description of the aforementioned embodiments, and thus will not be repeated here.

FIG. 24 is a schematic diagram of an appearance effect of a display substrate according to at least one embodiment of the present disclosure. In some examples, as shown in FIG. 24, in the display substrate according to this embodiment, a first connection line and a second connection line are arranged in different conductive layers, and a first compensation trace and a second compensation trace are disposed in a display region, which may make traces of different regions of the display region be consistent, except for a small difference at a fracture of a data connection line and a compensation trace, so that the different regions may each achieve substantially a same display effect under transmitted light and reflected light, thus effectively eliminating a shadow elimination situation, effectively avoiding poor appearance of the display substrate, and improving display character and display quality.

Figure 25A:
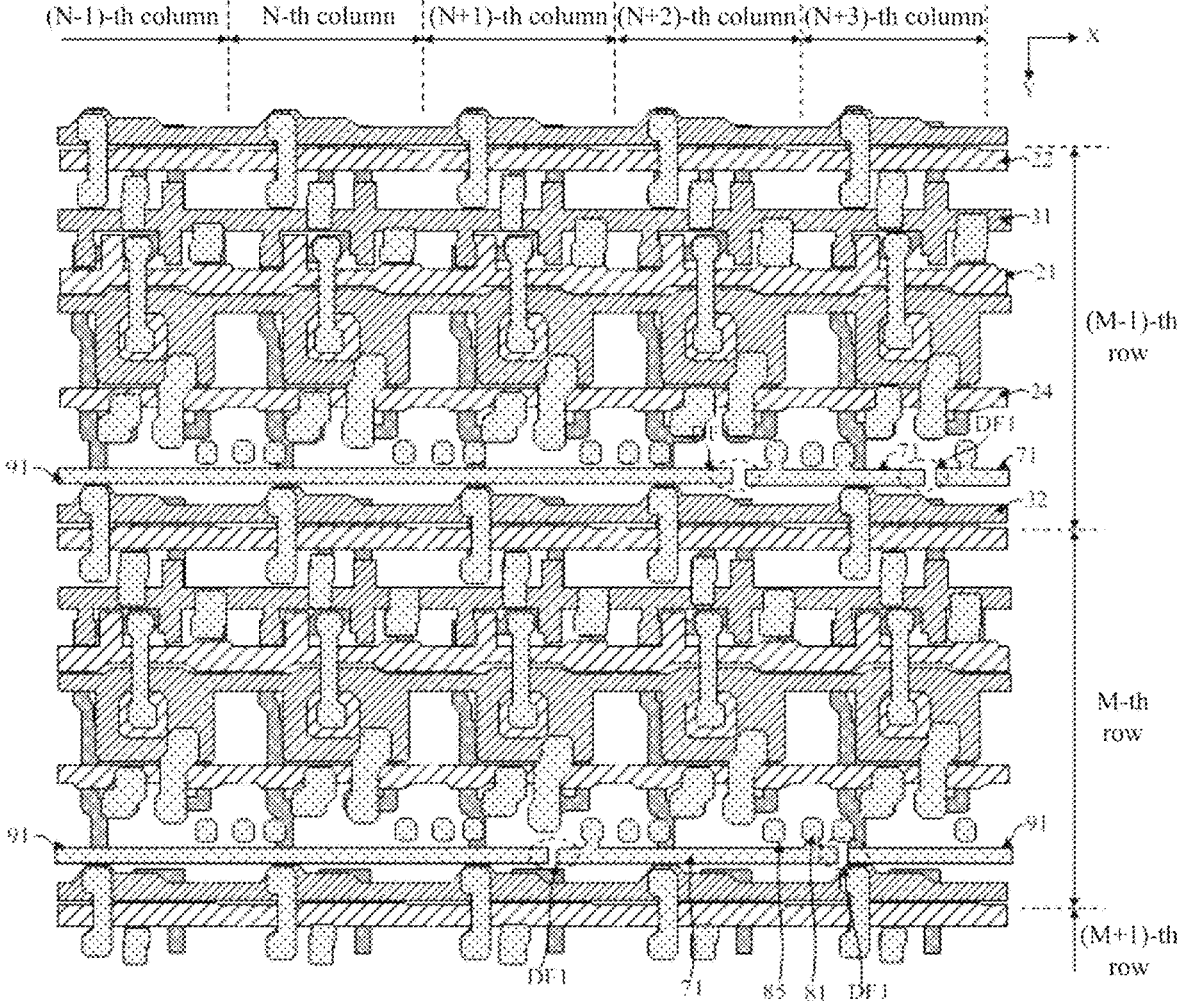
FIG. 25A is another partial enlarged schematic diagram of a display substrate after a third conductive layer is formed in the region C5 in FIG. 21.
Figure 25B:
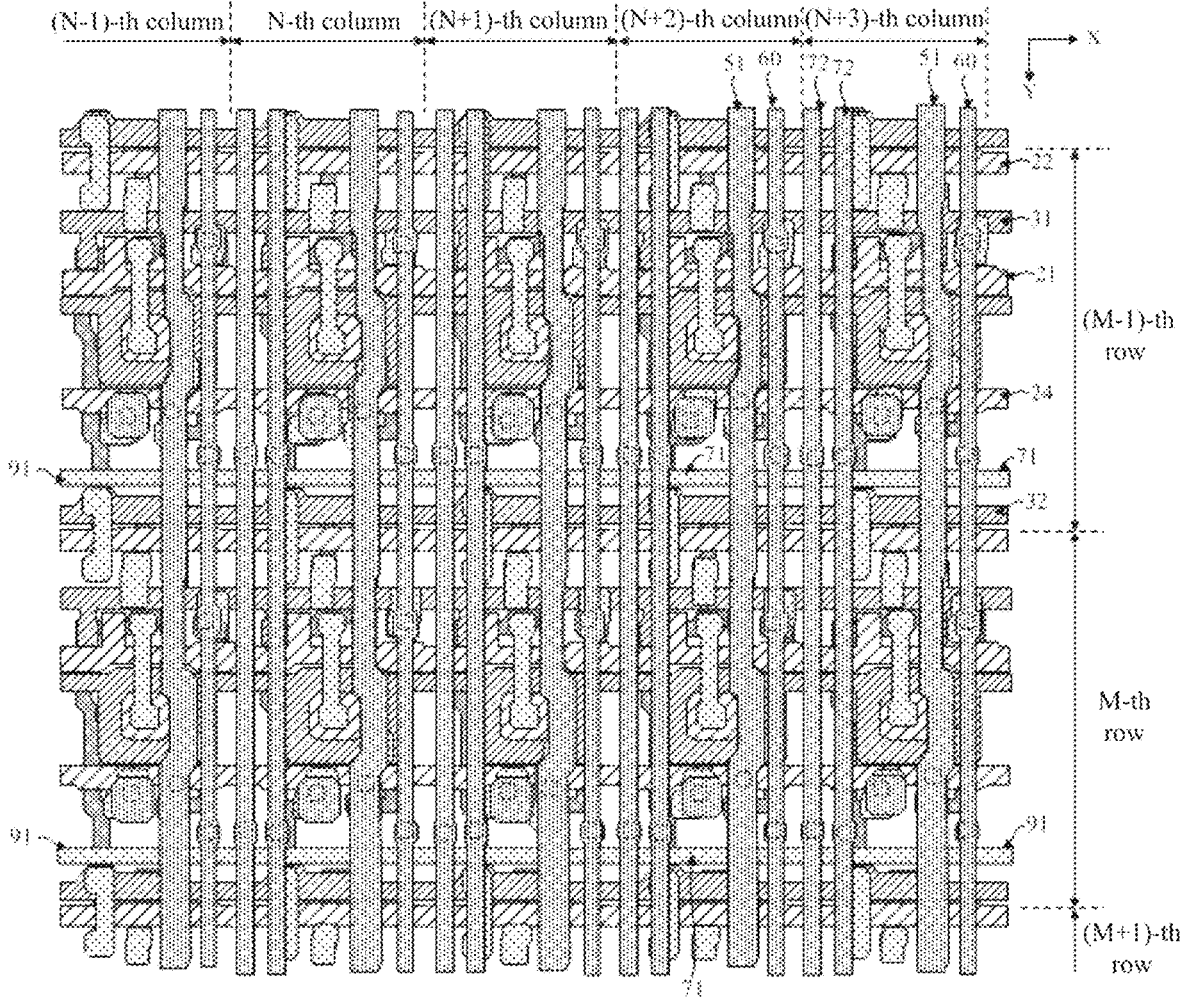
FIG. 25B is another partial enlarged schematic diagram of a display substrate after a fourth conductive layer is formed in the region C5 in FIG. 21.
Figure 25C:
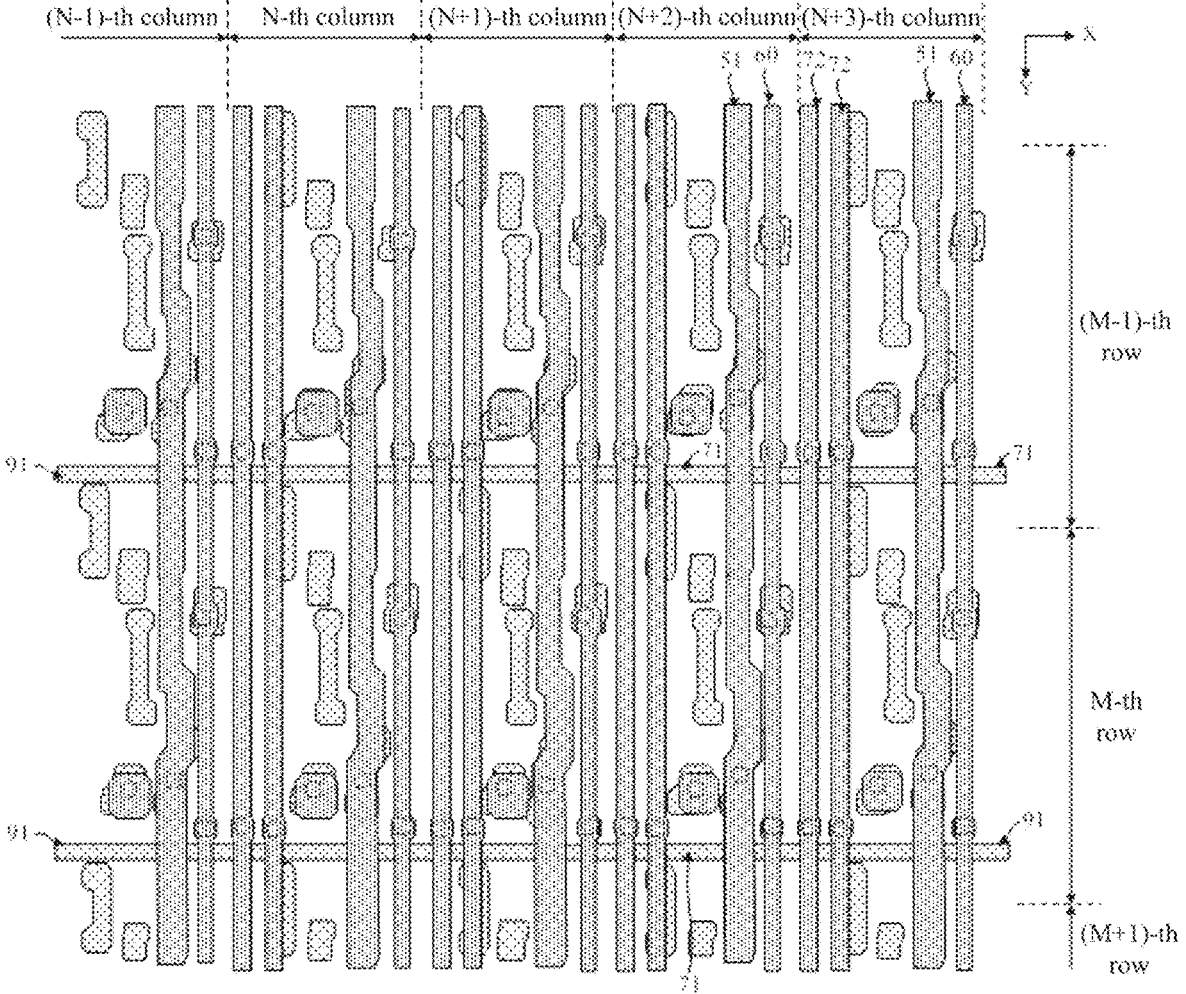
FIG. 25C is a partial enlarged schematic diagram of a third conductive layer and a fourth conductive layer of the region C5 in FIG. 21.

FIG. 25A is another partial enlarged schematic diagram of a display substrate after a third conductive layer is formed in the region C5 in FIG. 21. FIG. 25B is another partial enlarged schematic diagram of a display substrate after a fourth conductive layer is formed in the region C5 in FIG. 21. FIG. 25C is a partial enlarged schematic diagram of a third conductive layer and a fourth conductive layer of the region C5 in FIG. 21. In FIG. 25A to FIG. 25C, only structures of several unit rows (e.g., including an (M−1)-th row and an M-th row) and several unit columns (e.g., including an (N−1)-th column to an (N+3)-th column) in the region C5 are illustrated.

In some exemplary implementation modes, a drive circuit layer of the display substrate may include a semiconductor layer, a first conductive layer, a second conductive layer, and a third conductive layer, and a fourth conductive layer which are sequentially disposed on a base substrate. A first insulation layer is disposed between the semiconductor layer and the first conductive layer. A second insulation layer is disposed between the first conductive layer and the second conductive layer. A third insulation layer is disposed between the second conductive layer and the third conductive layer. A fourth insulation layer is disposed between the third conductive layer and the fourth conductive layer. The drive circuit layer of this example may include two source-drain metal layers.

In some examples, as shown in FIG. 25A, the third conductive layer of a display region may include a plurality of connection electrodes, a first connection line 71, a first compensation trace 91, a first data connection electrode 81, and a plurality of dummy electrodes 85. Within one unit row, orthographic projections of the first connection line 71 and the first compensation trace 91 on the base substrate may be located between orthographic projections of a light emitting control line 24 and a second initial signal line 32 of the present unit row on the base substrate. At least one circuit unit may be provided with a plurality of dummy electrodes 85, or may be provided with a dummy electrode 85 and a first data connection electrode 81. Within one unit row, a plurality of dummy electrodes 85 and a plurality of first data connection electrodes 81 are arranged along a first direction X. The plurality of dummy electrodes 85 and the plurality of first data connection electrodes 81 may be located on a same side of a first connection line 71 of the present unit row in a second direction Y. The first connection line 71 and the plurality of first data connection electrodes 81 may be of an integral structure. In some examples, the third conductive layer may further include a plurality of first compensation connection electrodes. The plurality of first compensation connection electrodes and a first compensation trace may be of an integral structure. A morphology and structure of a first compensation connection electrode may be the same as that of a first data connection electrode 81 and a dummy electrode 85, so that uniformity of a preparation process may be improved.

In some examples, as shown in FIG. 25B, the fourth conductive layer of the display region may include an anode connection electrode, a data signal line 60, a second connection line 72, a first power supply line 51, and a second compensation trace. At least one unit column may be provided with one data signal line 60 and at least two second connection lines 72. The two second connection lines 72 may be adjacent to the data signal line 60. For example, an orthographic projection of the data signal line 60 on the base substrate may be located between orthographic projections of the first power supply line 51 and the second connection lines 72 on the base substrate. However, this embodiment is not limited thereto. In other examples, the first power supply line 51 may be disposed in the third conductive layer.

In some examples, as shown in FIG. 25A and FIG. 25C, a first fracture DF1 is provided between the first connection line 71 and the first compensation trace 91. An orthographic projection of the first fracture DF1 on the base substrate may be within a region covered by the fourth conductive layer. For example, the orthographic projection of the first fracture DF1 on the base substrate may be covered by an orthographic projection of the second connection line, the data signal line, or the first power supply line of the fourth conductive layer on the base substrate.

Rest of a structure of the display substrate according to this embodiment may be referred to description of the aforementioned embodiments, and thus will not be repeated here.

Figure 26A:
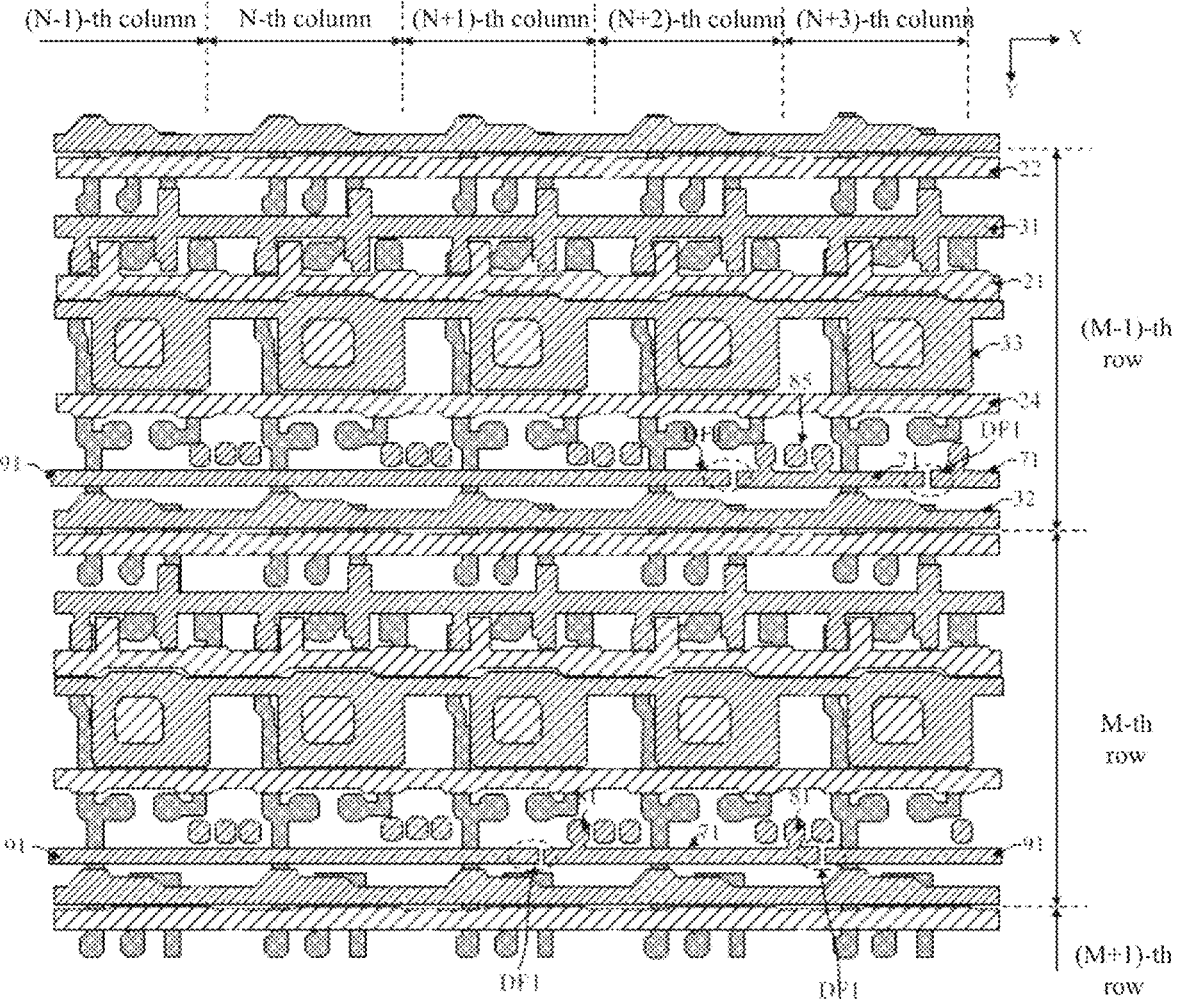
FIG. 26A is another partial enlarged schematic diagram of a display substrate after a second conductive layer is formed in the region C5 in FIG. 21.
Figure 26B:
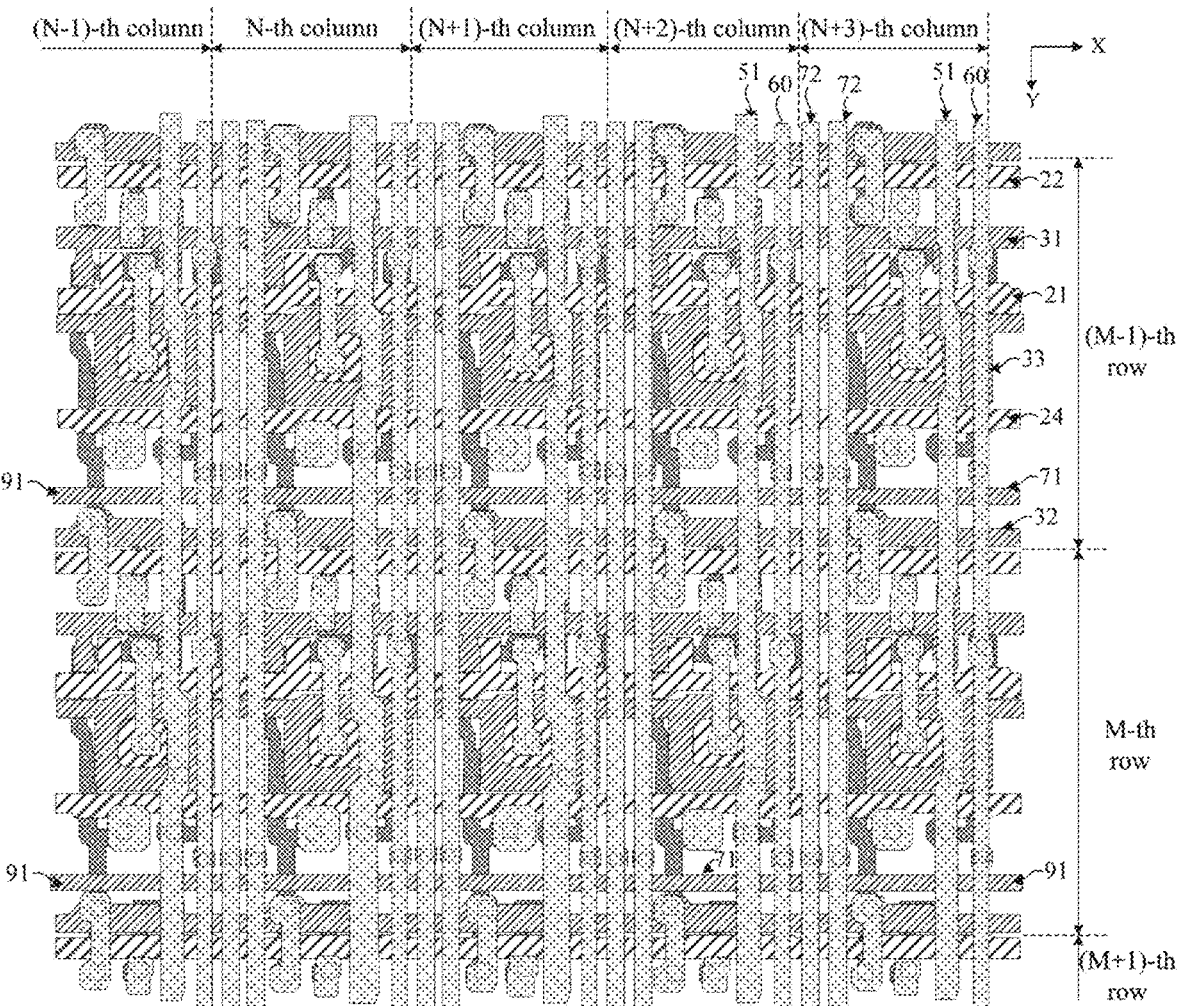
FIG. 26B is another partial enlarged schematic diagram of a display substrate after a third conductive layer is formed in the region C5 in FIG. 21.
Figure 26C:
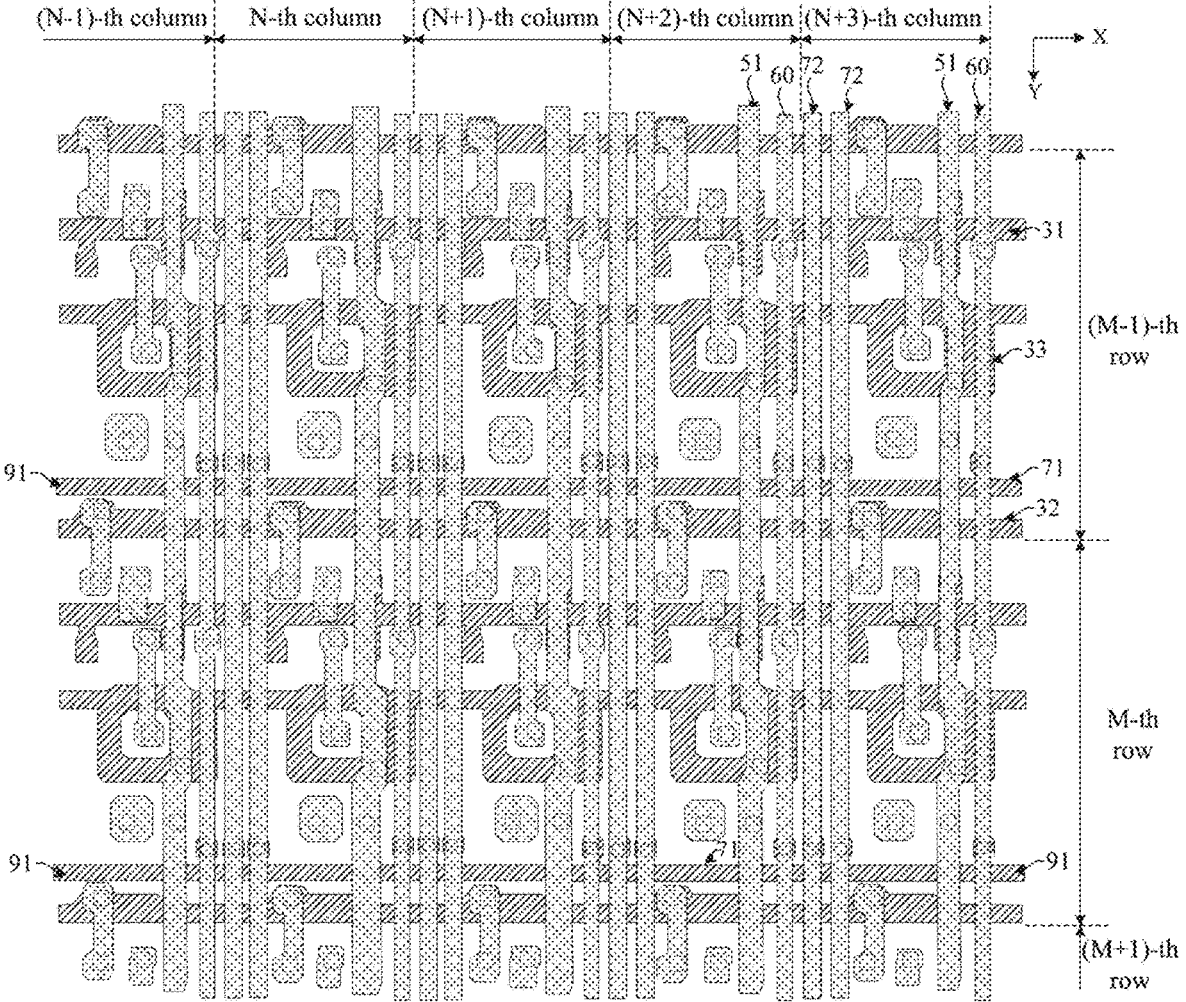
FIG. 26C is a partial enlarged schematic diagram of a second conductive layer and a third conductive layer of the region C5 in FIG. 21.

FIG. 26A is another partial enlarged schematic diagram of a display substrate after a second conductive layer is formed in the region C5 in FIG. 21. FIG. 26A is another partial enlarged schematic diagram of a display substrate after a third conductive layer is formed in the region C5 in FIG. 21. FIG. 26C is a partial enlarged schematic diagram of a second conductive layer and a third conductive layer of the region C5 in FIG. 21. In FIG. 26A to FIG. 26C, only structures of several unit rows (e.g., including an (M−1)-th row and an M-th row) and several unit columns (e.g., including an (N−1)-th column to an (N+3)-th column) in the region C5 are illustrated.

In some exemplary implementation modes, a drive circuit layer of the display substrate may include a semiconductor layer, a first conductive layer, a second conductive layer, and a third conductive layer which are sequentially disposed on a base substrate. A first insulation layer is disposed between the semiconductor layer and the first conductive layer. A second insulation layer is disposed between the first conductive layer and the second conductive layer. A third insulation layer is disposed between the second conductive layer and the third conductive layer. The drive circuit layer of this example may include a single source-drain metal layer.

In some examples, as shown in FIG. 26A, the second conductive layer of a display region may include a first initial signal line 31, a second initial signal line 32, a second electrode plate 33 of a storage capacitor, an electrode plate connection electrode, a shielding electrode, a first connection line 72, a first compensation trace 91, a first data connection electrode 81, and a plurality of dummy electrodes 85. Within one unit row, orthographic projections of the first connection line 71 and the first compensation trace 91 on the base substrate may be located between orthographic projections of a light emitting control line 24 and a second initial signal line 32 of the present unit row on the base substrate. At least one circuit unit may be provided with a plurality of dummy electrodes 85, or may be provided with a dummy electrode 85 and a first data connection electrode 81. Within one unit row, a plurality of dummy electrodes 85 and a plurality of first data connection electrodes 81 are arranged along a first direction X. The plurality of dummy electrodes 85 and the plurality of first data connection electrodes 81 may be located on a same side of a first connection line 71 of the present unit row in a second direction Y. The first connection line 71 and the plurality of first data connection electrodes 81 may be of an integral structure. In some examples, the second conductive layer may further include a plurality of first compensation connection electrodes. The plurality of first compensation connection electrodes and a first compensation trace may be of an integral structure. A morphology and structure of a first compensation connection electrode may be the same as that of a first data connection electrode 81 and a dummy electrode 85, thus uniformity of a preparation process may be improved.

In some examples, as shown in FIG. 26B, the third conductive layer of the display region may include a plurality of connection electrodes, a data signal line 60, a first connection line 72, a first power supply line 51, and a second compensation trace. In at least one unit column, two second connection lines 72, the first power supply line 51, and the data signal line 60 may be arranged sequentially along a first direction X. The two second connection lines 72 may be adjacent to the data signal line 60. For example, an orthographic projection of the data signal line 60 on the base substrate may be located between orthographic projections of the first power supply line 51 and the second connection lines 72 on the base substrate.

In some examples, as shown in FIG. 26A and FIG. 26C, a first fracture DF1 is provided between a first connection line 71 and a first compensation trace 91. An orthographic projection of the first fracture DF1 on the base substrate may be within a region covered by the third conductive layer. For example, the orthographic projection of the first fracture DF1 on the base substrate may be covered by an orthographic projection of a second connection line, a data signal line, or a first power supply line of the third conductive layer on the base substrate.

Rest of a structure of the display substrate according to this embodiment may be referred to description of the aforementioned embodiments, and thus will not be repeated here.

In other exemplary implementation modes, a first connection line and a first compensation trace may be located in the fourth conductive layer, and a first power supply line, a second connection line, a data signal line, and a second compensation trace may be located in the third conductive layer. For another example, a first connection line and a first compensation trace may be located in the fourth conductive layer, and a second connection line and a second compensation trace may be located in a fifth conductive layer. A data signal line and a first power supply line may both be located in the third conductive layer or may both be located in the fifth conductive layer; or, the data signal line may be located in the third conductive layer and the first power supply line may be located in the fifth conductive layer; or, the data signal line may be located in the fifth conductive layer, and the first power supply line may be located in the third conductive layer.

In this embodiment, data connection lines are disposed in a display region, so that part or all of lead-out lines of a bonding region are connected with data signal lines through the data connection lines, so that a fan-shaped oblique line does not need to be disposed in a lead region, a length of the lead region is effectively reduced, a width of a lower bezel is greatly reduced, and a screen-to-body ratio is increased, which is beneficial to achieving full-screen display. In this example, a first connection line and a second connection line of the data connection lines are disposed in different conductive layers, which may facilitate a layout of the data connection lines, and may avoid a collective arrangement of a large number of traces, so that substantially a same display effect may be achieved in different regions under transmitted light and reflected light, which effectively eliminates a shadow elimination situation, effectively avoids poor appearance of the display substrate, and improves display character and display quality. In this example, by disposing compensation traces and dummy electrodes, an arrangement of traces of the display region may be further balanced, a shadow elimination situation may be effectively eliminated, and poor appearance of the display substrate may be effectively avoided. In this example, by arranging the compensation traces in a mesh communication structure, not only a resistance of a power supply trace may be effectively reduced, and voltage drop of a low-voltage power supply signal may be effectively reduced, which achieves low power consumption, but also uniformity of a power supply signal in the display substrate may be effectively improved, and display uniformity may be effectively improved, which improves display character and display quality. The preparation process in the present disclosure may be compatible well with an existing preparation process, and is simple in process implementation, easy to implement, high in production efficiency, low in production cost, and high in yield.

In some exemplary embodiments, the display substrate of the embodiment of the present disclosure may be applied to a display apparatus with a pixel drive circuit, such as an OLED, a quantum dot display (QLED), a light emitting diode display (Micro LED or Mini LED), or a Quantum Dot Light Emitting Diode display (QDLED), which is not limited here in the present disclosure.

An embodiment of the present disclosure also provides a display apparatus, which may include the aforementioned display substrate. In some examples, the display apparatus may be any product or component with a display function, such as a mobile phone, a tablet computer, a television, a display, a laptop computer, a digital photo frame, or a navigator, and the embodiment of the present disclosure is not limited thereto.

The drawings of the present disclosure only involve structures involved in the present disclosure, and other structures may be referred to conventional designs. The embodiments of the present disclosure and features in the embodiments may be combined with each other to obtain new embodiments if there is no conflict. Those of ordinary skills in the art should understand that modification or equivalent substitution may be made to the technical solutions of the present disclosure without departing from the spirit and scope of the technical solutions of the present disclosure, and shall all fall within the scope of the claims of the present disclosure.

The invention claimed is:

1. A display substrate, comprising a display region and a bonding region located on a side of the display region;

the display region comprises a base substrate and a drive circuit layer disposed on the base substrate;

the drive circuit layer comprises a plurality of circuit units constituting a plurality of unit rows and a plurality of unit columns, a plurality of data signal lines, and a plurality of data connection lines; at least one data signal line of the plurality of data signal lines is electrically connected with one unit column;

at least one data connection line of the plurality of data connection lines comprises a first connection line extending along a first direction and a second connection line extending along a second direction, the second connection line extends toward the bonding region, and the first direction intersects with the second direction;

the first connection line is electrically connected with the second connection line and the data signal line respectively; and the first connection line and the second connection line are located in different conductive layers, wherein the display region further comprises a plurality of first compensation traces extending along the first direction, a plurality of second compensation traces extending along the second direction; and at least one second compensation trace of the plurality of second compensation traces is electrically connected with at least one first compensation trace of the plurality of first compensation traces;

the first compensation trace and the first connection line are disposed in a same layer, at least one circuit unit comprises a first fracture, and the first fracture is disposed between the first compensation trace and the first connection line, an orthographic projection of the first fracture on the base substrate is covered by an orthographic projection of a conductive film layer other than a film layer where the first connection line is located, on the base substrate;

the second compensation trace and the second connection line are disposed in a same layer, at least one circuit unit comprises a second fracture, and the second fracture is disposed between the second compensation trace and the second connection line, an orthographic projection of the second fracture on the base substrate is covered by an orthographic projection of a conductive film layer other than a film layer where the second connection line is located, on the base substrate.

2. The display substrate according to claim 1, wherein a first end of at least one first connection line is electrically connected with the data signal line, and a second end is electrically connected with the second connection line.

3. The display substrate according to claim 1, wherein at least one first connection line penetrates through the display region along the first direction.

4. The display substrate according to claim 1, wherein at least one second connection line penetrates through the display region along the second direction.

5. The display substrate according to claim 3, wherein in a direction perpendicular to the display substrate, the first connection line is located on a side of the second connection line away from the base substrate.

6. The display substrate according to claim 1, further comprising a bezel region located on another side of the display region, wherein the bezel region is provided with a bezel power supply lead, and the bezel power supply lead is electrically connected with the plurality of first compensation traces and the plurality of second compensation traces of the display region.

7. The display substrate according to claim 1, wherein at least one circuit unit comprises a dummy electrode; and the dummy electrode is electrically connected with a data signal line or a second connection line through a via, and an orthographic projection of the dummy electrode on the base substrate is at least partially overlapped with an orthographic projection of the data signal line or the second connection line on the base substrate.

8. The display substrate according to claim 1, wherein at least one circuit unit comprises a dummy electrode and a first data connection electrode; and the first data connection electrode is electrically connected with the first connection line, the dummy electrode is electrically connected with the first data connection electrode through a via, and an orthographic projection of the dummy electrode on the base substrate is at least partially overlapped with an orthographic projection of the first data connection electrode on the base substrate.

9. The display substrate according to claim 1, wherein a circuit unit at least comprises a pixel drive circuit, and the pixel drive circuit comprises a storage capacitor and a plurality of transistors;

in a direction perpendicular to the display substrate, the drive circuit layer comprises a semiconductor layer, a first conductive layer, a second conductive layer, and a third conductive layer which are disposed on the base substrate; and the semiconductor layer at least comprises active layers of the plurality of transistors, the first conductive layer at least comprises gates of the plurality of transistors and a first electrode plate of the storage capacitor, the second conductive layer at least comprises a second electrode plate of the storage capacitor, and the third conductive layer at least comprises a plurality of connection electrodes.

10. The display substrate according to claim 9, wherein the second conductive layer further comprises the first connection line, and the third conductive layer further comprises the second connection line and the data signal line.

11. The display substrate according to claim 9, wherein the drive circuit layer further comprises a fourth conductive layer located on a side of the third conductive layer away from the base substrate;

the fourth conductive layer comprises the data signal line and the second connection line; and the third conductive layer further comprises the first connection line.

12. The display substrate according to claim 9, wherein the drive circuit layer further comprises a fourth conductive layer located on a side of the third conductive layer away from the base substrate, and a fifth conductive layer located on a side of the fourth conductive layer away from the base substrate;

the fourth conductive layer comprises the data signal line and the second connection line; and the fifth conductive layer comprises the first connection line.

13. The display substrate according to claim 1, wherein the bonding region at least comprises a lead region, and the lead region comprises a plurality of lead-out lines, the data signal lines comprise a first data signal line group and a second data signal line group, a data signal line in the first data signal line group is electrically connected with a lead-out line through a data connection line, and a data signal line in the second data signal line group is directly electrically connected with a lead-out line.

14. The display substrate according to claim 1, wherein the bonding region at least comprises a lead region, and the lead region comprises a plurality of lead-out lines, and the plurality of data signal lines are electrically connected with the plurality of lead-out lines through the plurality of data connection lines.

15. The display substrate according to claim 14, wherein at least two second connection lines are disposed between two adjacent data signal lines.

16. The display substrate according to claim 1, wherein at least one unit column comprises a plurality of invalid pixel drive circuits, and an orthographic projection of at least one second connection line on the base substrate is overlapped with an orthographic projection of an invalid pixel drive circuit of the unit column on the base substrate.

17. A display apparatus, comprising the display substrate according to claim 1.

\* \* \* \* \*